(12) United States Patent
Almasri et al.

(10) Patent No.: US 11,118,981 B2
(45) Date of Patent: Sep. 14, 2021

(54) FREQUENCY-SELECTIVE METASURFACE INTEGRATED UNCOOLED MICROBOLOMETERS

(71) Applicant: The Curators of the University of Missouri, Columbia, MO (US)

(72) Inventors: Mahmoud Almasri, Columbia, MO (US); Edward Kinzel, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 60 days.

(21) Appl. No.: 16/387,514

(22) Filed: Apr. 17, 2019

(65) Prior Publication Data

US 2020/0025619 A1 Jan. 23, 2020

Related U.S. Application Data

(60) Provisional application No. 62/659,001, filed on Apr. 17, 2018.

(51) Int. Cl.
| | |
|---|---|
| *G01J 5/20* | (2006.01) |
| *G01J 5/58* | (2006.01) |
| *H01L 27/16* | (2006.01) |
| *H01L 37/02* | (2006.01) |

(52) U.S. Cl.
CPC . *G01J 5/20* (2013.01); *G01J 5/58* (2013.01); *H01L 27/16* (2013.01); *H01L 37/025* (2013.01)

(58) Field of Classification Search
None
See application file for complete search history.

(56) References Cited

U.S. PATENT DOCUMENTS

| 8,629,398 B2 * | 1/2014 | Talghader | G01J 5/08 250/338.4 |
|---|---|---|---|
| 2010/0148067 A1 * | 6/2010 | Cheon | G01J 5/02 250/338.1 |
| 2014/0111844 A1 * | 4/2014 | Puscasu | H01Q 15/0066 359/245 |
| 2018/0067041 A1 * | 3/2018 | Ogawa | H01L 37/02 |

OTHER PUBLICATIONS

Abdullah et al., "Device Architecture for Metasurface Integrated Uncooled SixGeyO1—x—y Infrared Microbolometers", Proc. of SPIE, 2019, 8 pages, vol. 11002.

(Continued)

*Primary Examiner* — Edwin C Gunberg
(74) *Attorney, Agent, or Firm* — Thompson Coburn LLP

(57) ABSTRACT

A metasurface integrated microbolometer having a sensing layer (e.g., $Si_xGe_yO_{1-x-y}$). The presence of the metasurface provides selectivity with respect to wavelength, polarization and angle-of-incidence. The presence of the metasurface into the microbolometer affects conversion of electromagnetic to thermal energy, thermal response, electrical integration of the microbolometer, and the tradeoff between resistivity and temperature coefficient of resistance, thereby allowing the ability to obtain a sensing with high temperature coefficient of resistance with lower resistivity values than that of films without the metasurface. The presence of the metasurface removes the need for a Fabry-Perot cavity.

24 Claims, 53 Drawing Sheets

(56) References Cited

OTHER PUBLICATIONS

Abdullah et al., "Metasurtace Integrated Microbolometers", IEEE, RAPID, 2019, 2 pages.

Abdullah et al., "Micromachined Uncooled $Si_xGe_yO_{1-x-y}$ Microbolometer Integrated Metasurtace for Uncooled Infrared Detection", IEEE Transducers, 2019, pp. 641-644.

Abdullah et al., "Uncooled $Si_xGe_yO_{1-x-y}$ Microbolometer Stack for LWIR Detection", IEEE MEMS, 2020, 4 pages.

Alkorjia et al., "Metasurface Based Uncooled Microbolometer with High Fill Factor", IEEE Transducers, 2019, pp. 2126-2129.

Almasri et al., "Self-Supporting Uncooled Infrared Microbolometers with Low-Thermal Mass", Journal of Microelectromechanical Systems, 2001, pp. 469-476, vol. 10, No. 3.

Hai et al., "Amorphous $Si_xGe_yO_{1-x-y}$ Thin Films for Uncooled Infrared Microbolometers", Infrared Physics and Technology, 2018, pp. 227-235, vol. 95.

Jalal et al., "Noise Reduction of Amorphous $Si_xGe_yO_{1-x-y}$ Thin Films for Uncooled Microbolometers by Si3N4 Passivation and Annealing in Vacuum", IEEE Sensors Journal, 2016, pp. 1681-1691, vol. 16, No. 6.

Koppula et al., "Material Response of Metasurface Integrated Uncooled Silicon Germanium Oxide $Si_xGe_yO_{1-x-y}$ Infrared Microbolometers", Proc. of SPIE, 2019, 7 pages, vol. 11002.

Liu et al., "Design and Analysis of Frequency-Selective Surface Enabled Microbolometers", Proc. of SPIE, 2016, 9 pages, vol. 9819.

Maier et al., "Multispectral Microbolometers for the Midinfrared", Optics Letters, 2010, pp. 3766-3768, vol. 35, No. 22.

Muztoba et al., "Rectifying and Schottky Characteristics of a-$Si_xGe_{1-x}O_y$ with Metal Contacts", Can. J. Phys., 2014, pp. 606-610, vol. 92.

Rana et al., "High Responsivity a-$Si_xGe_{1-x}O_y$ : H Microbolometers", IEEE Sensors Journal, 2007, pp. 1413-1419, vol. 7, No. 10.

Rana et al., "Noise Reduction of a-$Si_{1-x}Ge_xO_y$ Microbolometers by Forming Gas Passivation", Thin Solid Films, 2008, pp. 6499-6503, vol. 516.

* cited by examiner

| Parameters and units | value |
|---|---|
| Thermal Conductance $G_{th}(W/K)$ | $1.51 \times 10^{-8}$ |
| TCR (measured)(%/K) | -2.5 |
| Responsivity $R_v(v/w)$ | $5.1 \times 10^4$ |
| Detectivity $D^*(cm.Hz^{1/2}/w)$ | $5.44 \times 10^8$ |
| Thermal response time $\tau_{th}(ms)$ | 5.307 |
| Absorptivity $\zeta\%$ | 59.7 |
| Thermal mass $C(J/K)$ | $6.869 \times 10^{-11}$ |
| Voltage Noise PSD $(V^2/Hz)$ | $1.723 \times 10^{-15}$ |

FIG. 5T

| Parameters | value |
|---|---|
| Thermal Conductance $G_{th}$ (W/K) | $5.38 \times 10^{-7}$ |
| Responsivity $R_v$ (V/W) | $1.97 \times 10^5$ |
| Detectivity $D^*$ (Hz$^{1/2}$/W) | $1.19 \times 10^9$ |
| Response time $t$ (ms) | 4.18 |
| Absorptivity $\zeta$ | 61.8% |
| Thermal mass $C$ (J/K) | $2.25 \times 10^{-10}$ |

FREQUENCY-SELECTIVE METASURFACE INTEGRATED UNCOOLED MICROBOLOMETERS

CROSS-REFERENCE TO RELATED APPLICATIONS

This patent application claims priority to U.S. provisional patent application Ser. No. 62/659,001, filed Apr. 17, 2018, the entire disclosure of which is incorporated by reference herein.

STATEMENT REGARDING FEDERALLY SPONSORED RESEARCH OR DEVELOPMENT

This invention was made with government support under grants 1509589 and 1653792 awarded by the National Science Foundation and grant number W911NF-09-1-0158 awarded by the Army Research Office. The government has certain rights in the invention.

BACKGROUND

Uncooled microbolometers are used, for example, as infrared (IR) thermal sensors. In this application, the microbolometer absorbs IR radiation and is heated, raising its temperature. The temperature rise of the microbolometer is measured by measuring its electrical resistance. The temperature dependence of the resistivity is quantified by the Temperature Coefficient of Resistance (TCR). All other things being equal, a higher TCR corresponds to a more sensitive microbolometer. Current uncooled microbolometers can achieve wide broadband spectral response at the mid- and long-wavelength regions, allowing for a broad spectrum of commercial and military applications including surveillance, threat detection, target recognition, medical diagnostics, firefighting, surveillance and security. For example, Focal Plane Arrays (FPA) (e.g., IR cameras) that are based on this technology have been developed by various companies. These cameras are primarily based on two mainstream materials, vanadium oxide (VOx) and amorphous silicon ($\alpha$:Si), and have comparable detector performance. Both material systems have been in wide production for many years. While VOx technology remains the standard, VOx presents issues when it is integrated into devices such as FPAs. These challenges include spatial noise and complicated designs resulting from challenges integrating VOx into standard deposition equipment that is used in mainstream CMOS (complementary metal oxide semiconductor) and analog semiconductor fabrication. The other mainstream material, $\alpha$:Si, takes advantage of the extensive knowledge available in Si manufacturing processes, as $\alpha$:Si can be deposited using traditional plasma enhanced chemical vapor deposition (PECVD) on high volume deposition tools. Moreover, knowledge resulting from the extensive research in Si-based solar cells and flat panel displays lends itself to improved pixel operability and uniformity for $\alpha$:Si based devices.

Both materials have relatively low frame rates which limits the use of the systems to image fast moving objects and/or image from fast moving platforms. In combination with slow frame rates, a limited number of pixels in FPAs also present a challenge for the use of microbolometers in IR hyperspectral detection applications, such as identification of gases and chemicals with low concentration, spectral filtering, defeating camouflage, and determining the absolute temperature of objects. This is also due in part that most cameras use a standard ¼ wave cavity or other geometry to maximize the absorptance across the thermal infrared in ways that are not easy to make spectrally selective and to vary pixel-by-pixel. For example, past experiments on tuning the cavity of a microbolometer, either through piezoelectric actuation, electrostatic actuation, liquid crystal based changes in the refractive index, or by using movable micromirror underneath the microbolometer pixel, have demonstrated the ability to tune the wavelength response at the expense of reduced FPA resolution and the complicated fabrication which dramatically increases the cost.

On the other hand, cameras that are based on cooled detectors can accommodate filter wheels because of higher frame rates. However, they are bulky and heavy due to the cryogenic cooling requirements, which thereby prevents their use in, for example, unmanned aerial vehicles (UAVs) or drones.

In view of the above-noted deficiencies and limitations in conventional techniques, and because uncooled, low-weight, low-power, low-cost thermal infrared imaging has been and will continue to be a vital tool for civilian and military performance at present and in the future, including applications such as night-vision, weapons sights, and UAV mounted systems, there is a need for improvement of thermal infrared imaging devices. This includes general improvements in performance as well as adding hyperspectral sensitivity. In addition to hyperspectral sensitivity, the invention described herein also has the potential for sensing polarization or angle of incidence detection.

BRIEF SUMMARY OF THE INVENTION

The inventors have developed a better approach that integrates sensitivity into the microbolometer itself using a metasurface. At the same time, the performance is improved. Such integration of (e.g., wavelength) sensitivity into the microbolometer allows for incorporation into the ubiquitous uncooled microbolometer based FPA, and presents significant advantages via improved equipment, for example. Such advantages are analogous to the advantage that animals with color vision gain over those with intensity-only based vision (the ability to recognize predators/prey in hiding or identify ripe fruit). Another biological analogy is to the mantis shrimp that can resolve polarization. The wavelength sensitivity can be engineered to highlight battlefield hazards such as high explosives, chemical threats, or defeating enemy camouflage. For example, a single pixel in the FPA responds to radiation with a set of attributes (wavelength and polarization). This technique minimizes moving components in the assembly and preserves the uncooled/low-cost benefits of microbolometers.

Similar to wavelength sensitivity, polarization sensitivity helps to reveal the contrast between emitted radiation and reflected radiation. This is useful for identifying manmade tangents or signals. The ability to engineer sensitivity with coherence/angle-of-incidence (AOI) is critical for detecting illumination of a FPA with a laser source. This is useful if a laser is used to blind the FPA. It can also be used to build a plenoptic (light-field) camera which captures 3D information about a scene.

The present invention utilizes amorphous silicon germanium oxide ($Si_xGe_yO_{1-x-y}$). However, the interaction between the metasurface and sensing layer is also applicable to other materials, including $\alpha$:Si and VOx). $Si_xGe_yO_{1-x-y}$ has advantages because of its excellent IR radiation absorption, and mechanical and electrical properties at room temperature. The stoichiometry can be adjusted to maximize high temperature coefficient(s) of resistance (TCR) with a low resistivity and desired 1/f noise. Thus, the device performance (responsivity and detectivity) is improved without increasing the 1/f-noise. Because Si- and Ge-based compounds are standard materials in silicon integrated circuits, there is a wide range of established knowledge for fabrication of the microbolometer array. Such materials are also compatible with CMOS technology due to the low deposition temperature and the use of conventional dry-etch processing. Therefore, an FPA designed according to the novel approach herein can be easily integrated with readout electronics.

A metasurface is integrated into the microbolometer design to achieve, for example, wavelength selectivity through the use of frequency selective surface (FSS)-type elements. These can include an asymmetric cross-shaped nanoparticle antenna, a multiple metamaterial structure in a single device or unit cell, two pairs or tri-layer of metal-dielectric stacks, 2D arrays of absorbers with asymmetric dimple periods, split ring resonators, complementary metamaterial structure with perforated holes etched into them, optical resonant multi-layer structures, and 1D and 3D metal-insulator-metal devices with a through-hole or mushroom-like absorbers. Traditional FSS patterns at this length scale require precise control over the metal patterns.

The inventors have investigated the structure/property relationships for metasurface integrated uncooled amorphous silicon germanium oxide ($Si_xGe_yO_{1-x-y}$) microbolometers, achieving disruptively lower voltage noise power spectral density (PSD) and higher voltage responsivity than conventional designs, while introducing the selectivity with respect to wavelength, polarization and AOI. Incorporating a metasurface into the microbolometer affects not only the conversion of electromagnetic (EM) energy to thermal energy, but also the thermal response and the electrical integration of the microbolometer. In addition, the presence of the metal metasurface elements significantly affects the tradeoff between resistivity and TCR, allowing the ability to obtain a film with high TCR with lower resistivity values than that of films without the metasurface. The inventors created a comprehensive model of the metasurfaces/microbolometer system as an integrated material with an engineered infrared, thermal and optical performance. By understanding the integrated material response, the inventors have facilitated better options for uncooled IR imaging. This includes optimization of the TCR, resistivity, and voltage noise of $Si_xGe_yO_{1-x-y}$ thin films while enabling the metasurface performance. The inventors have also reduced microbolometer thickness (e.g., toward 50-60 nm Si—Ge—O) and pixel size to the lower thermal mass, and increased the FPA resolution.

The inventors have transformed current uncooled IR detectors by replacing the Fabry-Perot cavity/umbrella superstructure with a unified metasurface integrated microbolometer. The metasurfaces are used to determine spectral selectivity and be optimized to enhance electrical performance. This allows improved noise/sensitivity of the sensing material because it no longer needs to serve the dual function of absorbing the radiation. This allows the support structure to be designed to optimize the thermal isolation of the microbolometer and to facilitate measuring the resistance of the microbolometer without regard for disrupting the resonant cavity. Additionally, use of the lower resistivity of the metasurface integrated microbolometer improves TCR beyond the ordinary tradeoffs available for the Si—Ge—O system. This corresponds to lowering the noise of the microbolometers while maintaining or improving the sensitivity.

Moreover, the inventors have resolved the problematic issues of current detectors by fabricating supporting arms underneath the detector without disrupting the resonant cavity between the microbolometer pixel and a reflective mirror, and achieving a high fill factor. Noise-models were generated that can be applied to other IR detectors in order to resolve the common and difficult issues facing developers of IR detectors. Detection technology was developed in a simple, low cost, low power, light weight and portable system that operates at ambient temperature. For example, devices were fabricated with legs positioned underneath the microbolometer pixel without disrupting the ¼-wave resonance. This permits longer legs without sacrificing the fill factor in a focal plane array. The longer legs allow the thermal resistance between the microbolometer and the substrate. The metasurface also allows the IR absorption to be engineered with both broadband and narrowband designs. The inclusion of the metasurface improved the 1/f noise by two orders of magnitude over an identical device with no metasurface. Additionally, the inventors developed metasurface integrated uncooled IR microbolometers for long wavelength detection. The inclusion of the metasurface permits engineering the IR absorptance with respect to wavelength, polarization, and AOI. Direct absorption by the metasurface removes the need for the ¼-wave cavity beneath microbolometer. In addition to benefiting the IR absorptance and architecture, the metasurface significantly improves the electrical performance of the temperature-sensing layer. Experimental results show an improvement in the TCR and a dramatic decrease in the resistivity. These parameters scale with the periodicity and area fraction of the metasurface.

The implications and applications for this technology are vast, with the resulting system potentially benefiting civilian, law enforcement personnel and the military, for example.

BRIEF DESCRIPTION OF THE DRAWINGS

The accompanying drawings, which are incorporated in and form a part of the specification, illustrate the embodiments of the present invention and together with the description, serve to explain the principles of the invention. In the drawings:

FIG. 5I shows a 3D drawing of a microbolometer according to one embodiment.

FIG. 5T shows a summary of the fabricated and tested microbolometer of FIG. 5L.

FIG. 6N shows merits parameters of the microbolometer of FIG. 6I.

DETAILED DESCRIPTION

Figure 1:
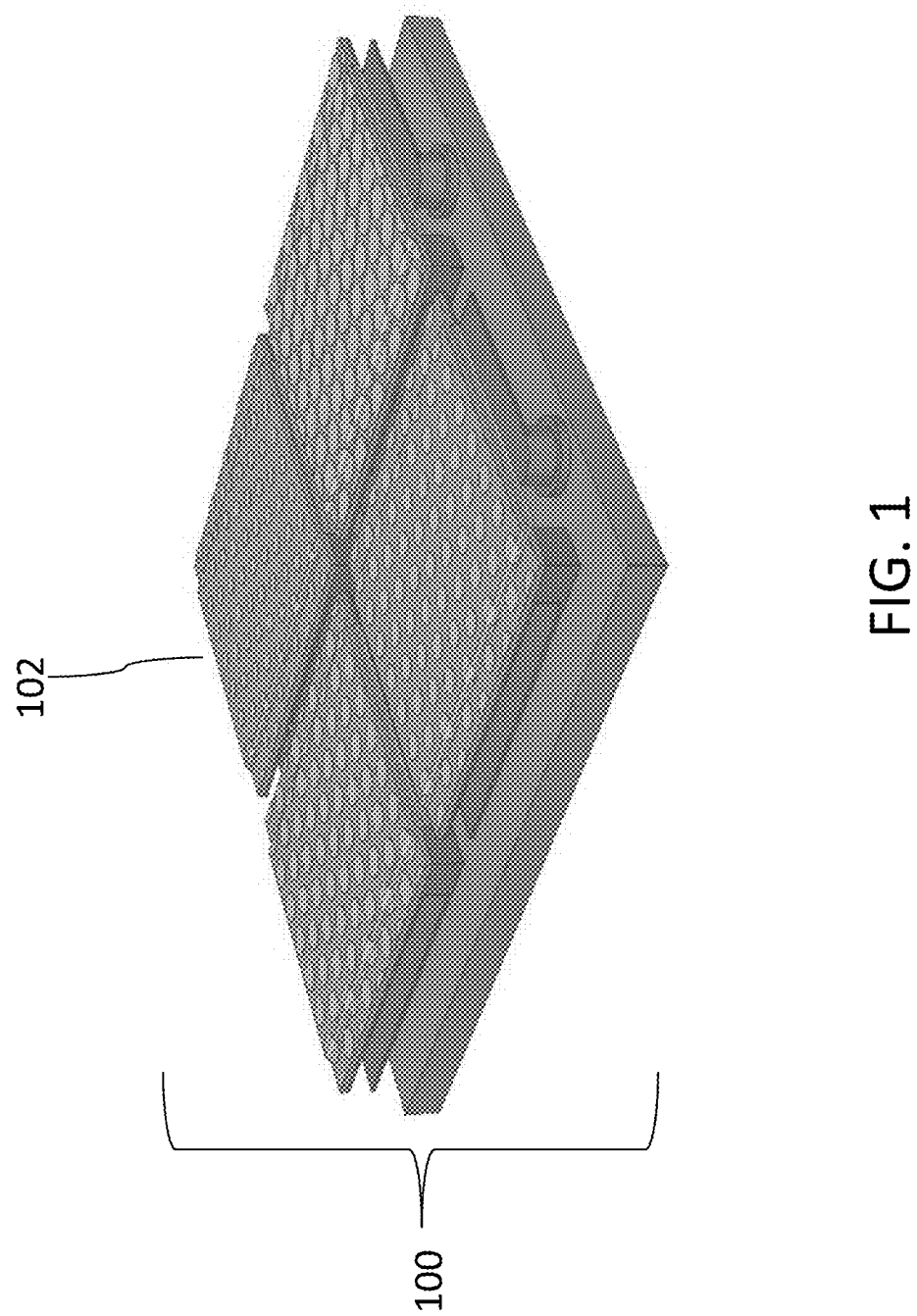
FIG. 1 shows an example of a pixel of a metasurface integrated Si—Ge—O microbolometer.

Metasurface integrated uncooled amorphous silicon germanium oxide ($Si_xGe_yO_{1-x-y}$) microbolometers include a metasurface, also known as an FSS, which is a periodic array of sub-wavelength antenna elements that establishes unusual properties from their structural design. FIG. 1 shows a microbolometer 100 including four pixels, of which pixel 102 represents one of the four pixels. The absorption at the IR frequencies is highly dependent on the metasurface geometry, and can be engineered for selectivity with respect to wavelength, polarization, and angle of incidence. EM energy with the correct characteristics is converted to heat, while other energy is reflected or transmitted away from the device. Metasurfaces can be coupled to a microbolometer platform, enabling an FPA to resolve these parameters. For example, one pixel can respond to horizontal polarized radiation while the adjacent pixels are sensitive to vertical or circular polarized radiation. Similarly, different microbolometers with different wavelength sensitivity permit the determination of the temperature of objects to be resolved without a-priori knowledge of the objects emittance (also advantageous for discriminating between radiation sources/defeating camouflage).

As discussed above, while many other IR materials have been investigated for use in uncooled microbolometers, these materials (e.g., yttrium barium copper oxide (YbaCuO), Si—Ge, Si/SiGe quantum well bolometer, molybdenum oxide (MoOx) and nickel oxide (NiOx), doped hydrogenated silicon (α-Si:H) and metals) all have associated issues. For example, Y—Ba—Cu—O films achieve TCR between 3-3.5%/K and have low 1/f noise, but this material is not conventionally used in semiconductor processing. The resistivity of Si—Ge can be kept low by controlling the doping level, but this sets an upper limit to TCR. Processing of poly Si—Ge materials to achieve the desired crystallinity requires temperatures as high as 650° C. A summary of TCR of various IR materials is shown in Table 1.

TABLE 1

TCR and various IR Materials.

| IR Materials | TCR (%/K) |
| --- | --- |
| VOx | 2-2.4 |
| a:Si | 2-5 |
| Nano-VOx | −6.5 |
| Ge | 1 |
| YbaCuO | 2.88-3.5 |
| Si—Ge | 2-3 |
| Metals | 0.2 |

As shown in Table 2 and as discussed in more detail with reference to the various examples below, relatively high TCR is able to be achieved with various Si—Ge—O materials.

TABLE 2

TCR and resistivity of Si—Ge—O.

| TCR (%/K) | Resistivity (Ω · cm) |
| --- | --- |
| −(2.27-8.69) | $4.22 \times 10^2$-$3.47 \times 10^9$ |
| −5 | $10^4$ |
| −5 | $3.8 \times 10^4$ |
| −6.43 | $3.34 \times 10^2$ |

Additionally, as microbolometer pixel size has been able to be reduced in size, this has enabled the development of mega-pixel format arrays. The main reason for the size reduction is that the uncooled system is limited by resolution rather than by sensitivity. The reduction in size has advantages such as: increasing the number of die fabricated per wafer; and allowing for the focal length and the lens diameter to be reduced by more than half while maintaining the same resolution. This has resulted in a reduction of the overall size of the optics and package, and enabled a future generation of smaller, lighter and lower cost thermal imaging systems. In addition, small pixel and large format detectors offer significant sensor system performance improvements.

A remaining problem, however, is that the supporting arms have been placed underneath the microbolometer pixel, which may disrupt the Fabry-Perot resonance cavity behavior between the pixel and the underlying substrate. However, the inventor's use of the metasurface as disclosed herein serves to overcome this problem.

Figure 2:
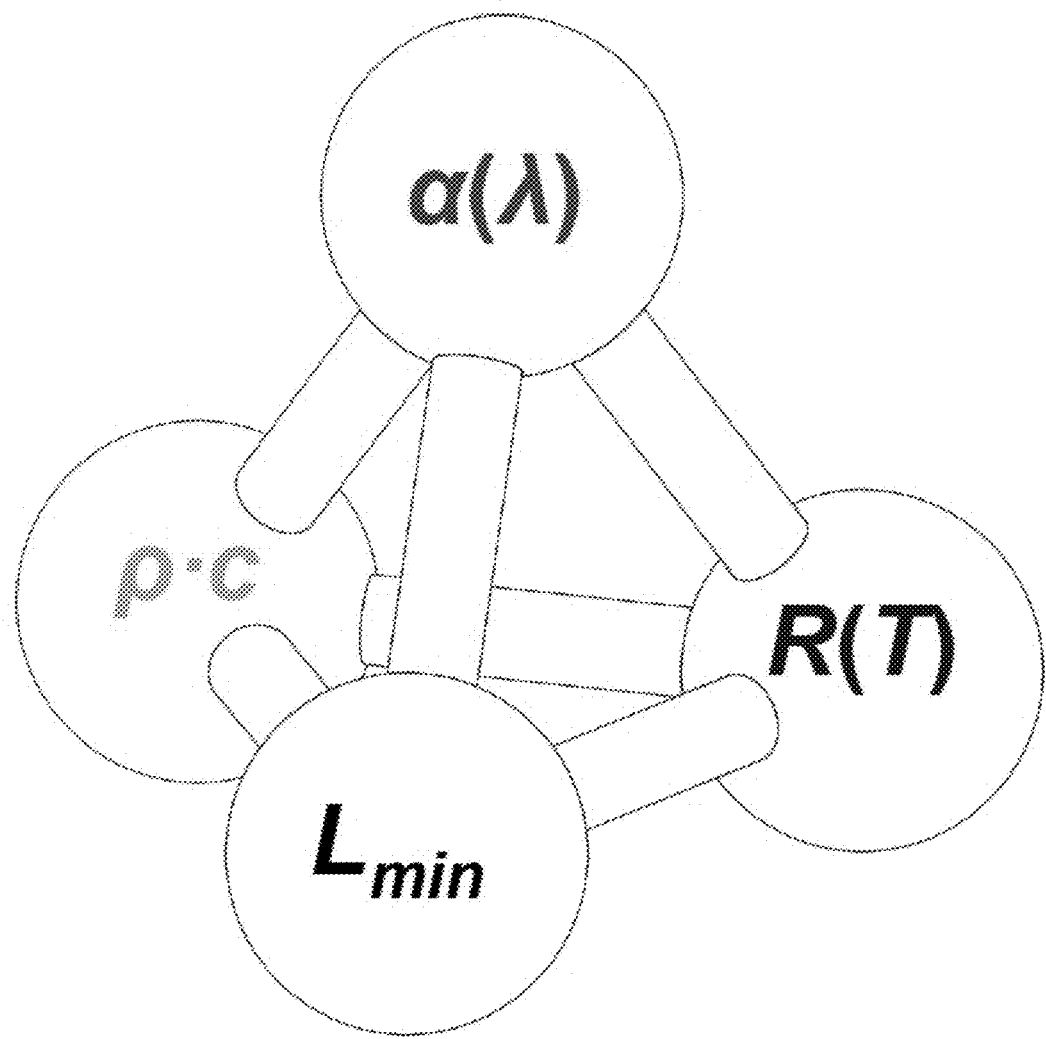
FIG. 2 shows metamaterial properties determined by metasurfaces geometry.

The inventors have evaluated the tradeoffs of the metasurface coupled microbolometers as a multifunctional metamaterial, with tradeoffs in terms of (a) electromagnetic absorption/selectivity, (b) thermal response, (c) electrical performance and (d) manufacturing cost (as shown in FIG. 2).

In doing so, the inventors have developed uncooled multiband IR detectors capable of achieving hyperspectral images of objects with high resolution. This included: integrating $Si_xGe_yO_{1-x-y}$ with metasurfaces and studying how the material properties were affected by the metasurfaces in order to understand the structure/stoichiometry relationships to electromagnetic/thermal/electrical properties along with manufacturing cost; investigating $Si_xGe_yO_{1-x-y}$, with and without a metasurface, to correlate the infrared optical constants, resistivity, TCR, voltage noise, density and specific heat with the stoichiometry of the material; fabricating and characterizing an innovative uncooled IR microbolometer integrated with, for example, a metasurface with a pixel area of 25×25 µm² and a 16×16 µm² pixel and a fill factor over 90% by placing a support structure beneath the pixel; and identifying sources of noise and optimizing the metasurface integrated microbolometer to further reduce noise in the fabricated devices. The inventors researched: (1) achieving more than 90% absorption across the 8-14 m spectral window; (2) reducing noise level of Si—Ge—O detectors to Johnson noise; (3) developing $Si_xGe_yO_{1-x-y}$ film with TCR and corresponding resistivity above 4%/K, and below 1 Ω-cm, respectively; and (4) achieving responsivity above $10^5$ V/W and a thermal time constant of 2 ms. The resulting designs were benchmarked against conventional microbolometers. In addition to the tradeoffs between absorptivity, feature size, and thermal performance, the results show that the addition of the metasurface has the potential to dramatically lower the resistivity of the microbolometer without affecting the TCR beyond the ordinary tradeoffs available for the Si—Ge—O system. This corresponds to lowering the noise of the microbolometers without affecting sensitivity.

Figure 3:
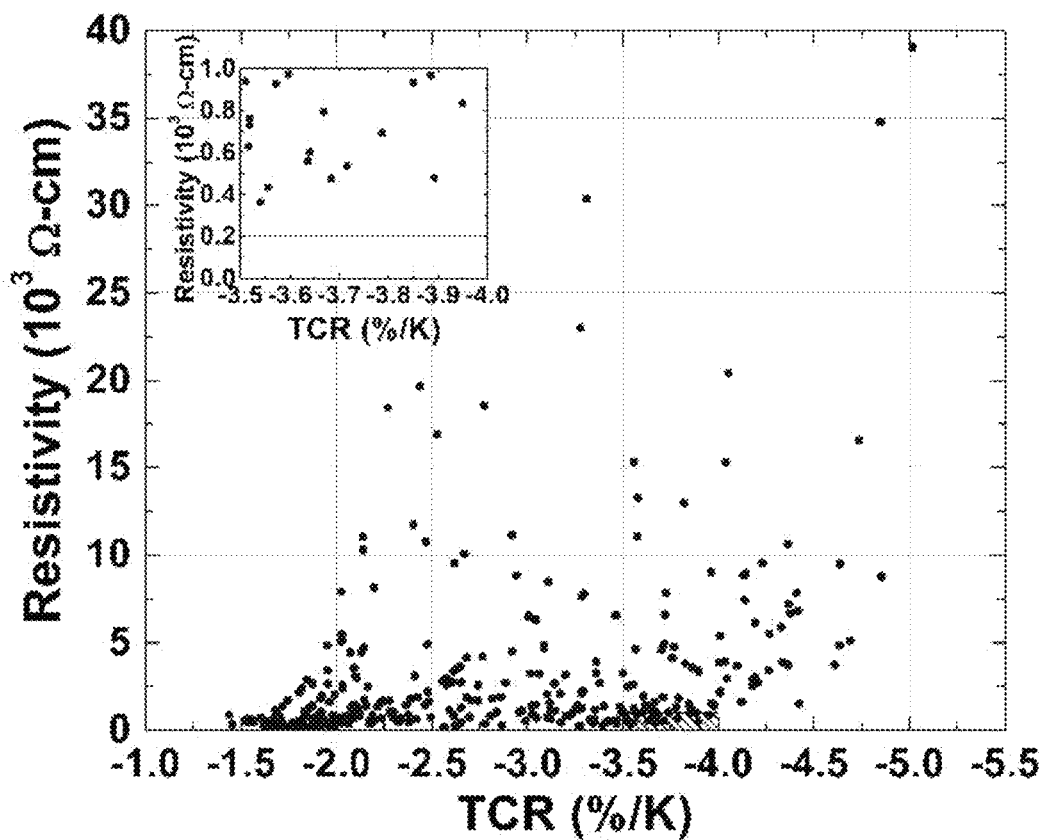
FIG. 3 shows resistivity versus TCR for evaluated films (the inset shows films with resistivity of 1.0 kΩ-cm).
Figure 4A:
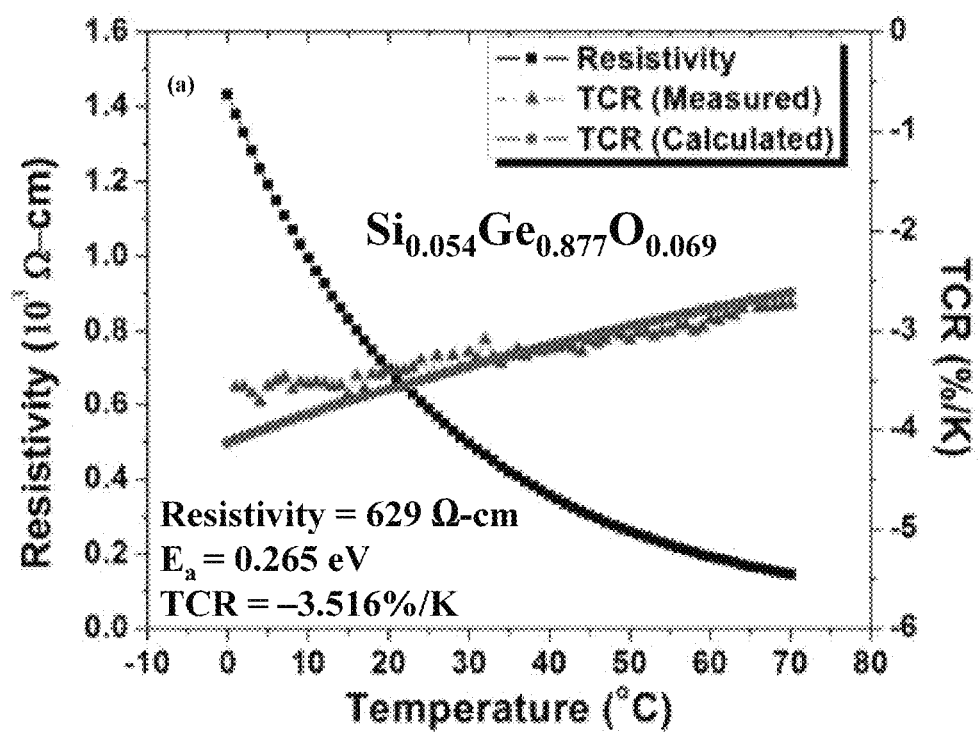
FIG. 4A shows measured TCR and resistivity versus temperature for $Si_{0.054}Ge_{0.877}O_{0.069}$.
Figure 4B:
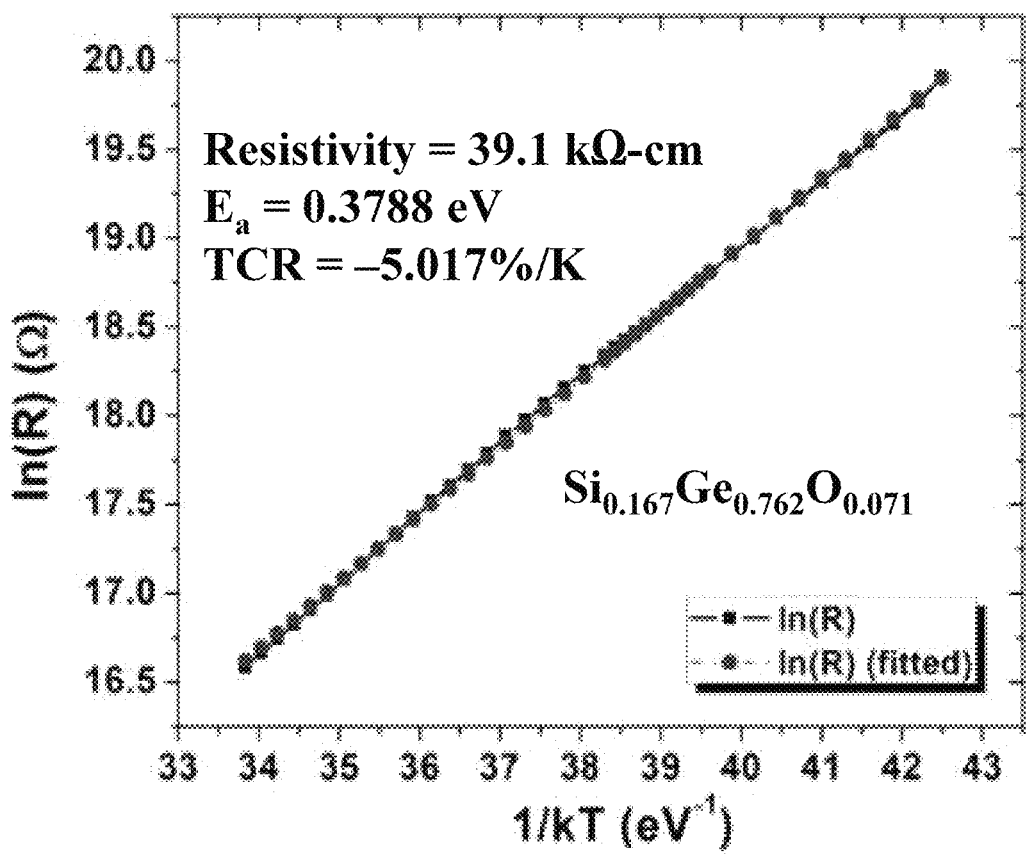
FIG. 4B shows variation of ln(R) with 1/kT for $Si_{0.167}Ge_{0.762}O_{0.071}$ deposited at room temperature.
Figure 4C:
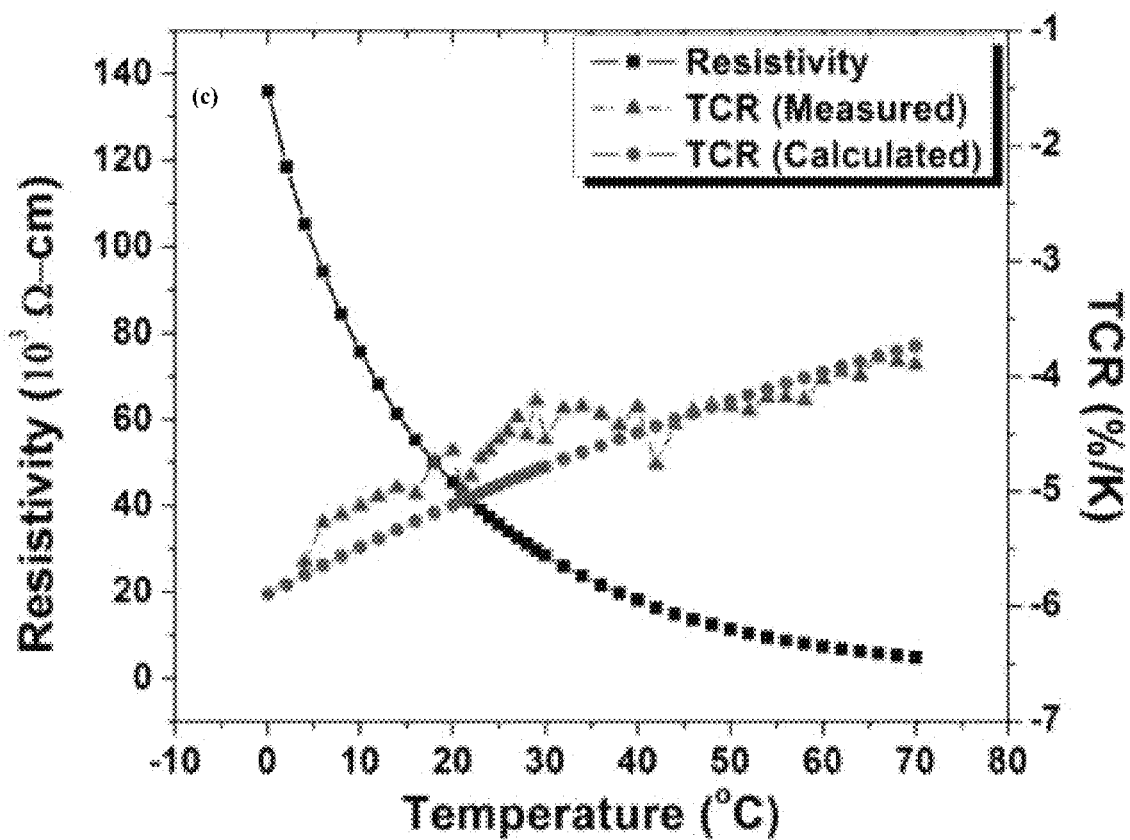
FIG. 4C shows TCR and resistivity versus temperature for the same film in FIG. 4B.

Amorphous $Si_xGe_yO_{1-x-y}$ films were deposited (co-sputtered) with various compositions on an insulated Si substrate using RF magnetron sputtering from two 3" Si and Ge targets simultaneously in an Ar/O₂ environment at room temperature, at low pressure 4 mTorr, and with a thickness around 300 nm. Film composition was varied by adjusting RF power applied to the Si and Ge targets, and varying the oxygen flow of the gas mixture in the deposition chamber. The TCR was plotted as a function of resistivity for 340 films with different Si, Ge, and O₂ compositions, as shown in FIG. 3. The results clearly show that there are many $Si_xGe_yO_{1-x-y}$ compositions that can achieve high TCR (above 3.75%/K) with low resistivity (below 1.0 kΩ-cm) making this material very suitable for thermal imaging applications. For example, as shown in FIG. 4A, $Si_{0.0054}Ge_{0.877}O_{0.069}$ film has achieved a TCR and a resistivity of −3.516%/K, and 629 Ω-cm, respectively. The lowest measured resistivity and the corresponding TCR were 119.6 Ω-cm and −2.202%/K, respectively, using, for example, $Si_{0.136}Ge_{0.838}O_{0.026}$ for film deposited at room temperature. The highest achieved TCR and the corresponding resistivity at room temperature were −5.017%/K, and 39.1×10³ S-cm, respectively, using $Si_{0.167}Ge_{0.762}O_{0.071}$ for films deposited at room temperature, as shown in FIGS. 4B and 4C. The TCR was measured using a four point probe technique, and the calculated TCR was deduced from $TCR=-E_a/kT^2$, where k is Boltzmann constant. The activation energy ($E_a$) of films with highest TCR was calculated from the slope of Arrhenius plot with a value of 0.379 eV.

The inventors also measured the resistivity and corresponding TCR as a function of temperature for various $Si_xGe_yO_{1-x-y}$ films with and without an aluminum metasurface (e.g., formed as Hexagonal Close Packed (HCP) disk arrays, 3 m periodicity, 1.2 m diameter). The $Si_xGe_yO_{1-x-y}$ films used with the metasurface were deposited in the same deposition run as those measured without a metasurface. The results demonstrated that the addition of the metasurface has resulted in three fold reduction of resistivity from 841 Ω-cm to 336 Ω-cm, while the TCR was not affected.

Figure 5A:
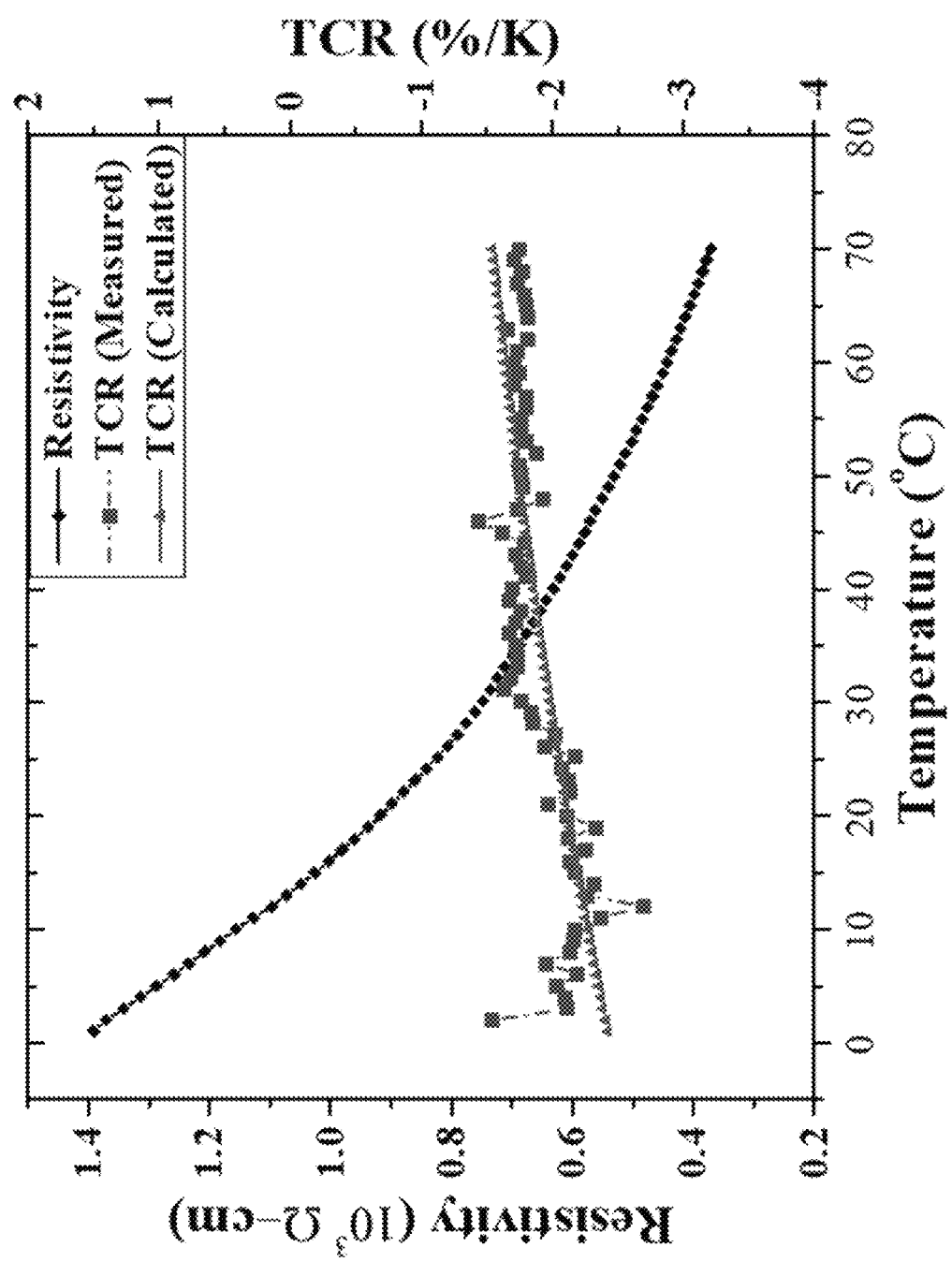
FIG. 5A shows measured TCR and resistivity versus temperature for $Si_{0.054}Ge_{0.877}O_{0.069}$ without a metasurface.
Figure 5B:
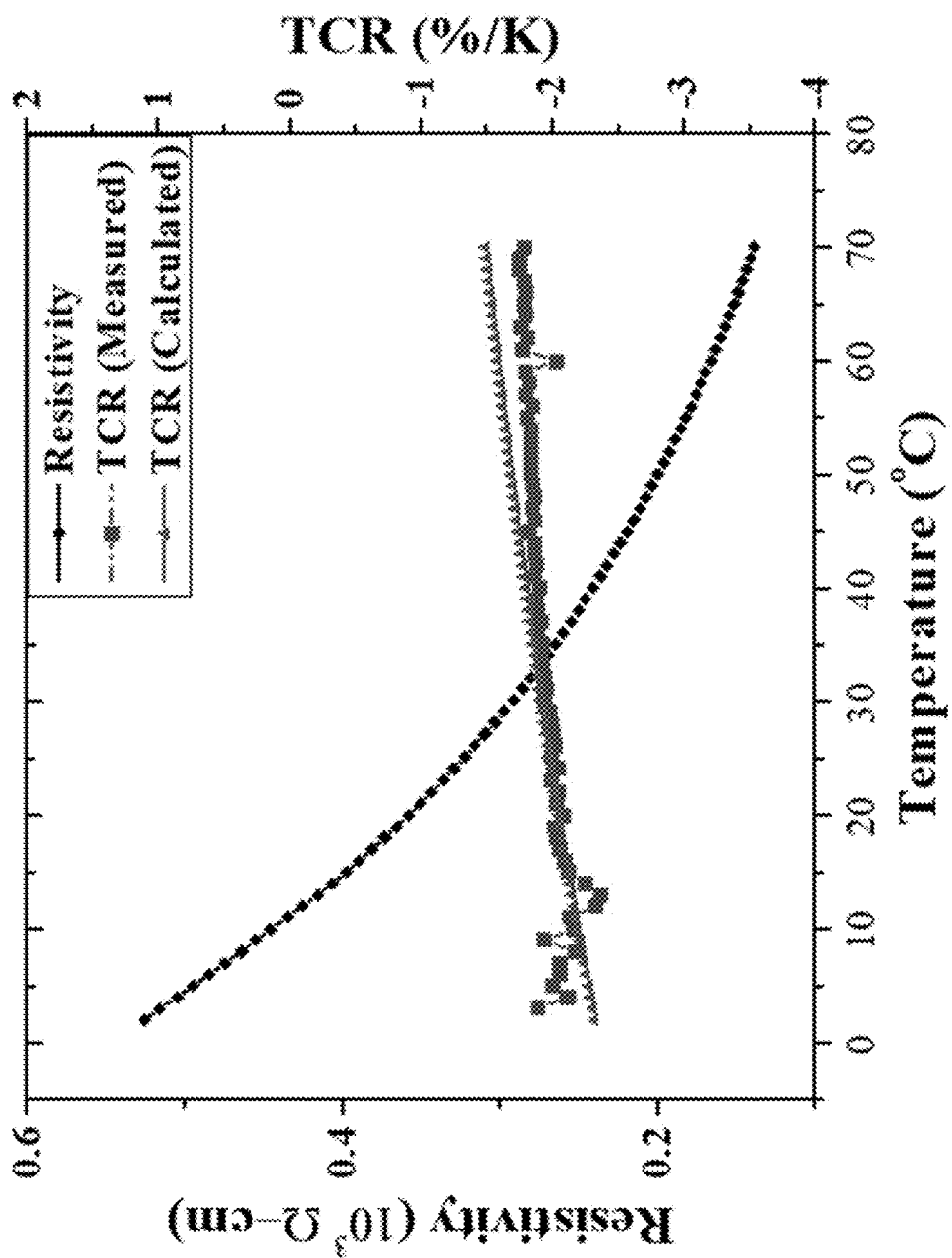
FIG. 5B shows measured TCR and resistivity versus temperature for $Si_{0.054}Ge_{0.877}O_{0.069}$ with a metasurface.
Figure 5C:
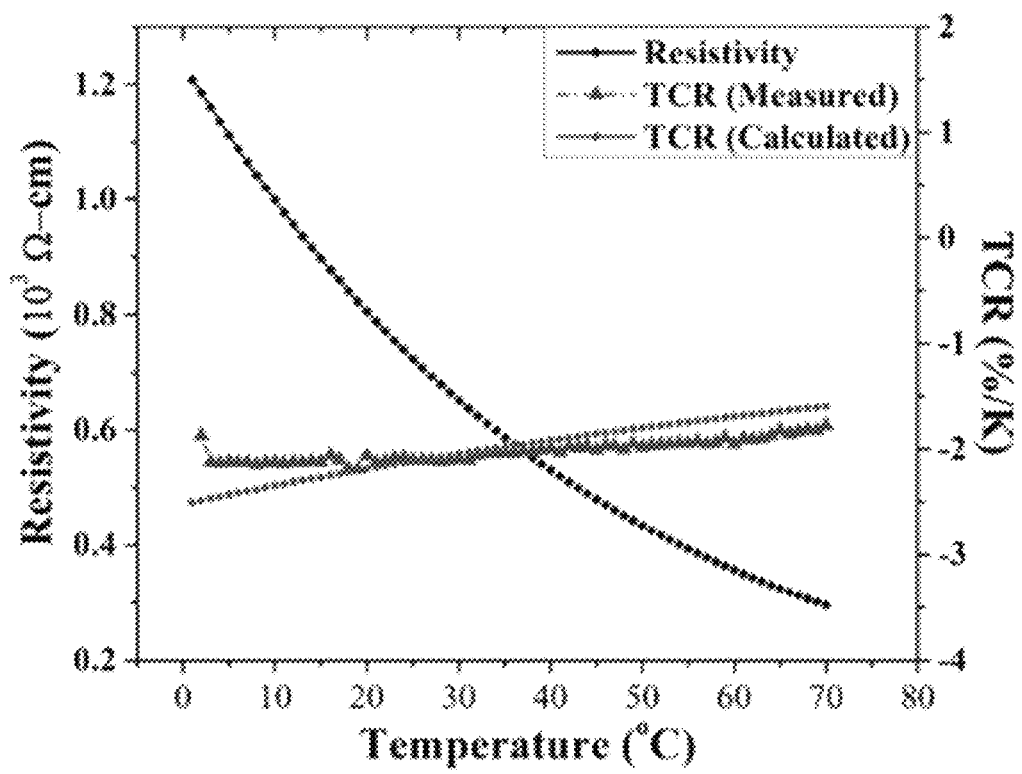
FIG. 5C shows measured TCR and resistivity versus temperature for $Si_{0.054}Ge_{0.877}O_{0.069}$ without a metasurface.
Figure 5D:
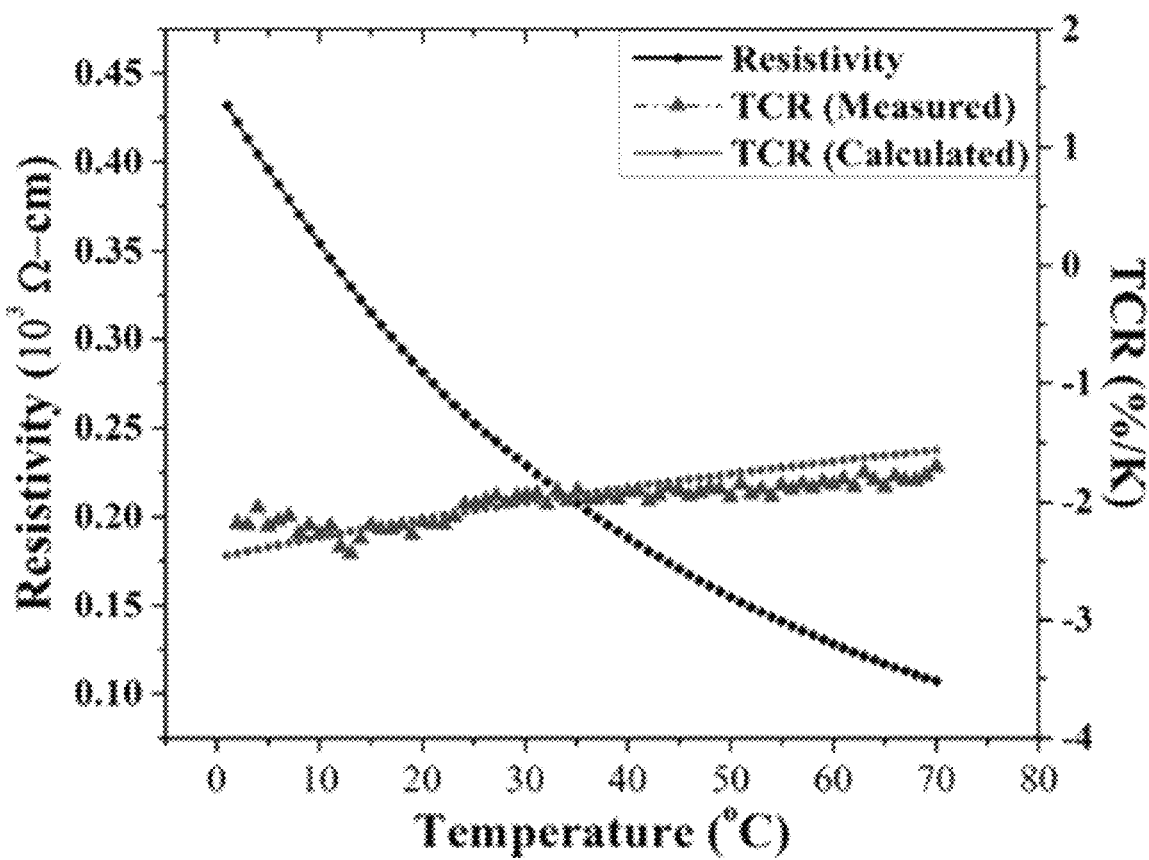
FIG. 5D shows measured TCR and resistivity versus temperature for $Si_{0.054}Ge_{0.877}O_{0.069}$ with a metasurface.
Figure 5E:
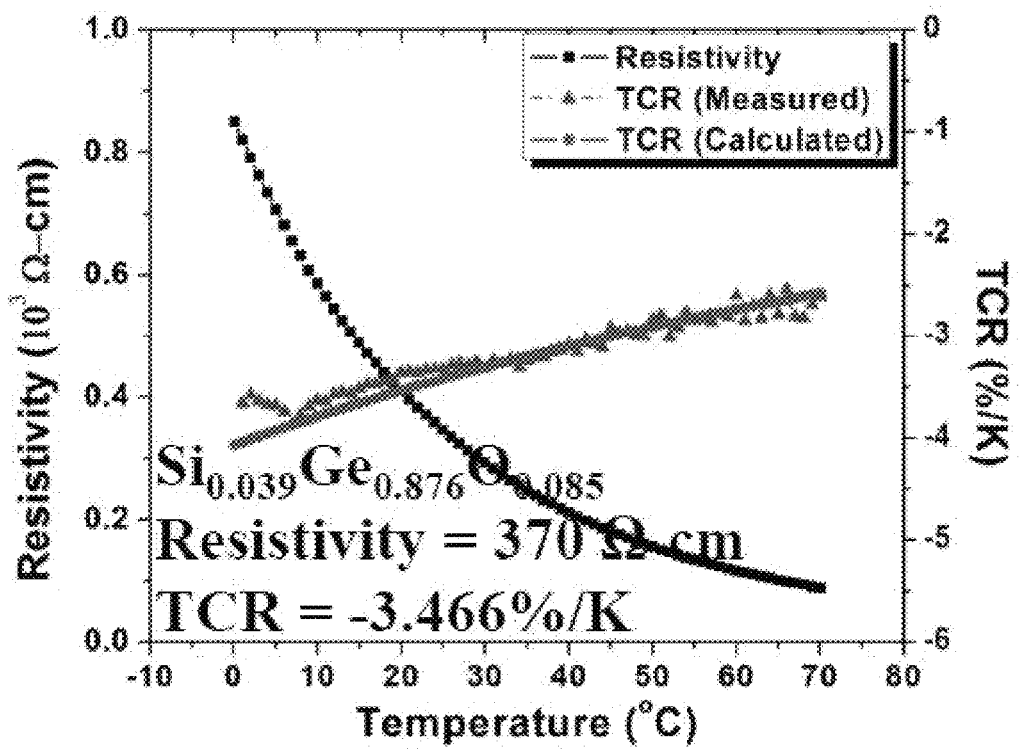
FIG. 5E shows measured TCR and resistivity versus temperature for $Si_{0.039}Ge_{0.876}O_{0.085}$.
Figure 5F:
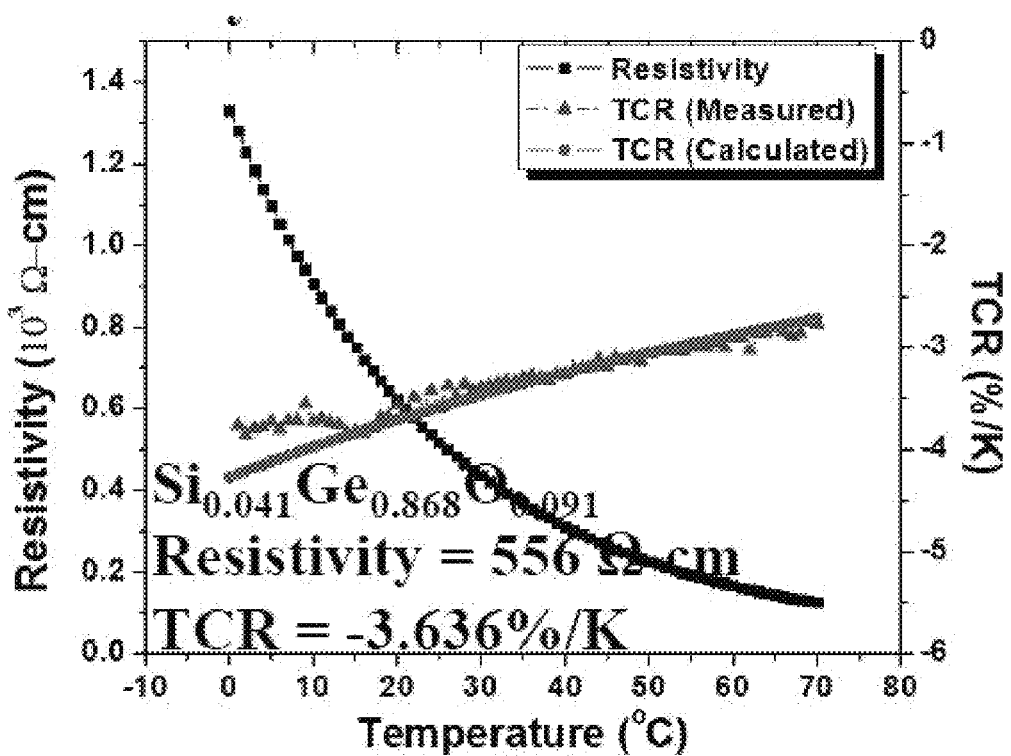
FIG. 5F shows measured TCR and resistivity versus temperature for $Si_{0.413}Ge_{0.868}O_{0.091}$.
Figure 5G:
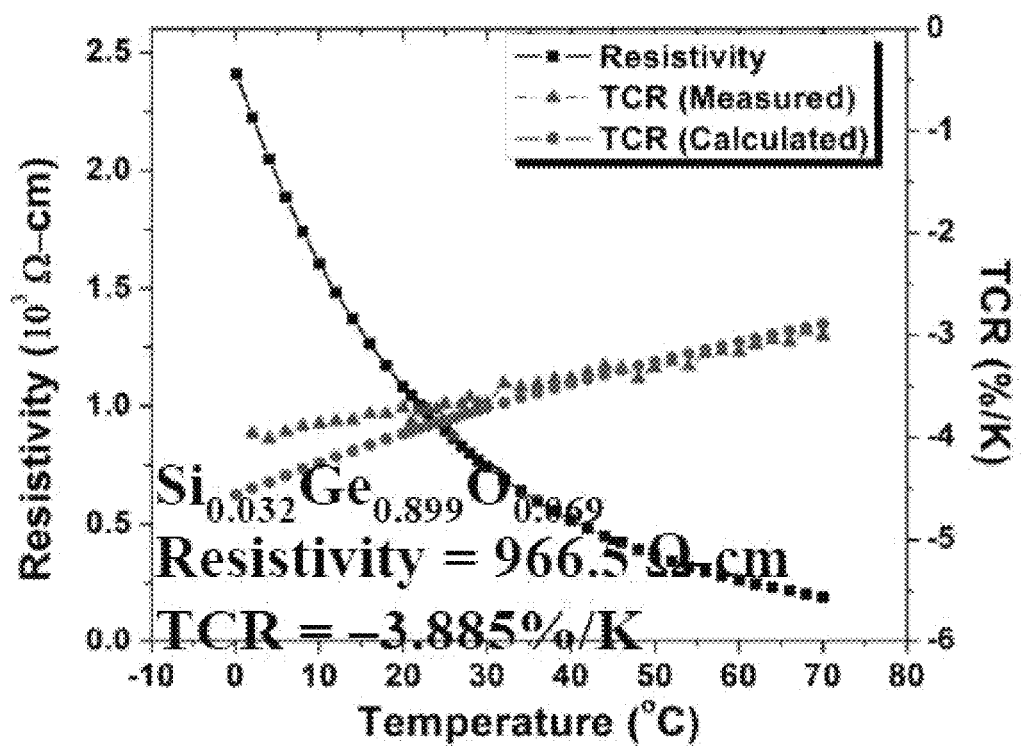
FIG. 5G shows measured TCR and resistivity versus temperature for $Si_{0.032}Ge_{0.899}O_{0.069}$.
Figure 5H:
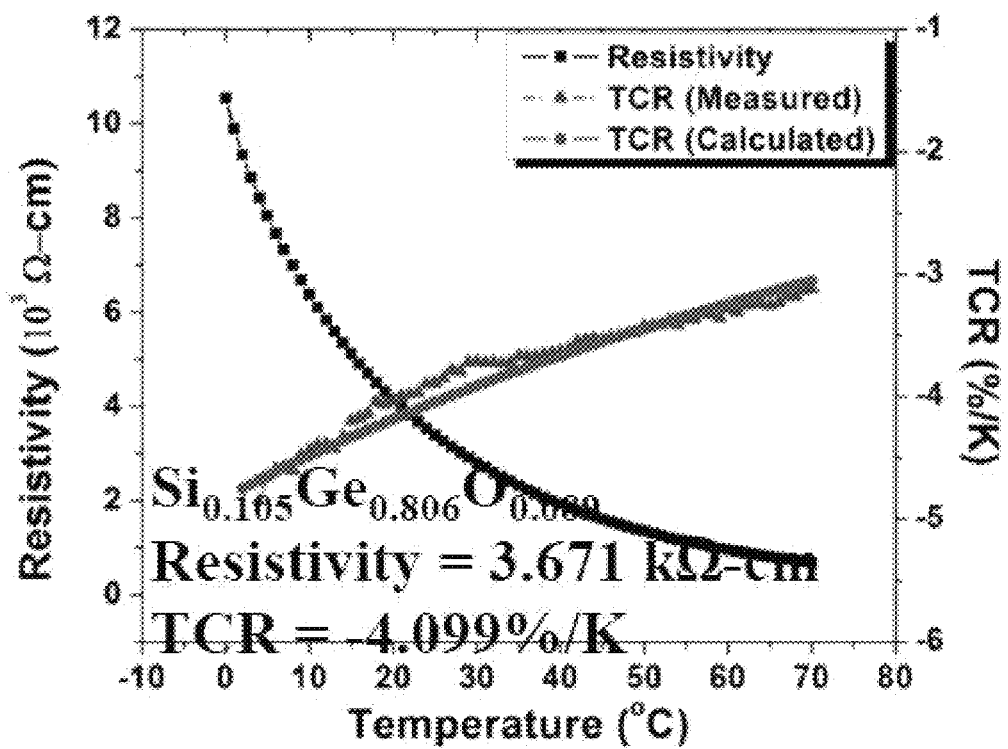
FIG. 5H shows measured TCR and resistivity versus temperature for $Si_{0.105}Ge_{0.806}O_{0.089}$.
Figure 51:
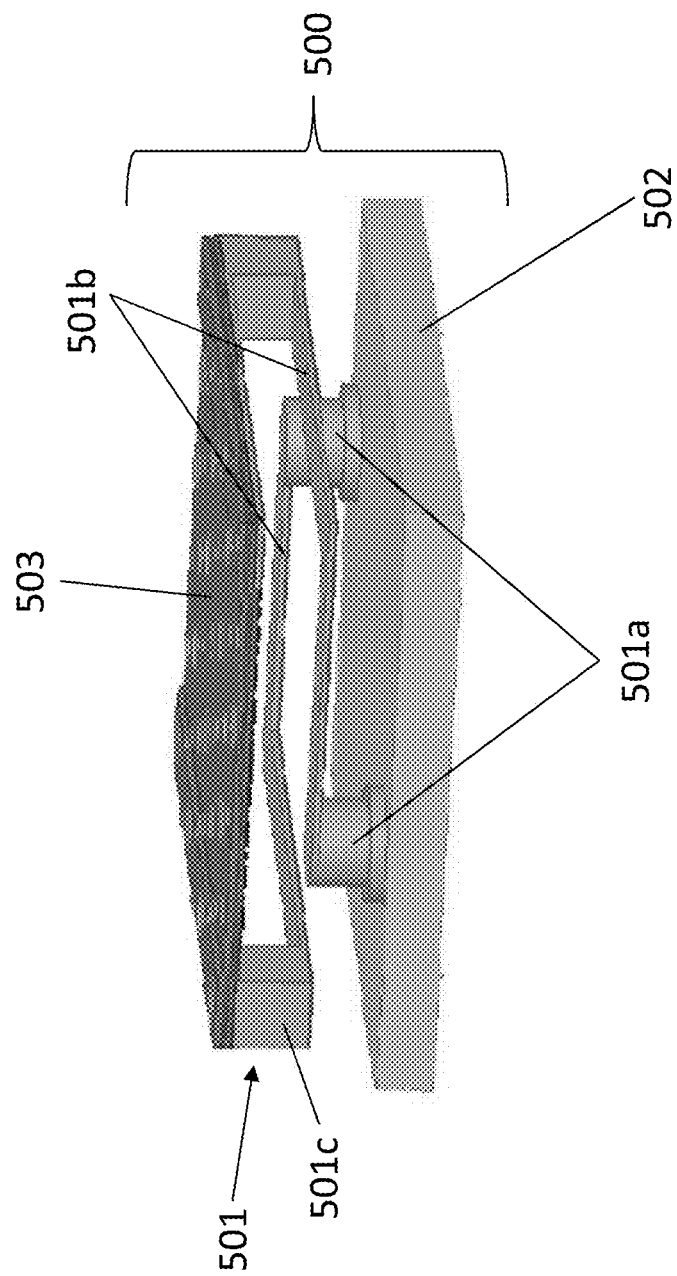

This result indicates that the TCR value can be increased, e.g., by increasing oxygen content, and still obtaining acceptable resistivity value, as shown in FIGS. 5A, 5B, 5C and 5D. Additionally, FIGS. 5E and 5F show examples with relatively high TCR and low resistivity, wherein FIG. 5E shows measured TCR and resistivity versus temperature for $Si_{0.039}Ge_{0.876}O_{0.085}$, and FIG. 5F shows measured TCR and resistivity versus temperature for $Si_{0.041}Ge_{0.868}O_{0.091}$. FIGS. 5G and 5H show examples with relatively high TCR and high resistivity, wherein FIG. 5G shows measured TCR and resistivity versus temperature for $Si_{0.032}Ge_{0.899}O_{0.069}$, and FIG. 5H shows measured TCR and resistivity versus temperature for $Si_{0.105}Ge_{0.806}O_{0.089}$.

Figure 5J:
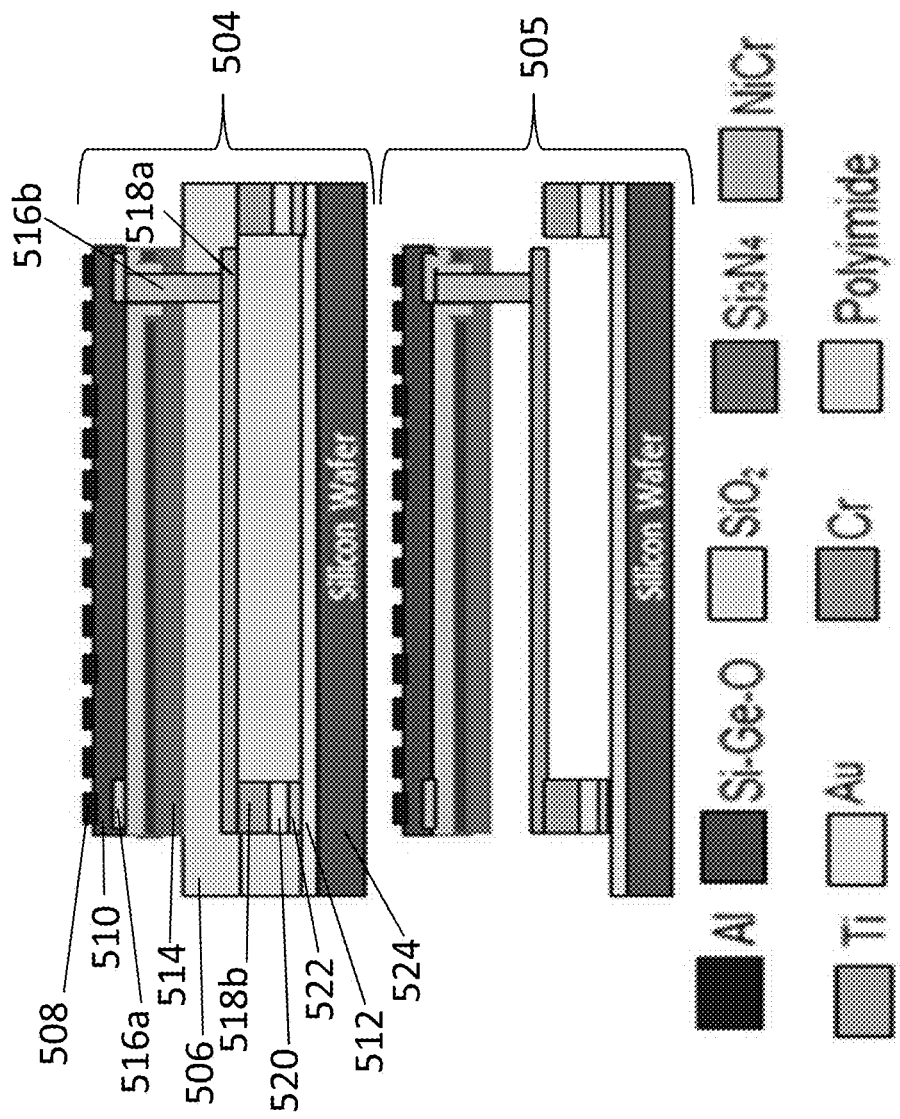
FIG. 5J shows a cross-section view of fabrication steps of the microbolometer according to FIG. 5I before and after removing a polyimide sacrificial layer.
Figures 5K, 5L:
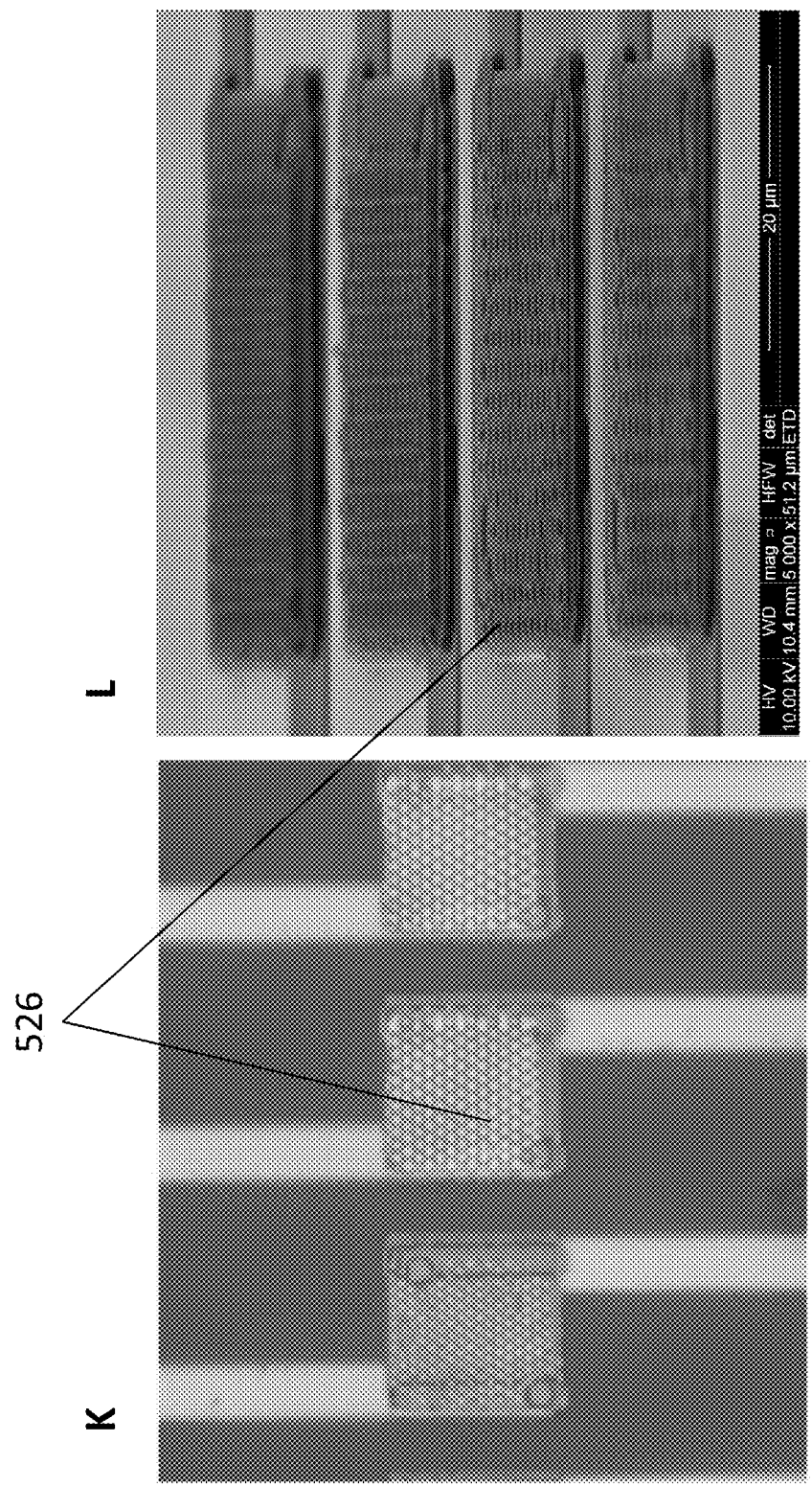
FIG. 5K shows an optical image of the fabricated microbolometers according to FIG. 5I.
FIG. 5L shows a scanning electron microscope (SEM) micrograph of the fabricated microbolometers according to FIG. 5I.
Figure 5M:
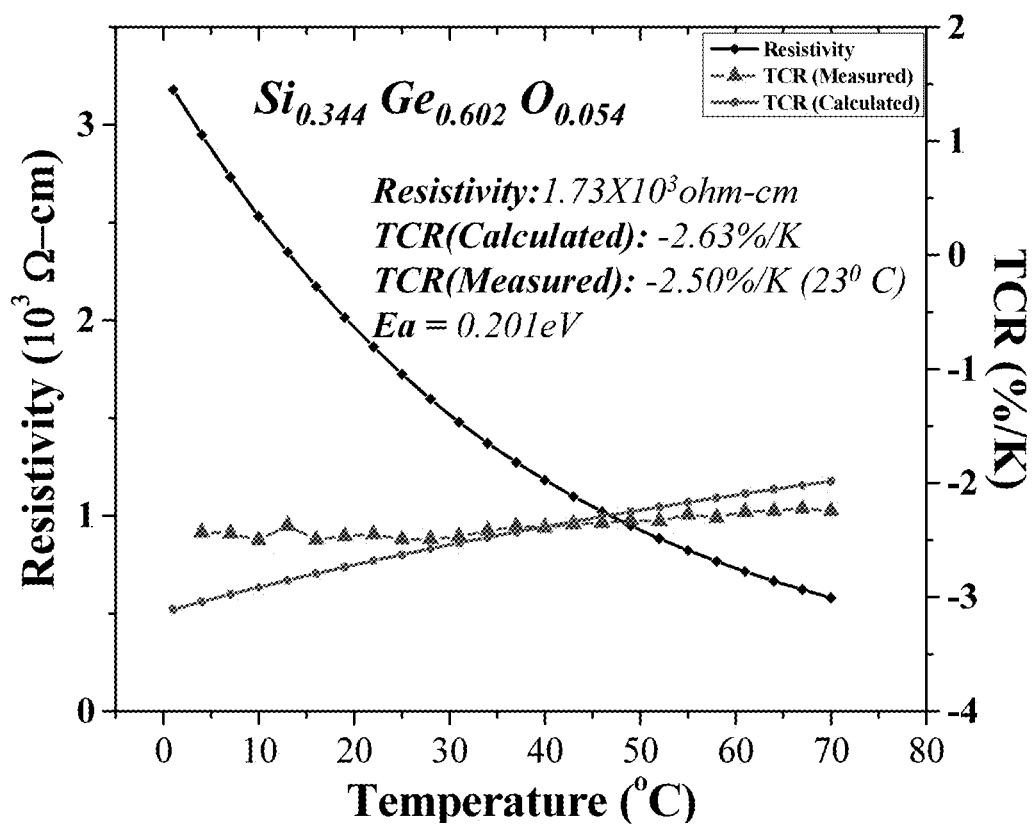
FIG. 5M shows TCR versus temperature and the corresponding resistivity of the fabricated devices according to FIG. 5I.
Figure 5N:
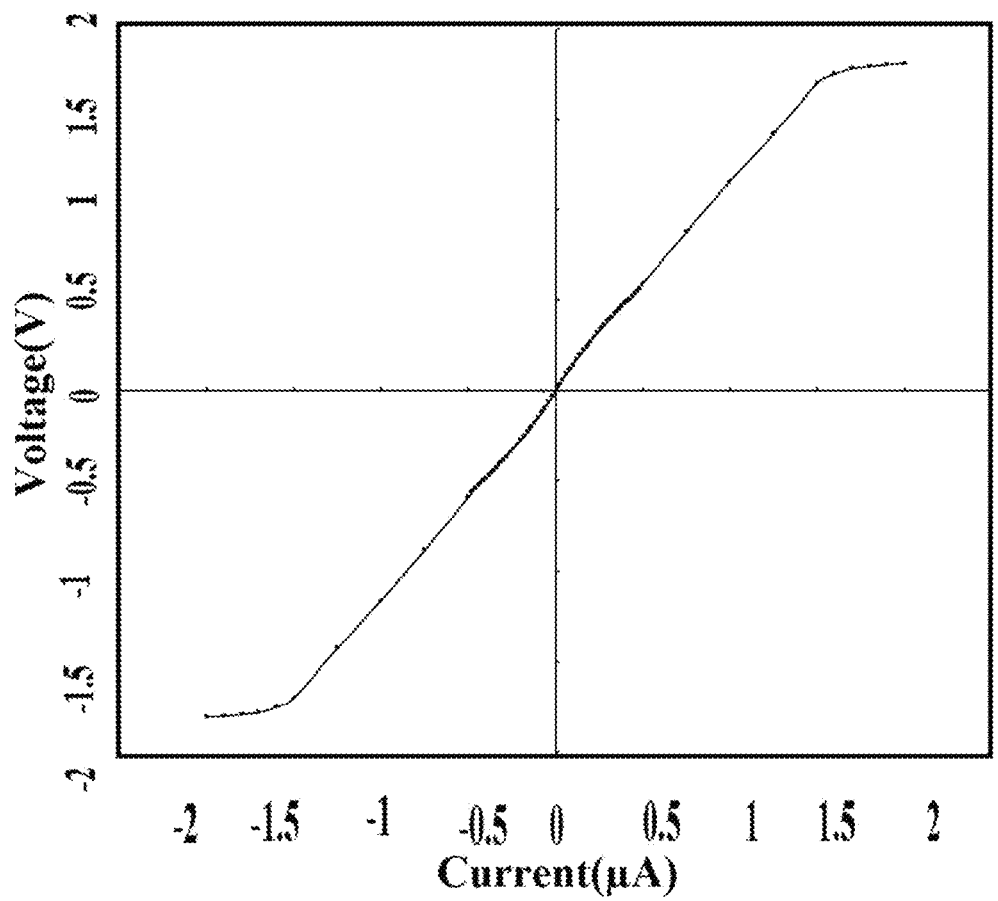
FIG. 5N shows current-voltage characteristics of the tested microbolometer according to FIG. 5I.
Figures 5O, 5P, 5Q, 5R:
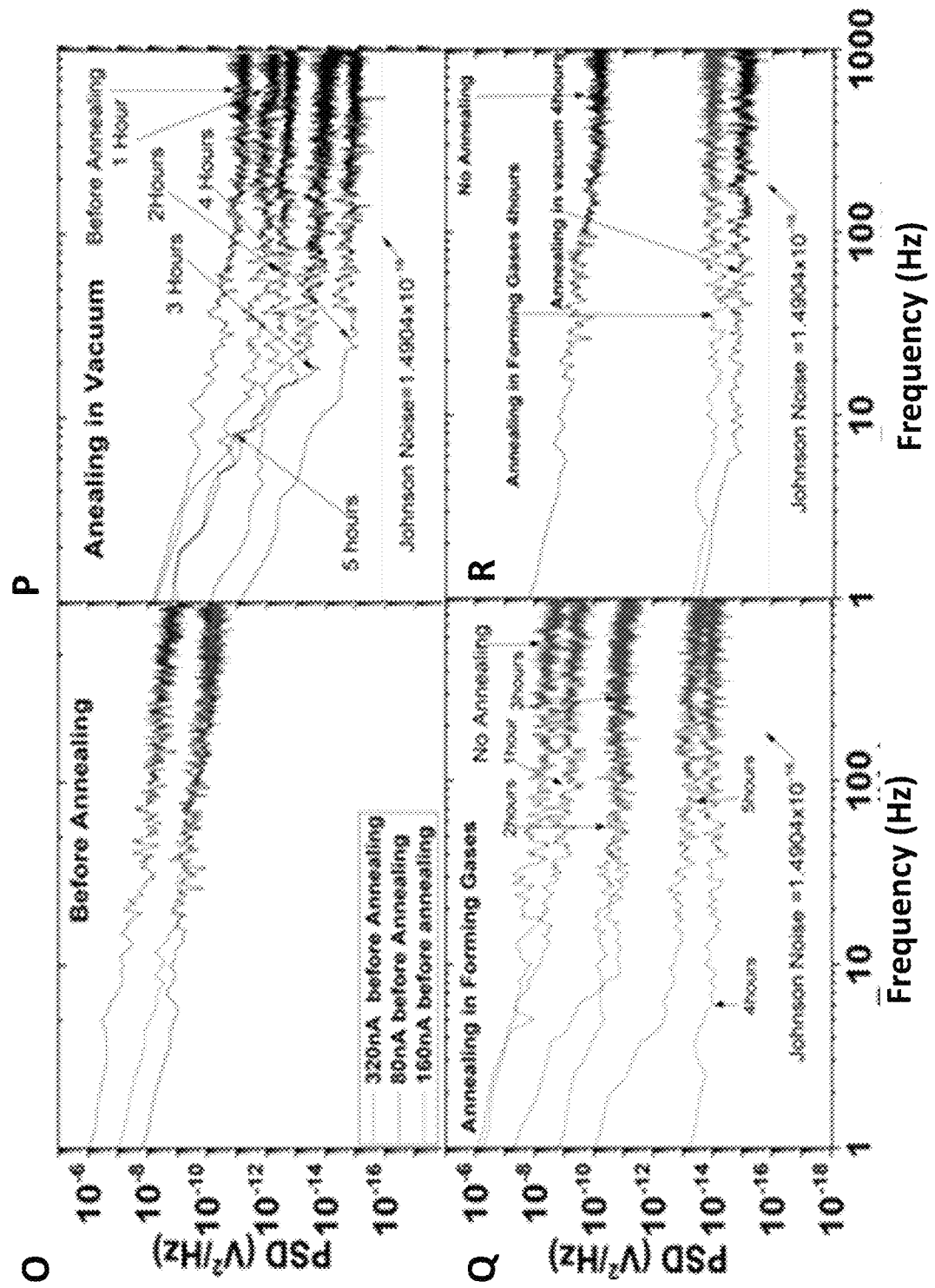
FIG. 5O shows voltage noise PSD with different biasing currents for before annealing according to the microbolometer of FIG. 5I.
FIG. 5P shows voltage noise PSD after annealing in vacuum at 300° C. according to the microbolometer of FIG. 5I.
FIG. 5Q shows voltage noise PSD after annealing in forming gases at 300° C. according to the microbolometer of FIG. 5I.
FIG. 5R shows voltage noise PSD with noise comparison before and after annealing according to the microbolometer of FIG. 5I.
Figure 5S:
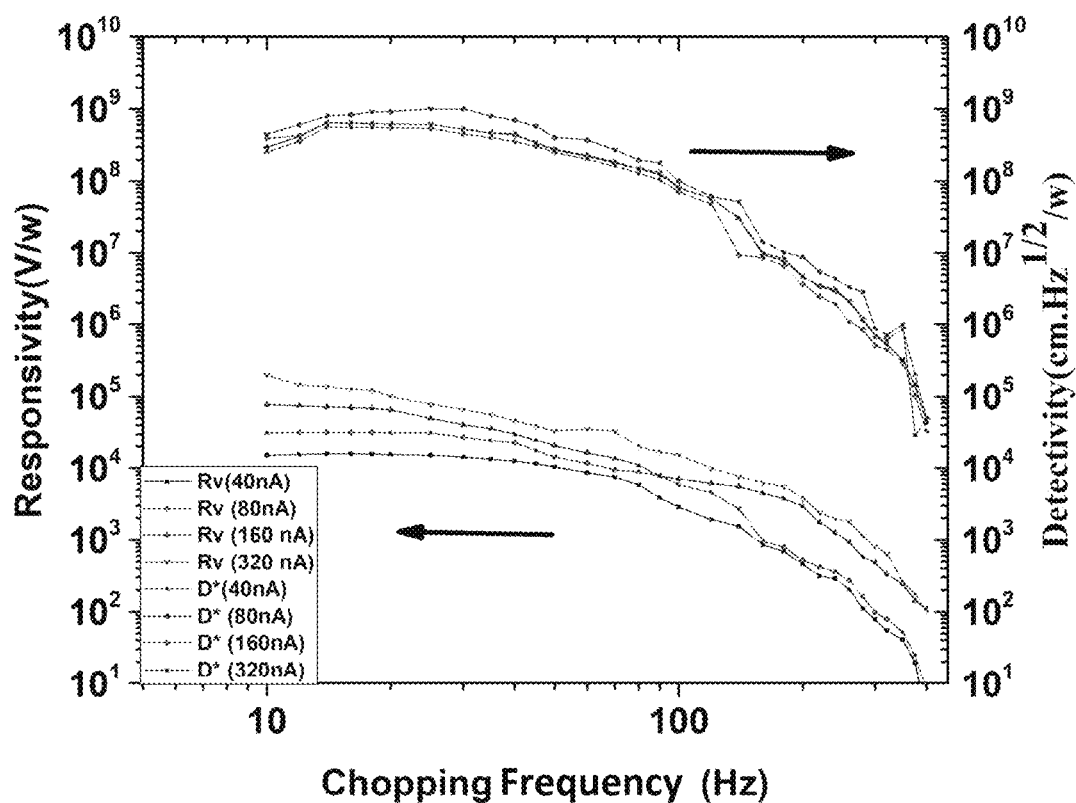
FIG. 5S shows voltage responsivity and detectivity as a function of chopping frequency at 80 nA according to the microbolometer of FIG. 5I.

In one embodiment, shown in FIGS. 5I to 5T, a metasurface integrated microbolometer architecture was fabricated with an area of 40×40 µm². FIG. 5I shows a 3D drawing of such a microbolometer 500. A support 501 is on a substrate 502. The support 501 can include anchors 501a, arms 501b, and contact blocks 501c. A metasurface integrated layer 503, which comprises, for example, a sensing layer and a metasurface, is supported on substrate 502 by support 501 which is positioned under layer 503. FIG. 5J shows a cross-section view of the fabrication steps before (504) and after (505) removing a polyimide sacrificial layer 506. Other layers/elements in FIG. 5J include: Al layer 508, Si—Ge—O layer 510, $SiO_2$ layer 512, $Si_3N_4$ layer 514, NiCr layer 516a (and NiCr element 516b), Ti layer 518a (and Ti element 518b), Au layer 520, Cr layer 522 and silicon wafer 524. More detailed discussion of the fabrication process is found below with reference to FIGS. 7A to 7C, FIGS. 20A to 20C and FIGS. 21A to 21D. The metasurface consisted of metal disks 526 arranged on an HCP lattice, shown in each of FIGS. 5K and 5L, wherein FIG. 5K shows an optical image of fabrications of the microbolometer 500, and FIG. 5L shows an SEM micrograph of fabrications of the microbolometer 500. The disk diameter and periodicity determine the absorptance of the metasurface and was selected to be unity at a specific wavelength. When multiple disks are tessellated in the pattern the absorptance can span the entire LWIR window. This occurs without a Fabry-Perot cavity or umbrella superstructure and allows the support structure to be optimized for thermal performance without regard for disrupting the resonant cavity. When the structure is positioned under the cavity the fill factor increases to >90%. Denser integration allows smaller pixel sizes with reduced thermal capacitance improving focal plane array performance. With reference to FIG. 5M, a $Si_{0.344}Ge_{0.6}O_{0.054}$ film was deposited, using co-sputtering from Si and Ge targets in an Ar and $O_2$ environment, and encapsulated between a ground plane and the metasurface. It was then suspended above the oxidized Si substrate by ashing the polyimide sacrificial layer 506 (e.g., see FIG. 5J). The resistance, TCR, and resistivity were measured as a function of temperature, with the results shown in FIG. 5M. The TCR and resistivity at room temperature were 2.5%/K, and 1.73 kΩ·cm, respectively. The current-voltage was linear up to 1.5 µA, as shown in FIG. 5N. The devices were annealed in vacuum and in forming gases at 300° C. The voltage noise was then measured versus current. The results show the voltage noise PSD: (1) increases as the current increase; and (2) before and after annealing in vacuum and in forming gases for duration from 1 hour to 5 hours using a bias current of 80 nA. FIG. 5S shows voltage responsivity and detectivity as a function of chopping frequency at 80 nA. The voltage noise of the devices decreases with increased annealing time. After 4 hours of annealing, the voltage noise started to increase. The lowest measured noise for the metasurface integrated microbolometer was $1.723 \times 10^{15}$ V$^2$/Hz (one order of magnitude lower noise than the microbolometers without metasurface). The results, shown in FIGS. 5O to 5R, also demonstrated that annealing in vacuum resulted in lower noise than in forming gases. As shown by the summary data of the fabricated and tested microbolometer as listed in FIG. 5T, the microbolometer absorptivity was 59.7% for $\lambda$=2.5-14 µm, and the measured voltage responsivity, detectivity, and thermal response time were $5.1 \times 10^4$ V/W and $5.44 \times 10^8$ cm·Hz$^{1/2}$/W, and 5.307 ms, respectively.

Additional different amorphous silicon germanium oxide $Si_xGe_yO_{1-x-y}$ thin films were fabricated using a co-deposition from silicon and germanium targets in a fixed Ar and variable $O_2$ environment at room temperatures. The powers applied to the Si and Ge targets are varied along with the flow of oxygen to create different stoichiometries. HCP aluminum disk arrays were then patterned on top of the $Si_xGe_yO_{1-x-y}$ films to define the metasurface. The $Si_xGe_yO_{1-x-y}$ absorber was sandwiched between the metasurface and ground plane and suspended above the substrate in order to govern the absorption of incident radiation and eliminates the need for a ¼-wave cavity. This allowed the support structure to be designed to optimize the thermal isolation of the microbolometer.

Figures 6A, 6B, 6C, 6D:
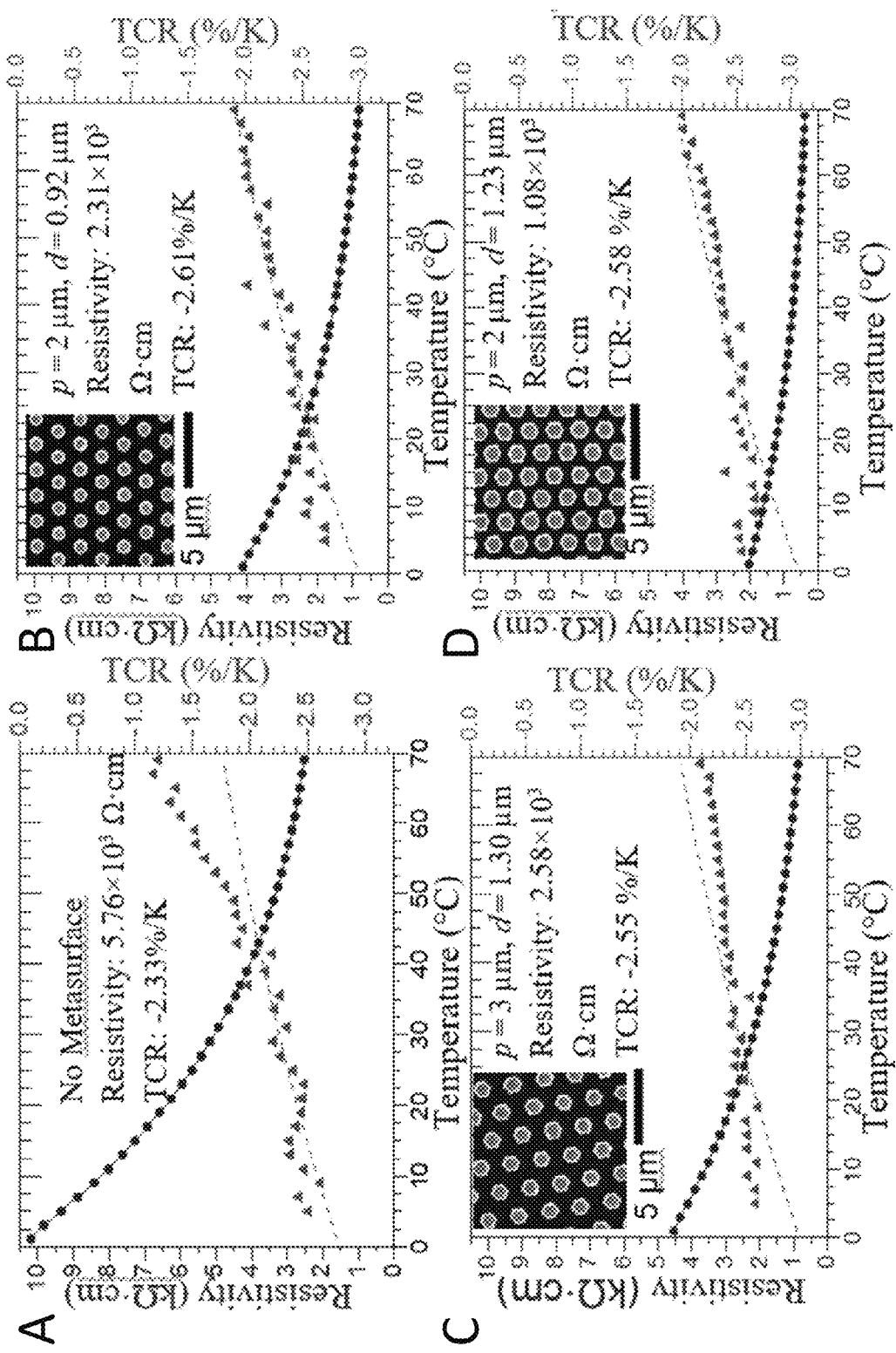
FIG. 6A shows measured TCR and resistivity versus temperature for a $Si_{0.655}Ge_{0.215}O_{0.130}$ film without a metasurface.
FIG. 6B shows the film of FIG. 6A with a metasurface, with center to center spacing (p) and disks diameter (d), wherein p=2 m and d=0.92 m (an SEM micrograph of the patterned metasurface is also shown).
FIG. 6C shows the film of FIG. 6A with a metasurface, with center to center spacing (p) and disks diameter (d), wherein p=3 m and d=1.30 m (an SEM micrograph of the patterned metasurface is also shown).
FIG. 6D shows the film of FIG. 6A with a metasurface, with center to center spacing (p) and disks diameter (d), wherein p=2 m and d=1.23 m (an SEM micrograph of the patterned metasurface is also shown).

The spectral absorptance of the microbolometer is dependent on the metasurface geometry and this can be designed to produce a narrowband or broadband response including unity absorptance. The R-T and TCR characteristics of $Si_{0.655}Ge_{0.215}O_{0.130}$ films, for example, were measured with and without metasurface using a four point probe in vacuum. FIGS. 6A to 6D show the experimentally measured resistivity and TCR, wherein FIG. 6A shows measured TCR and resistivity versus temperature for a $Si_{0.655}Ge_{0.215}O_{0.130}$ film without a metasurface, FIG. 6B shows the film of FIG. 6A with a metasurface, with center to center spacing (p) and disks diameter (d), wherein p=2 µm and d=0.92 µm (and also shows an SEM micrograph of the patterned metasurface), FIG. 6C shows the film of FIG. 6A with a metasurface, with center to center spacing (p) and disks diameter (d), wherein p=3 µm and d=1.30 µm (and also shows an SEM micrograph of the patterned metasurface), and FIG. 6D shows the film of FIG. 6A with a metasurface, with center to center spacing (p) and disks diameter (d), wherein p=2 µm and d=1.23 µm (and also shows an SEM micrograph of the patterned metasurface).

Figures 6E, 6F:
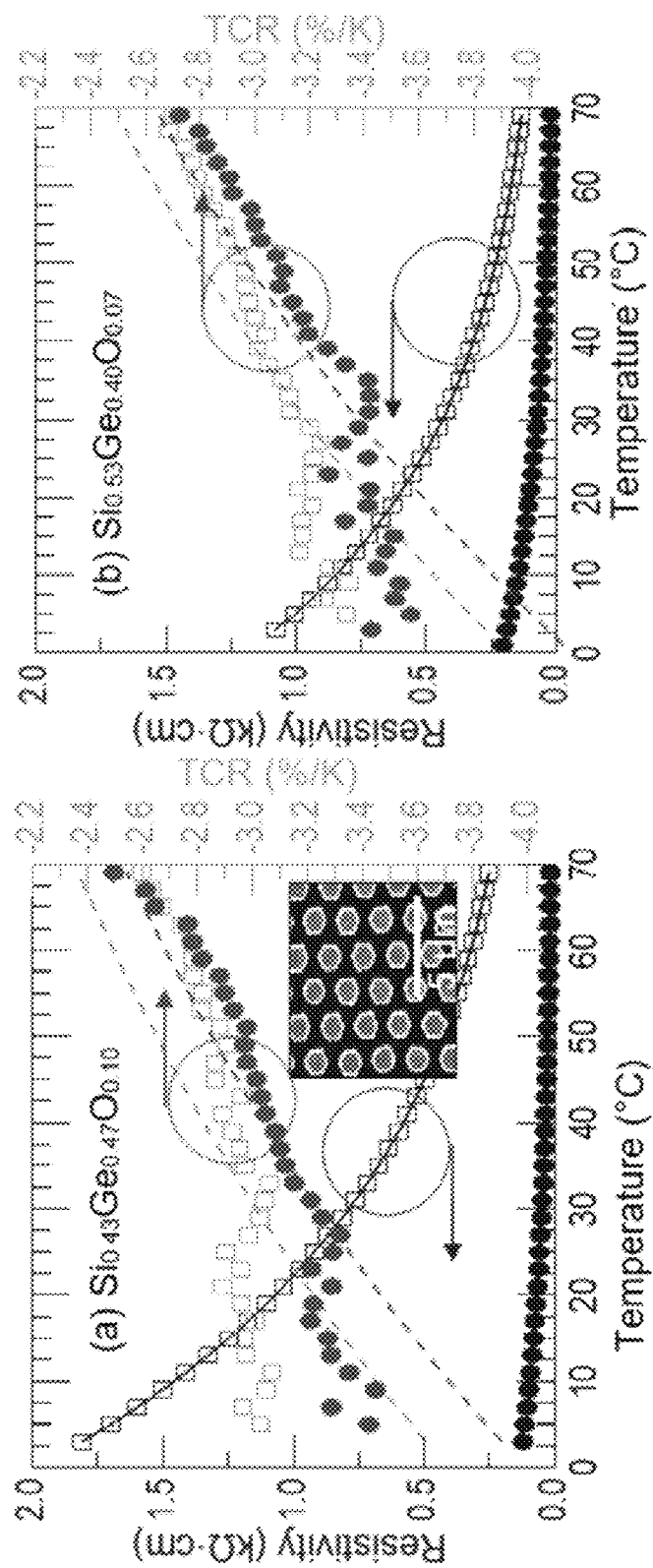
FIG. 6E shows measured resistivity and TCR for $Si_{0.43}Ge_{0.47}O_{0.10}$ films with and without metasurfaces, including an SEM micrograph of the metasurface on the film.
FIG. 6F shows measured resistivity and TCR for $Si_{0.53}Ge_{0.40}O_{0.07}$ films with and without metasurfaces.

FIGS. 6E and 6F show additional results. FIG. 6E shows measured resistivity and TCR for $Si_{0.43}Ge_{0.47}O_{0.10}$ films with and without metasurfaces, including an SEM micrograph of the metasurface on the film. FIG. 6F shows measured resistivity and TCR for $Si_{0.53}Ge_{0.40}O_{0.07}$ films with and without metasurfaces. In FIGS. 6E and 6F, solid circles at the bottom of the plots indicate a film with a metasurface, open squares near the bottom of the plots represent a film without a metasurface, dashed lines indicate calculated TCR, and open squares and solid circles near the middle of the plots represent measured data of the films. Depending on the stoichiometry, the TCR with metasurface increased by 3-12% while the resistivity is reduced by 590-1600%. The stoichiometry and crystallinity of the fabricated $Si_xGe_yO_{1-x-y}$ films for fixed oxygen concentration were measured using energy dispersive X-ray spectroscopy (EDX) and X-ray diffraction (XRD).

Figure 6G:
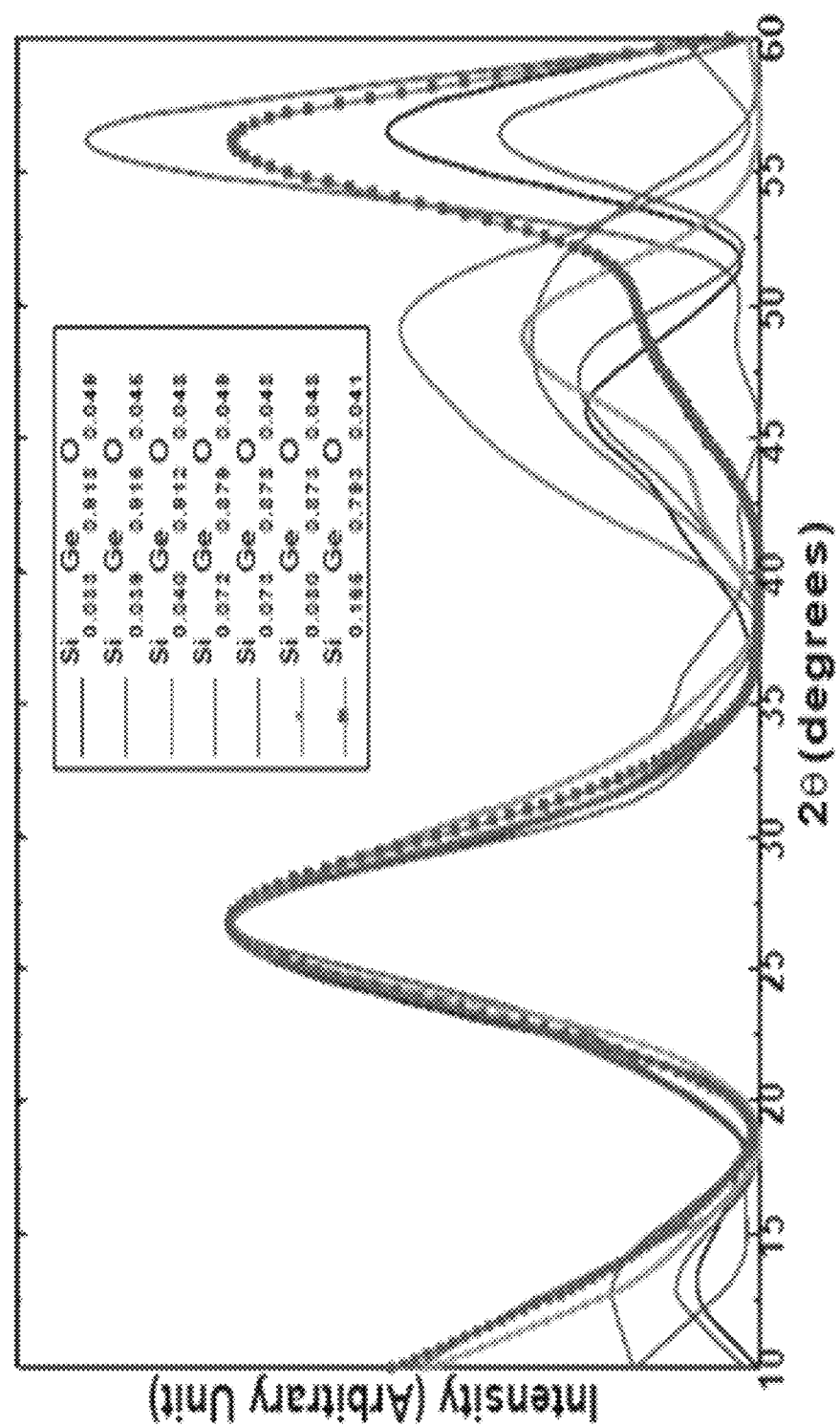
FIG. 6G shows an X-ray diffraction of various $Si_xGe_yO_{1-x-y}$ films for fixed oxygen of ~4%.
Figure 6H:
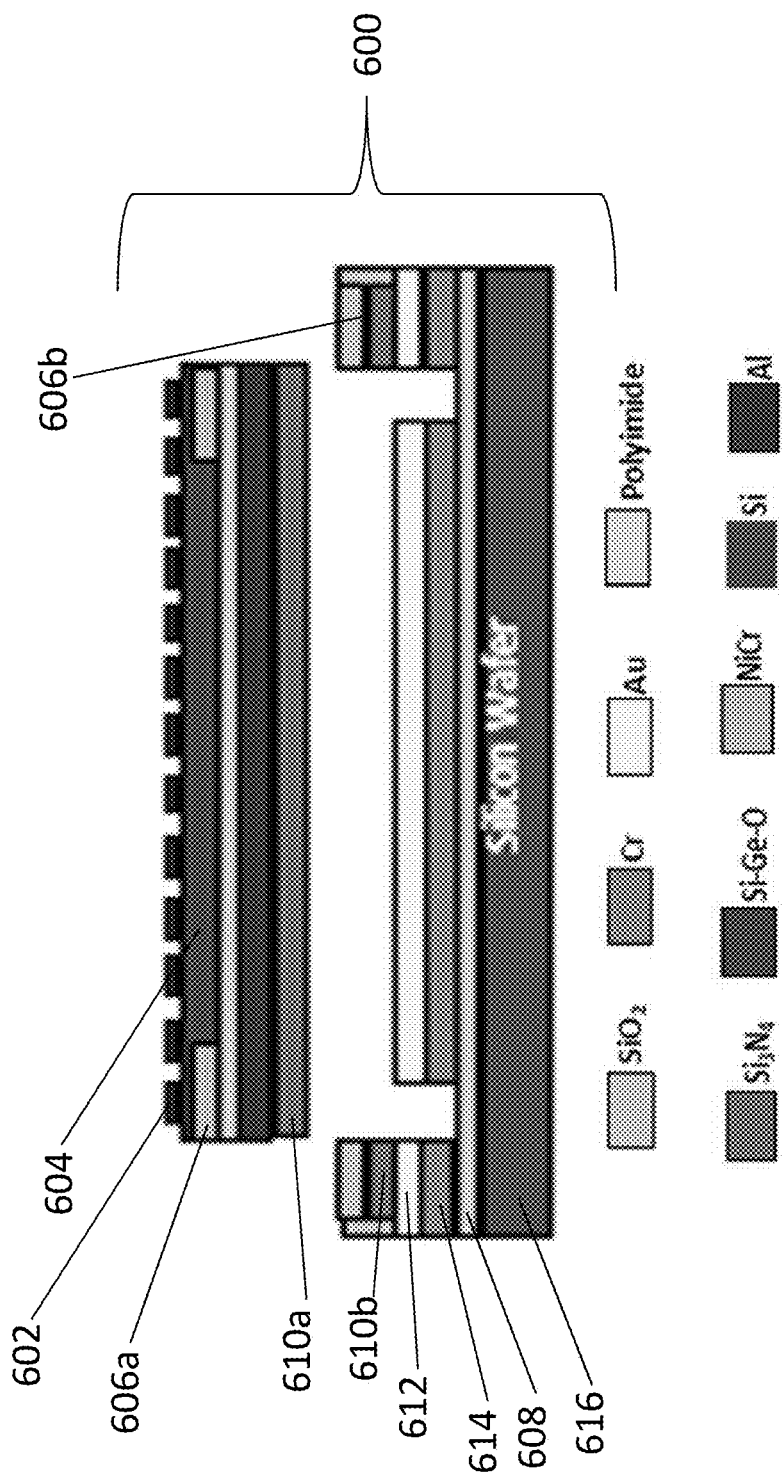
FIG. 6H shows a cross-sectional view of $Si_xGe_yO_{1-x-y}$ microbolometers with an air gap.
Figure 6I:
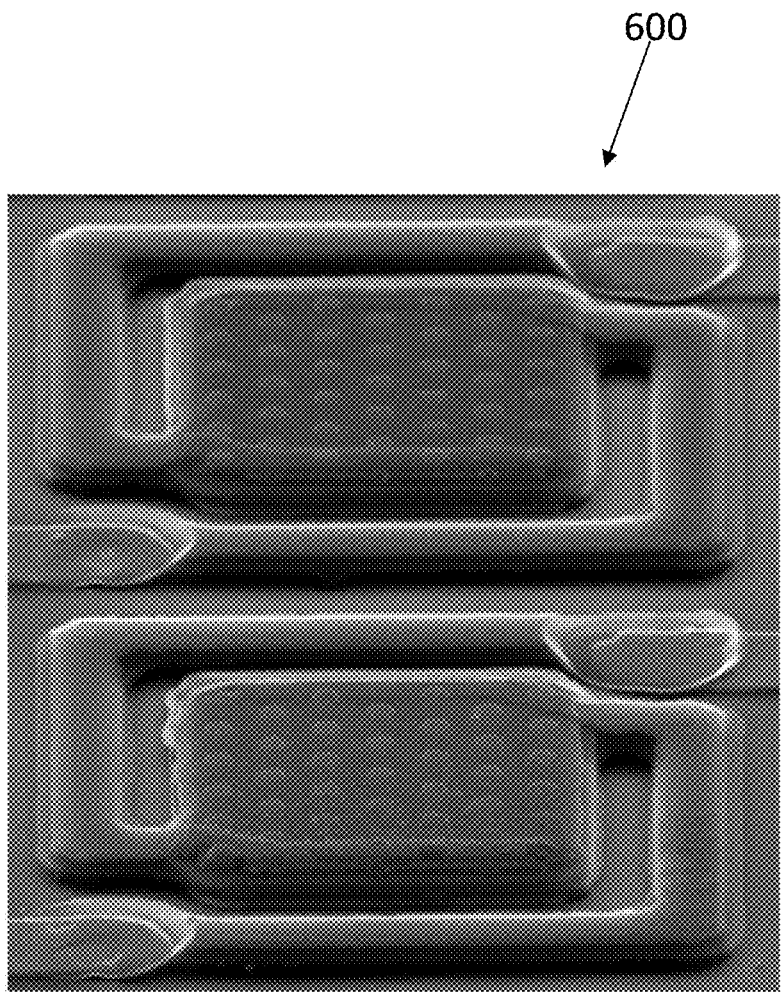
FIG. 6I shows an SEM of a fabricated device of FIG. 6H with the pixel size of 40×40 µm².
Figure 6J:
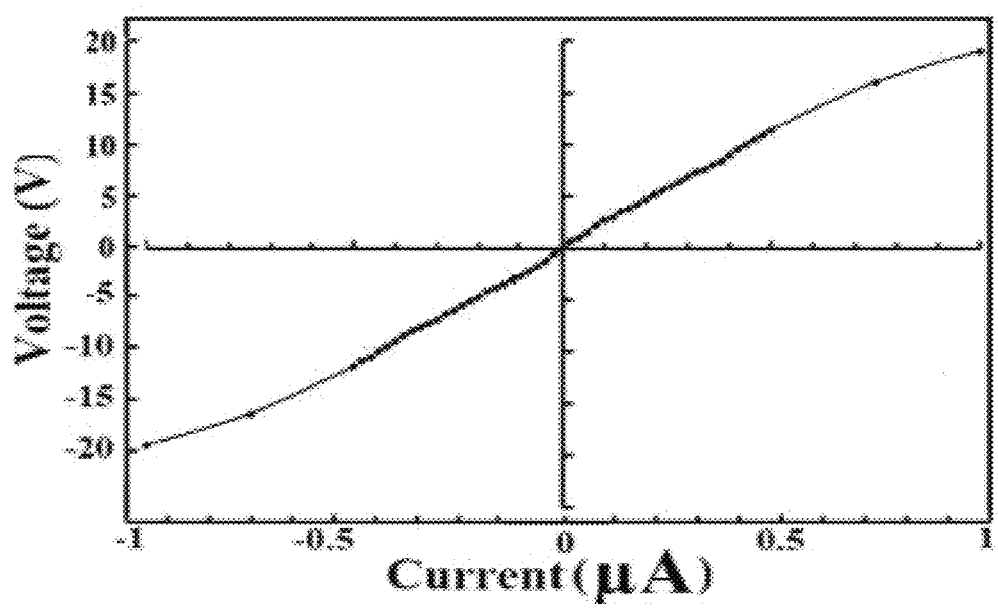
FIG. 6J shows I-V characteristics of the fabricated microbolometer of FIG. 6I.
Figure 6K:
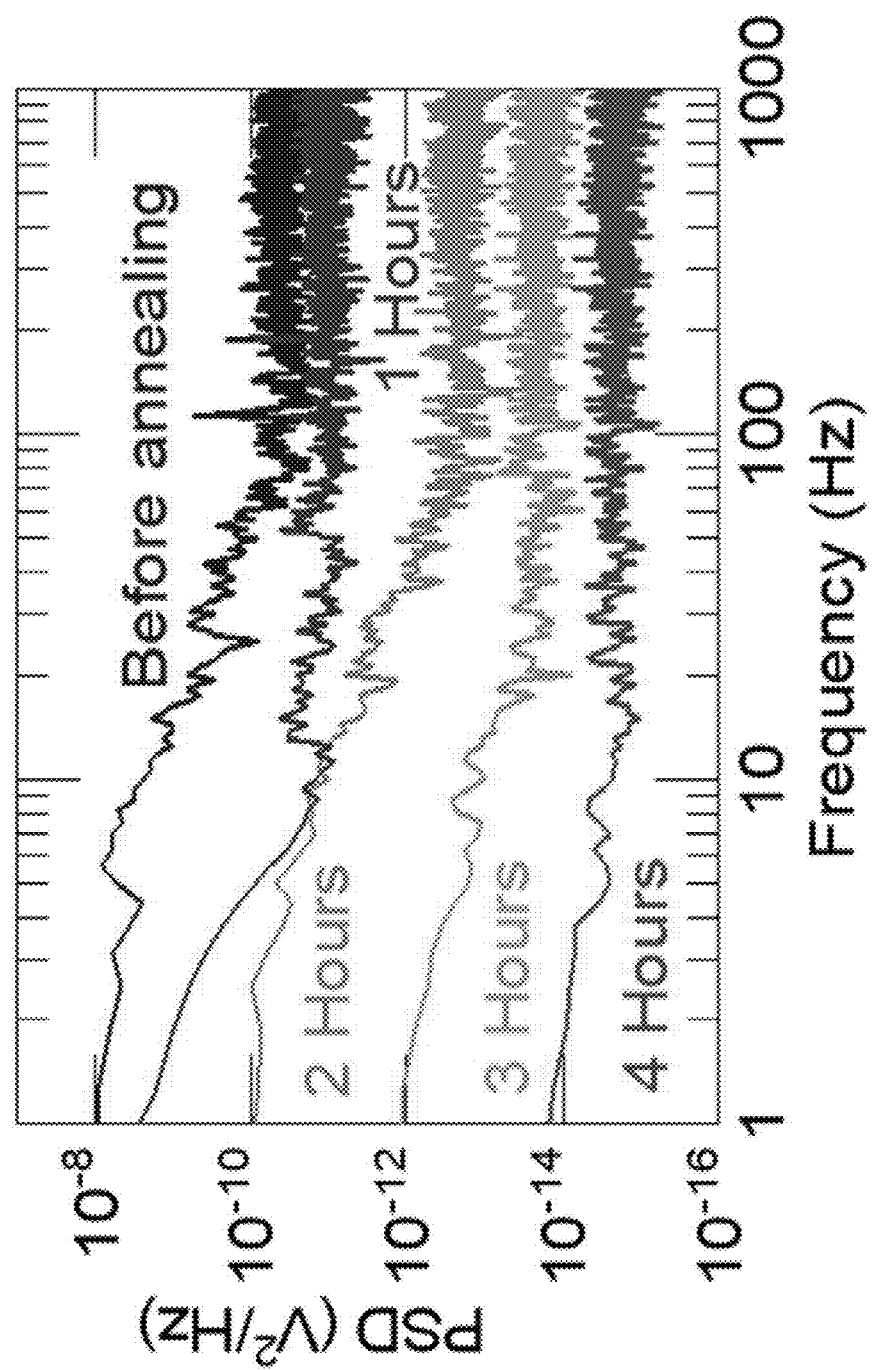
FIG. 6K shows noise PSD for the device of FIG. 6I with vacuum annealing showing reduced noise after 4 hrs.
Figure 6L:
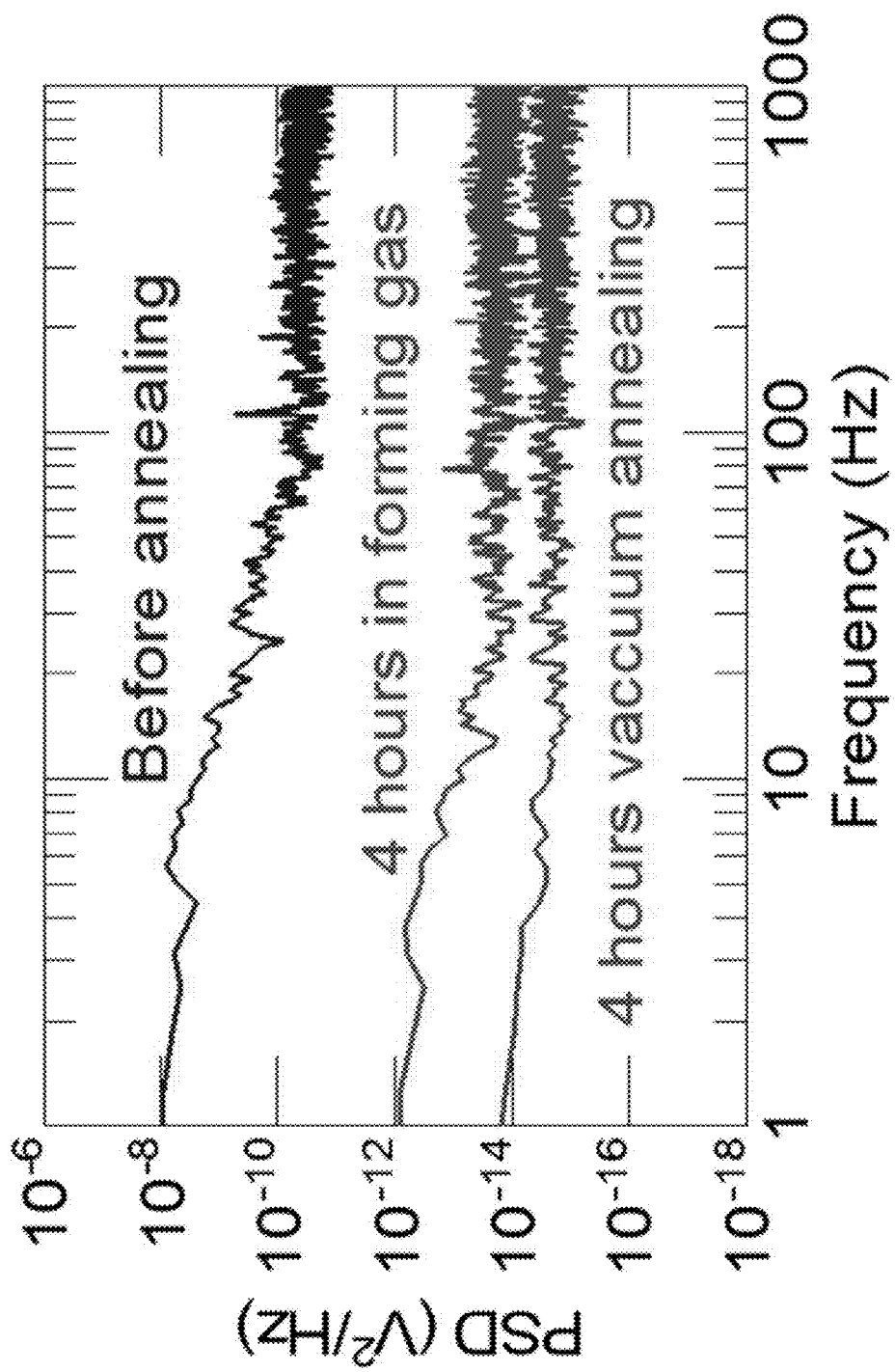
FIG. 6L shows noise PSD for the device of FIG. 6I annealed in vacuum and forming gases for 4 hours at 300°.
Figure 6M:
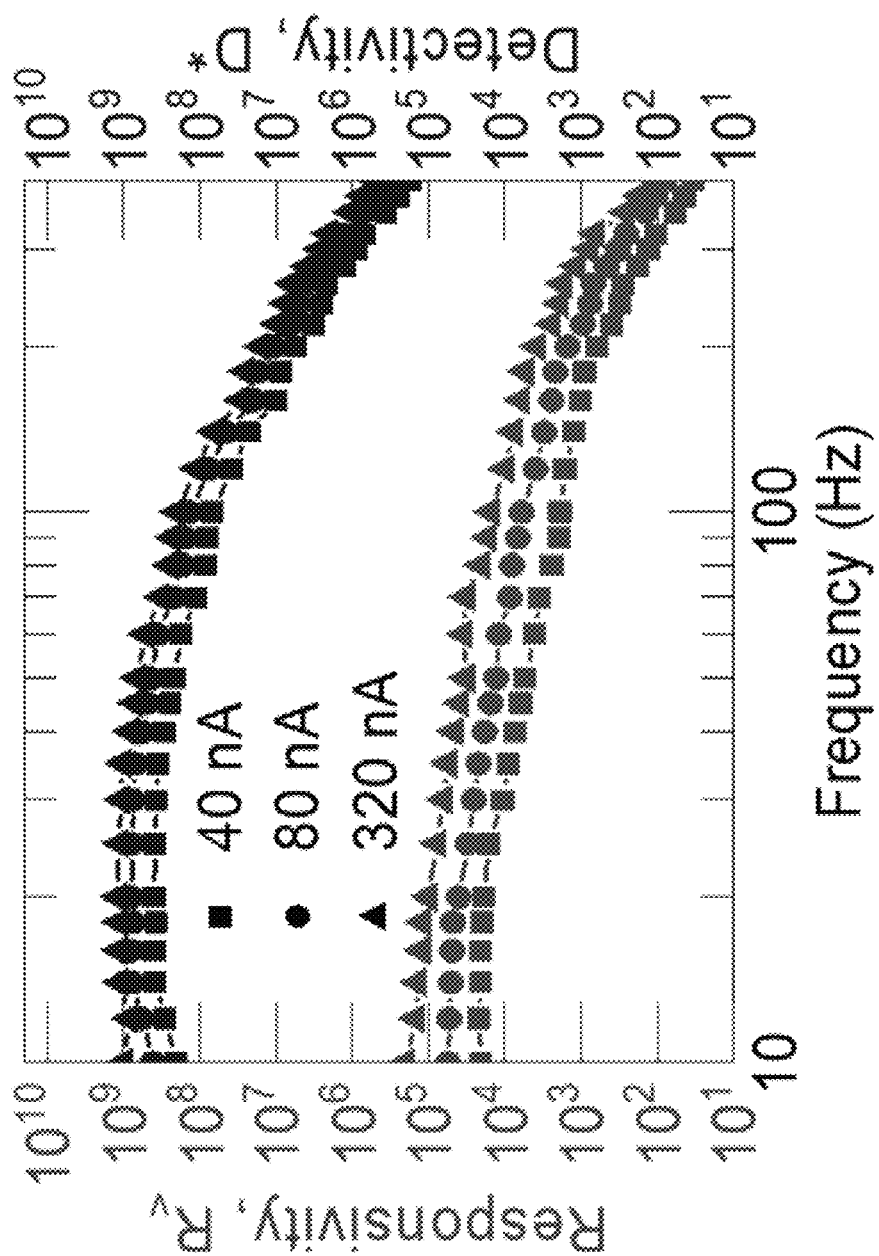
FIG. 6M shows optical performance for the device of FIG. 6I including responsivity and detectivity.

The inventors did not observe any sharp peak in the spectrum, suggesting amorphous nature of all films. For example, FIG. 6G shows XRD of a plurality of other $Si_xGe_yO_{1-x-y}$ films for fixed oxygen of ~4% The devices (e.g., 25×25 µm$^2$ and 40×40 µm$^2$) were fabricated using surface micromachining technology. FIG. 6H shows layers and elements of microbolometer fabrication 600, including Al layer 602, Si—Ge—O layer 604, NiCr layer 606a (and NiCr element 606b), SiO$_2$ layer 608, Si$_3$N$_4$ layer 610a (and Si$_3$N$_4$ element 610b), Au layer 612, Cr layer 614 and silicon wafer 616. FIG. 6I shows an SEM image of a 40×40 µm$^2$ fabrication of the fabrication 600. The current-voltage characteristics showed the device linearity up to 0.5 µA, as shown in FIG. 6J. FIGS. 6K and 6L show noise PSD measurements, wherein FIG. 6K shows noise PSD for the device of FIG. 6I with vacuum annealing, showing reduced noise after 4 hrs, and FIG. 6L shows noise PSD for the device of FIG. 6I annealed in vacuum and in forming gases for 4 hours at 3000. The voltage noise PSD was measured using a bias current of 80 nA before and after annealing in both vacuum and in forming gases, both at 300° C. The results showed the voltage noise decreased as the annealing time is increased. After 4 hours of annealing, the voltage noise started to increase. The lowest measured noise at the corner frequency was $1.2 \times 10^{-16}$ V$^2$/Hz. This is two orders of magnitude lower than the microbolometers without metasurface (FIG. 6K). In addition, annealing in vacuum resulted in lower noise than in forming gases (FIG. 6L). Finally, the microbolometer demonstrated high voltage responsivity and detectivity as shown in FIG. 6M, and low thermal conductance, and thermal response time of 4.18 ms, as shown in the summary data listed in FIG. 6N.

Figures 6O, 6P:
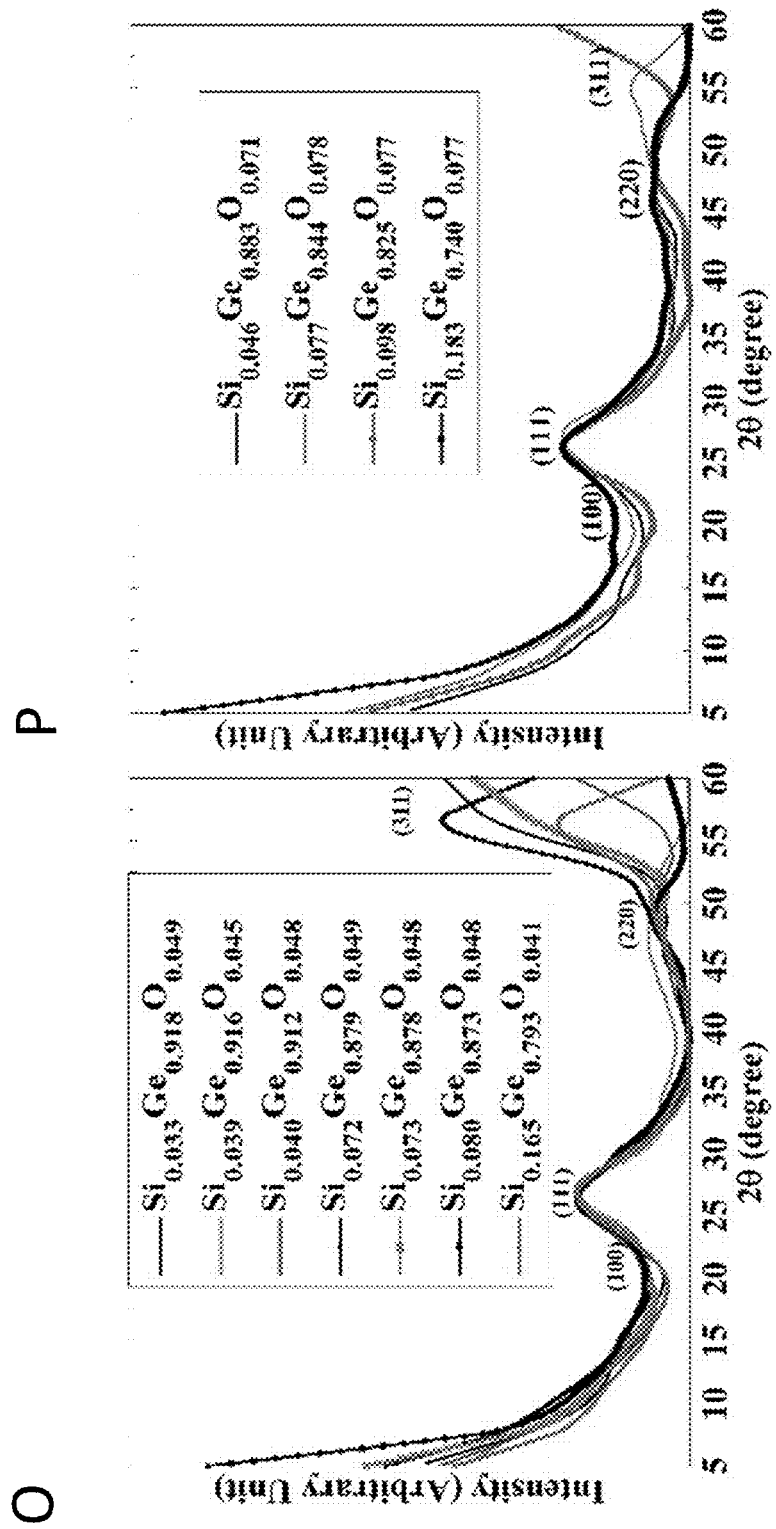
FIG. 6O shows X-ray diffraction of $Si_xGe_yO_{1-x-y}$ films for fixed $O_2$ at 4%.
FIG. 6P shows X-ray diffraction of $Si_xGe_yO_{1-x-y}$ films for fixed $O_2$ at 7%.

The inventors performed a detailed X-ray study of all deposited films. As discussed above, the inventors did not observe any sharp peaks in the spectrum, suggesting the amorphous nature of all films. Additional examples are shown in FIGS. 6O and 6P. In addition, the inventors did not observe any significant broadening or narrowing of the dominant peak at 28° or of the partial diffraction peak at 33°. At higher 2θ (around 48°), the inventors observed a slight shift and broadening in the spectrum. This behavior was related to the increase of Si or $O_2$ concentrations.

Figure 7A:
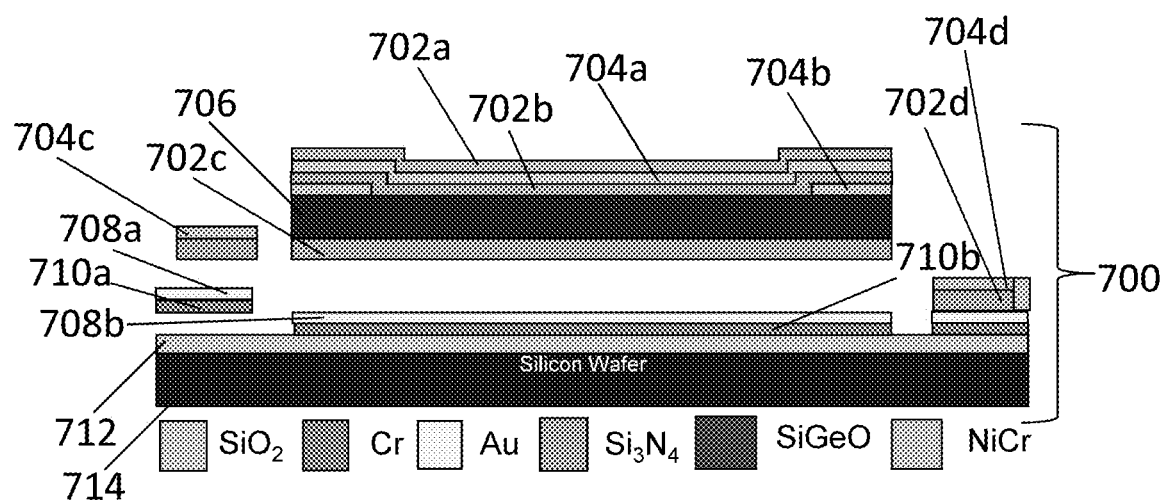
FIG. 7A shows a schematic of a fabricated microbolometer with a pixel area of 25×25 µm².
Figure 7B:
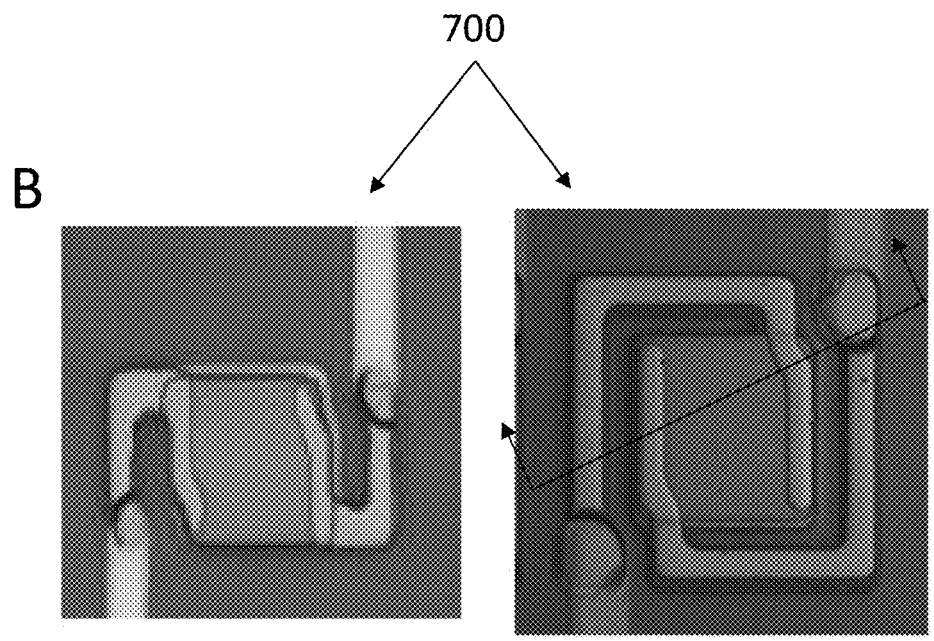
FIG. 7B shows optical images of the fabricated microbolometer according to FIG. 7A with a pixel area of 25×25 µm².
Figure 7C:
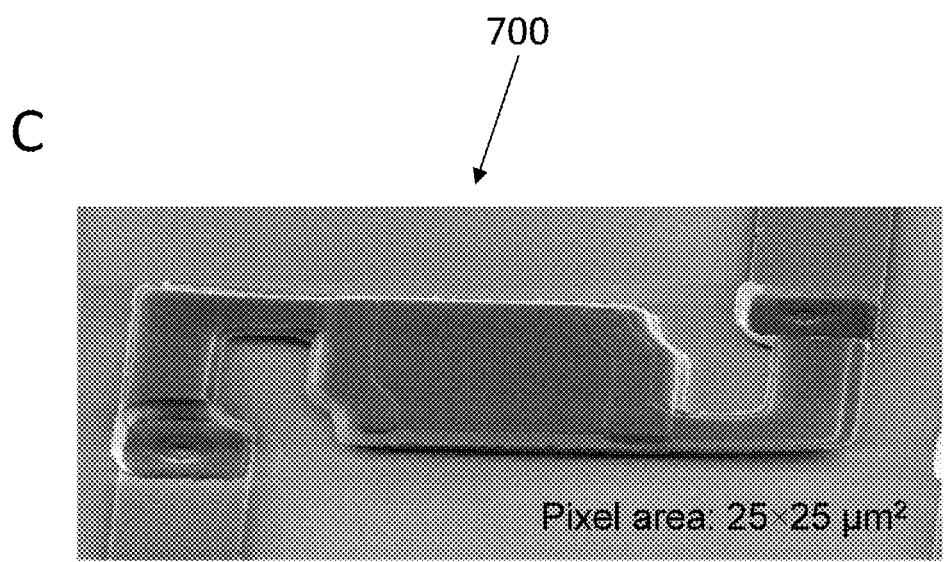
FIG. 7C shows a scanning electron microscope (SEM) image of the fabricated microbolometer according to FIG. 7A with a pixel area of 25×25 m².
Figure 7D:
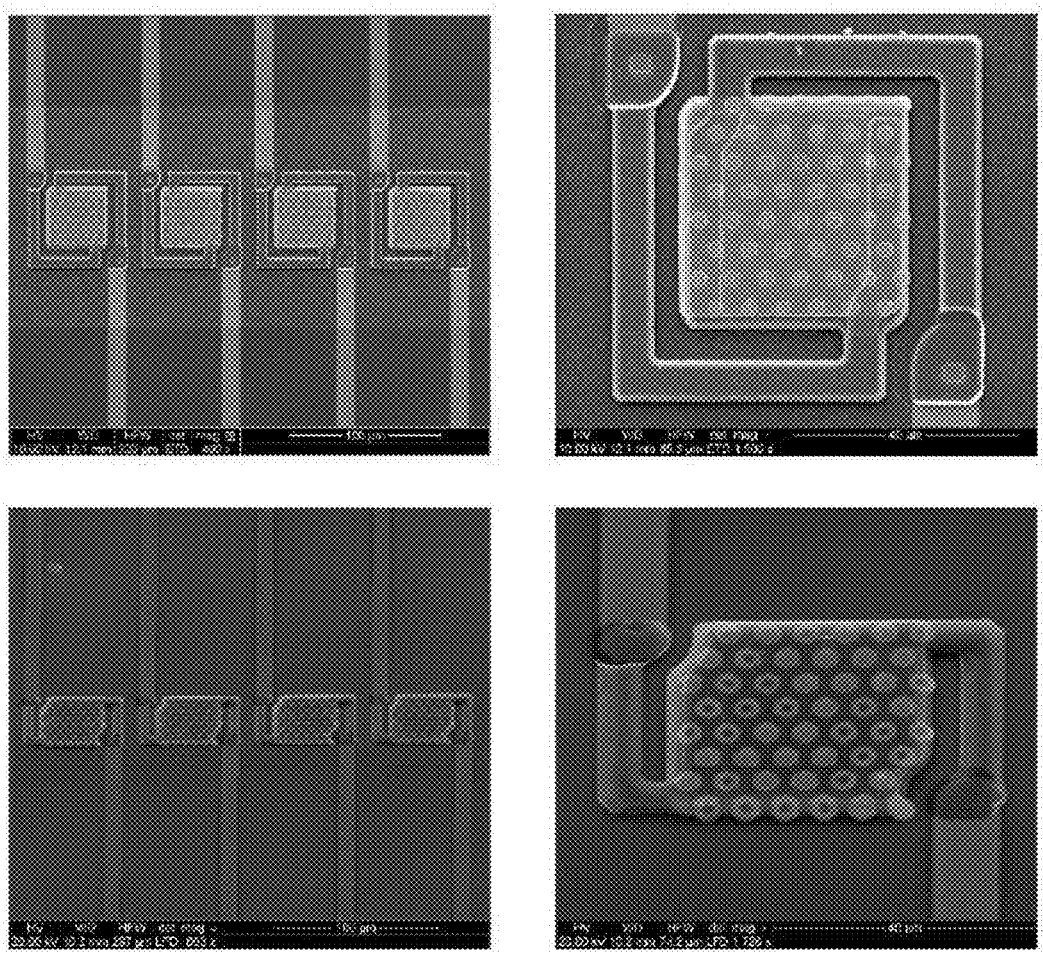
FIG. 7D shows additional SEM images of fabricated microbolometers with a pixel area of 25×25 µm².

FIGS. 7A to 7C show an example of additional fabricated microbolometers 700. The microbolometers were fabricated with a pixel area of 25×25 µm$^2$ and 40×40 m$^2$ using, for example, an $Si_{0.041}Ge_{0.868}O_{0.091}$ composition which provides TCR and resistivity of 3.64%/K and $5.564 \times 10^2$ Ω cm, respectively. FIG. 7A shows a schematic of certain layers of a fabricated microbolometer 700 with a pixel area of 25×25 µm$^2$, including Si$_3$N$_4$ layers and elements 702a, 702b, 702c and 702d, NiCr layers and elements 704a, 704b, 704c and 704d, SiGeO layer 706, Au layers and elements 708a and 708b, Cr layers and elements 710a and 710b, SiO$_2$ layer 712, and silicon wafer layer 714. FIG. 7B shows optical images of the fabricated microbolometer 700, whereas FIG. 7C shows an SEM of the fabricated microbolometer 700. For example, the device was suspended above an Si substrate by a Si$_3$N$_4$ bridge (300 nm). Encapsulated in the center of the bridge is a thin layer of Si—Ge—O (300 nm) and thin NiCr (5 nm) absorber. Both layers were passivated with two layers of Si$_3$N$_4$ (50 nm). Another layer of NiCr (50 nm) was deposited and patterned to produce the electrical ohmic contact with Si—Ge—O film, and the conductive leg. The devices were fabricated by growing the thin film layers on a polyimide sacrificial layer. Subsequent etching of the sacrificial layer provided the air gap (2 µm) that thermally isolates the microbolometer. FIG. 7D shows additional SEM images of fabricated microbolometers with a pixel area of 25×25 µm$^2$.

Figures 8A, 8B:
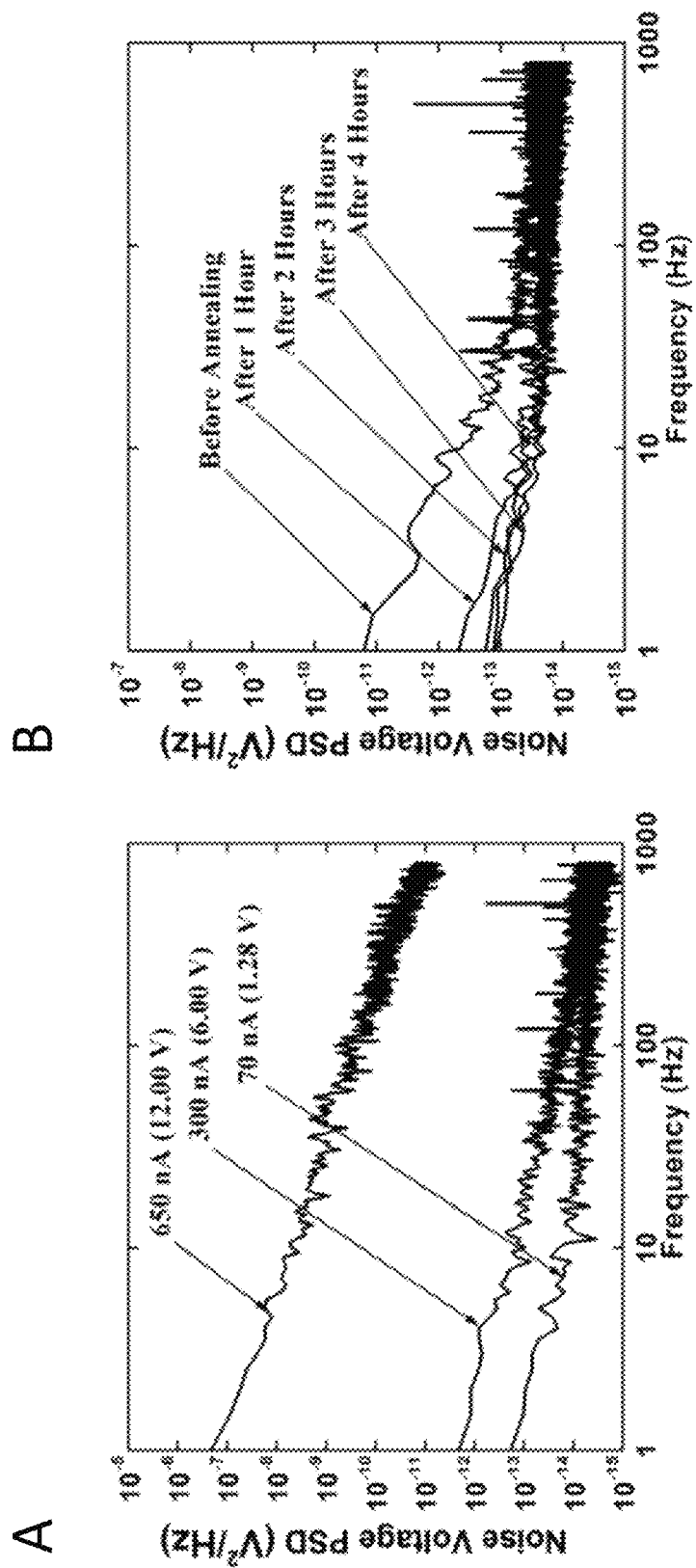
FIG. 8A shows noise voltage PSD of devices with $Si_{0.0527}Ge_{0.8748}O_{0.725}$ composition biased with various currents before annealing.
FIG. 8B shows noise voltage PSD of devices with $Si_{0.0343}Ge_{0.8987}O_{0.067}$ composition biased with 80 nA at different annealing times.

The noise voltage power spectral density (PSD) of amorphous Si—Ge—O microbolometer was optimized and reduced by annealing the devices in vacuum at temperature of 200, 250 or 300° C. from 1 to 6 hour intervals. The noise measurements were performed on devices without air gaps in order to speed up fabrication of many devices with various Si—Ge—O compositions. Many devices from four wafers with different compositions of Si—Ge—O were measured before and after annealing at different bias currents. The noise measurements were performed in air inside a shielding room. Each device was biased using battery connected in series with 1 MΩ metal resistor, and with the device. The applied currents were between 0.08-0.65 IA. FIG. 8A shows, for example, the noise voltage PSD of $Si_{0.0527}Ge_{0.8748}O_{0.0725}$ before annealing, and demonstrates that the noise increases as the biasing current increases in all devices. The lowest noise voltage PSD was $1 \times 10^{14}$ V$^2$/Hz at the corner frequency 12 Hz, and the 1/f noise coefficient ($K_f$) was $1.18 \times 10^{-13}$. The same device and other devices from the same wafer were annealed at 200, 250 or 300° C. from 1 hr to 6 hrs. The results show that annealing did not help reducing the noise voltage in this particular composition. However, the results from other devices with different Si—Ge—O compositions were different. For example, FIG. 8B shows the voltage noise PSD for a device with $Si_{0.0343}Ge_{0.8987}O_{0.067}$ composition before and after annealing at 300° C. for 1 hr to 4 hrs. The results show that as the annealing time increase, the voltage noise decreases. At 4 hrs of annealing the device achieved the lowest measured voltage noise of $2 \times 10^{14}$ V$^2$/Hz at 10 Hz. After 4 hrs of annealing, the noise starts to increase again. The measured noise level and corner frequency were similar to the device in FIG. 8B. The Hooge's parameter (y) was 0.8 (close to 1). This indicates that 1/f noise is the main contributing source. The 1/f-noise coefficients (K) was decreased from $2.74 \times 10^{-13}$ to $1.36 \times 10^{-14}$ for devices with $Si_{0.041}Ge_{0.868}O_{0.091}$ at 4 hours of annealing. Then, it started to increase again at higher time interval. This increase is attributed to the reduction in 1/f-noise and the increase of Hooge's parameter (β) which is equal 2.33 (close to 2) with increasing annealing time interval. The voltage noise optimization by annealing the devices in vacuum and in a forming gas environment using rapid thermal annealing system is still in progress.

Figures 9A, 9B:
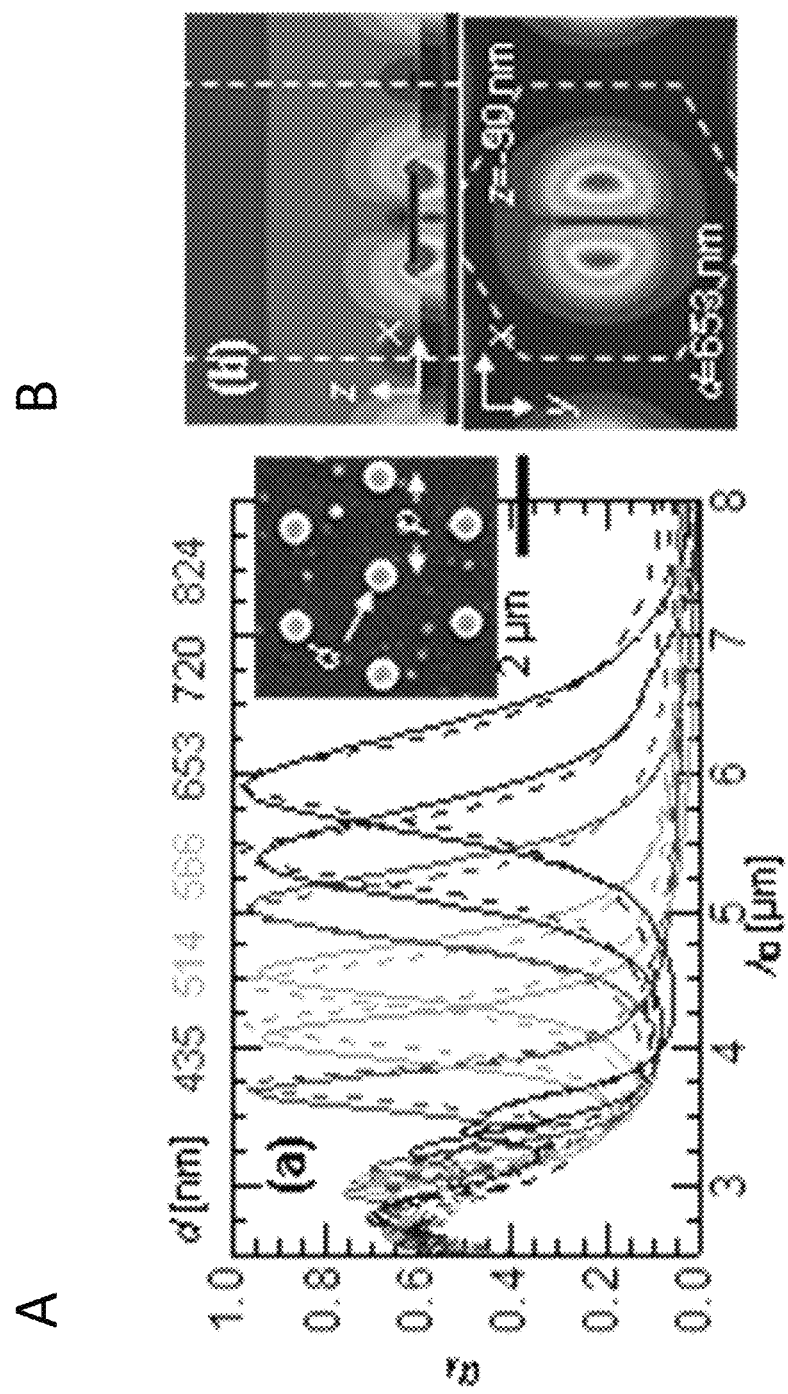
FIG. 9A shows an example of perfect absorbing mid-wavelength infrared (MWIR) metasurfaces (measured Fourier transform infrared spectroscopy (FTIR) absorptance for different diameter disk arrays (solid) compared to high frequency structure simulator (HFSS) simulation (dashed), and the inset shows an SEM image of the metasurface).
FIG. 9B shows an example of perfect absorbing MWIR metasurfaces (simulated electric field surrounding the metasurfaces at resonance).

With respect to metasurface design, fabrication and characterization, and with reference to FIGS. 9A and 9B, metasurfaces can be used to control the way a structure interacts with radiation. Originally developed at microwave wavelengths they can be scaled down to IR frequencies using micro/nanofabrication to realize the reduced feature sizes. A large library of elements have been investigated for applications such as filters, reflect arrays and waveplates, selective absorbers, selective thermal emitters, and angular-sensitive absorbers. An FSS consists of a periodic array of sub-wavelength antenna elements. At IR wavelengths, the lower conductivity of metals make the metasurfaces an excellent absorbers (converting EM energy to thermal energy). They have been used to engineer a surface to selectively absorb radiation. This selectivity can be with respect to (a) wavelength, (b) polarization, and/or (c) AOI. It is worth noting that the absorption of a properly designed metasurface can approach unity when it is illuminated with radiation with the intended characteristics. FIGS. 9A and 9B show an example of a metasurface designed for unity absorption in the MWIR. This FSS consists of an Al ground plane separated from an Al disk array by a 200 nm thick layer of Si. It was fabricated using microsphere photolithography (e-beam lithography would be another option). Similar metasurfaces designed for the long-wavelength infrared (LWIR) have feature sizes larger than 1 μm which can be processed using standard lithography. The FSS in FIGS. 9A and 9B consists of disk arrays on a hexagonal close packed periodic lattice. Prior to fabrication this FSS was simulated using HFSS (e.g., ANSYS HFSS) to predict the far-field absorptance and the near-field electric field distribution which were subsequently measured with FTIR and near-field scanning microscopy showing excellent agreement, solid and dashed lines, respectively. The HFSS software has been widely used at microwave frequencies, but has recently been applied to IR as well as THz and optical wavelengths. The HFSS software is used to simulate and analyze the microbolometer performance. A key advantage of the software is the ability to incorporate frequency dependent optical properties, which proves to be essential for modeling devices at IR frequencies. This bypasses the need to extract fitted Debye coefficient in a time-domain simulation. These properties can be obtained from literature or measured directly for the films produced in the laboratory using spectroscopic ellipsometery.

Figures 10A, 10B:
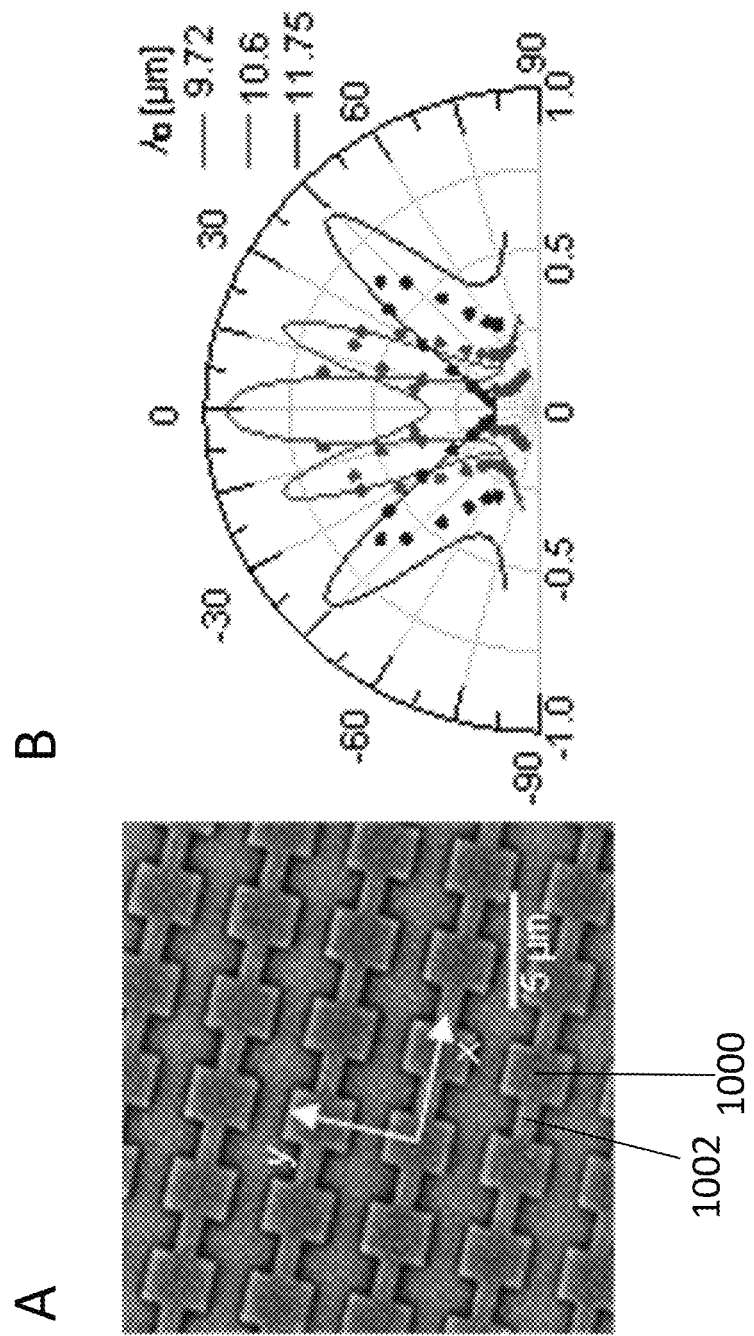
FIG. 10A shows an example of a directional metasurface (SEM image).
FIG. 10B shows an example of a directional metasurface (directionally resolved absorptivity).

FIGS. 10A and 10B show an example of a metasurface designed to achieve an angularly sensitive response. This metasurface involves a periodic array of discrete linear elements (patch elements) 1000. However, a microstrip 1002 between patches 1000 permits inference between adjacent patches when the incident radiation is transverse magnetic (TM) polarized. The full width half maximum (FWHM) beam-width of this metasurface was measured to be 12°. Simulations with HFSS again proved to be very predictive of experimental measurements with a FTIR based hemispherical directional reflectometer.

Figures 11A, 11B:
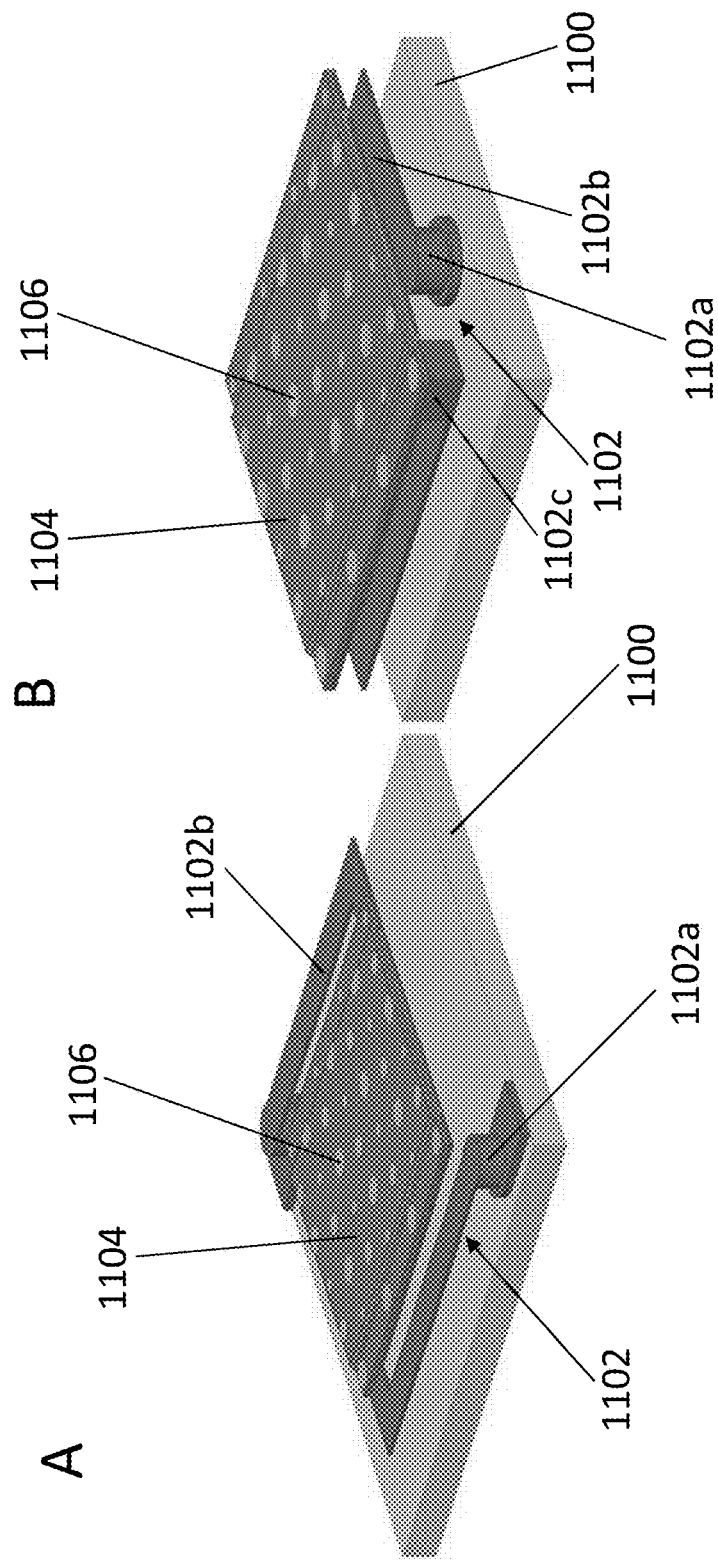
FIG. 11A shows a 3-D rendering of metasurface/microbolometer geometry with support on the side.
FIG. 11B shows a 3-D rendering of metasurface/microbolometer geometry with support underneath the pixel.

With respect to microbolometer structural design, an embodiment of a metasurface integrated microbolometer architecture is again shown in FIGS. 11A and 11B. FIG. 11A shows a 3-D rendering view of metasurface/microbolometer geometry with substrate 1100 and support 1102, support 1102 including anchors 1102a and arms 1102b on the side of the metasurface integrated layer 1104, which includes metasurface elements 1106. In one preferred embodiment as shown in FIG. 11B, the support structure 1102 is positioned under a cavity (e.g., as opposed to being on the side of the layer 1104 as in FIG. 11A). In addition to anchors 1102a and arms 1102b, FIG. 11B includes contact blocks 1102c. The metal patterns 1106 in FIG. 11A and FIG. 11B govern the absorption of incident radiation which eliminates the need for a Fabry-Perot cavity or umbrella superstructure. This allows the support structure (e.g., 1102) to be designed to optimize the thermal isolation of the microbolometer and to facilitate measuring the resistance of the microbolometer without regard for disrupting the resonant cavity. In FIG. 11B, the support structure 1102 is positioned under the cavity, increasing the fill factor to over 90%. Power absorbed by the metasurface is conducted to a high TCR amorphous $Si_xGe_yO_{1-x-y}$ layer. This material has excellent mechanical and electrical properties at room temperature. Si and Ge based compounds are standard materials in silicon integrated circuits providing a wide range of established knowledge for application to the fabrication of the microbolometer array. The electrical resistivity and TCR of $Si_xGe_yO_{1-x-y}$ primarily depend upon the oxygen content in the film, which is controlled during sputter deposition. The inventors identified various compositions with high TCRs, and with corresponding resistivity below 1 kΩ·cm. This resistivity value is compatible with conventional readout integrated circuitry of the microbolometer FPA. It also is compatible with CMOS technology due to the low deposition temperature and the use of conventional dry-etch processing. Therefore, the FPA can be easily integrated with the readout electronics.

As discussed above, and further with reference to FIGS. 12A and 12B, a metasurface, also known as an FSS, is a periodic array of sub-wavelength antenna elements (see, e.g., 1200 in FIG. 12A and 1202 in FIG. 12B). At IR frequencies, the lower conductivity of metals make the metasurfaces an excellent absorber (converting EM energy to thermal energy). This absorption is highly dependent on the metasurface geometry and can be engineered for selectivity with respect to wavelength, polarization, and angle of incidence. EM energy with the correct characteristics is converted to heat, while other energy is reflected or transmitted away from the device. Metasurfaces can be coupled to a microbolometer platform, enabling a FPA to resolve these parameters. For example, one pixel can respond to horizontal polarized radiation while the adjacent pixels are sensitive to vertical polarized radiation and circular polarized polarization. Similarly, different microbolometers with different wavelength sensitivity permit the determination of the temperature of objects to be resolved without a-priori knowledge of the objects emittance. It is also advantageous for discriminating between radiation sources/defeating camouflage. To test the proposed design, the inventors fabricated a 2×2 microbolometer array. Each pixel can be designed with different spectral window, e.g., 8-9 µm, 9-10 µm, 10-14 µm, and 12-14 µm.

Figures 12A, 12B, 12C:
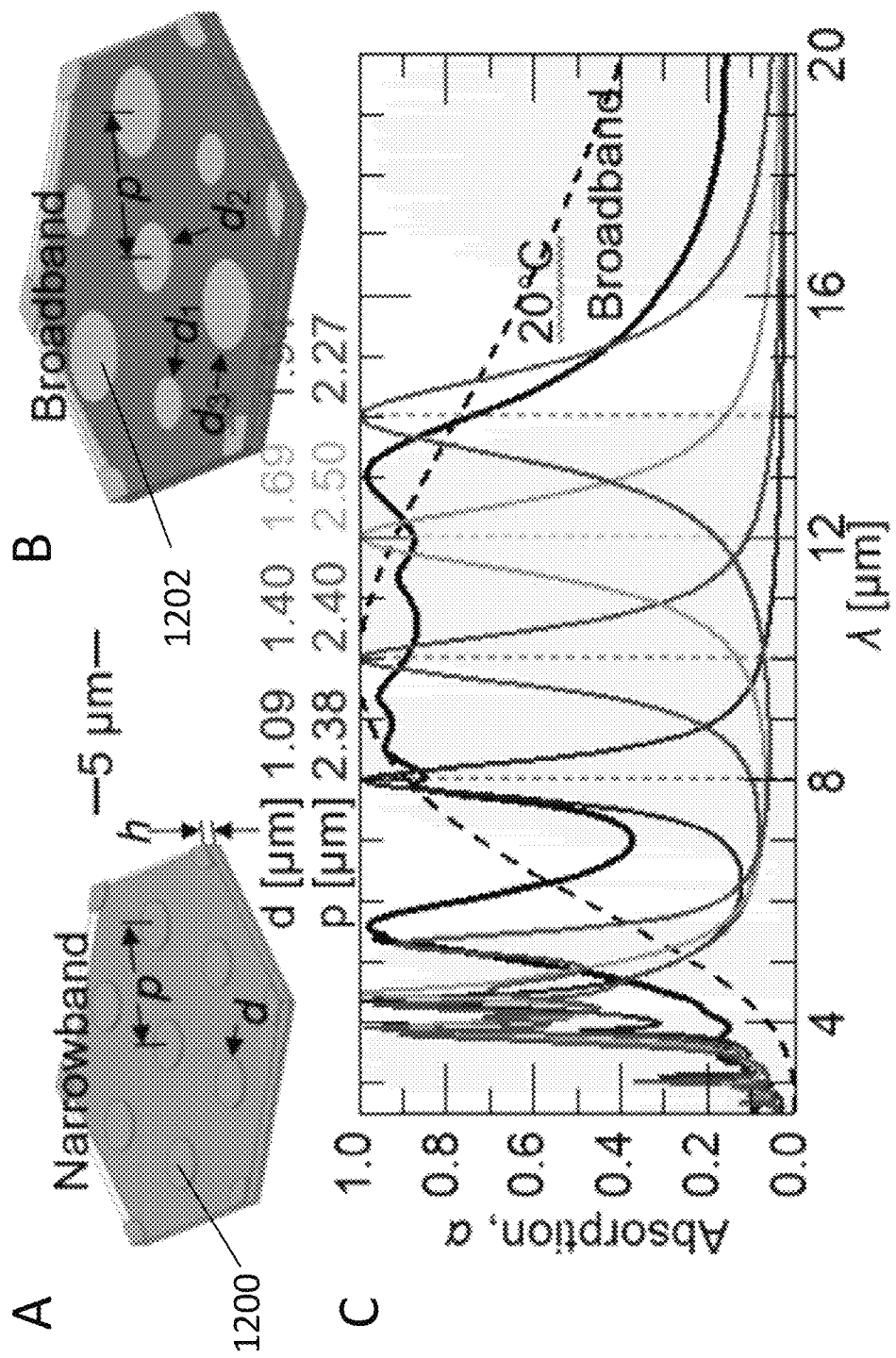
FIG. 12A shows metasurface absorbers narrowband design with uniform Au disks on h=200 nm Si standoff.
FIG. 12B shows metasurface absorbers broadband design with Al disks separated from Ti ground plane by an h=200 nm Si standoff.
FIG. 12C shows metasurface absorbers simulated absorptivity for different narrowband designs optimized for perfect absorption at 8-14 µm and broadband absorption.

An example of such a metasurface is shown in aforementioned FIGS. 12A and 12B. It consists of a hexagonal close-packed array of circular metallic disks (e.g., 1200 and 1202) separated from a metallic ground plane by a layer of Si. FIG. 12A shows tuning a uniform disk array (diameter (d) and periodicity (p)) to achieve unity narrowband absorptance at different wavelengths. The thickness of the Si film for all designs is 200 nm. The disk geometry is attractive because it can be patterned using conventional lithography with features (>1 µm) as opposed to electron beam lithography (EBL) or focused ion beam (FIB). For narrowband designs it is beneficial to achieve high reflectivity out of band which can be accomplished using highly reflective metals such as gold. To maximize broadband absorption, the inventors combined metasurfaces with different resonances and use lossier metals (e.g., Al/Ti instead of Au). This is illustrated in FIG. 12B, showing another simple metasurface geometry tuned to provide average absorptance >95% over the 8-14 µm window. For the broadband design, three different disk diameters ($d_1$=1.52, $d_2$=2.04, and $d_3$=2.62 m) are tessellated over the array. In this design, the silicon layer ($h_1$=200 nm) is separated from the Ti ground plane by thin $SiO_2$ and $Si_3N_4$ layers. FIG. 12C represents simulated absorptivity for different narrowband designs, optimized for perfect absorption at 8-14 µm and broadband absorption.

When the metasurface is exposed to incident EM energy, a current is excited. This generates a surface inductance and capacitance which can be tuned to select the resonant wavelength. The metasurface presents the incident wave with an effective impedance that can be adjusted to match free-space. At IR wavelengths the intrinsic ohmic losses in metals are large leading to energy at resonance being dissipated thermally. Perfect (unity) absorption occurs when the disks are resonant and are impedance matched to the incident wave. Despite the simplicity of the metasurface geometry, the spectral response can be designed to span the IR. This is determined by the geometrical parameters as well as the material selection. Si was chosen for material compatibility with the rest of the microbolometer fabrication. The absorbed energy in the microbolometer is determined by measuring the change in temperature. In one configuration shown in FIG. 13A, the sensing layer 1300 is placed below the metasurface 1302, while in a second preferred configuration shown in FIG. 13B, the sensing layer 1300 is sandwiched between a metallic plate 1304 and the metasurface 1302 (wherein a dielectric layer 1306 is also present). When incident radiation 1308 is absorbed by the metasurface 1302, the metasurface 1302 is heated and this energy is conducted to the sensing layer 1300.

Figures 13A, 13B:
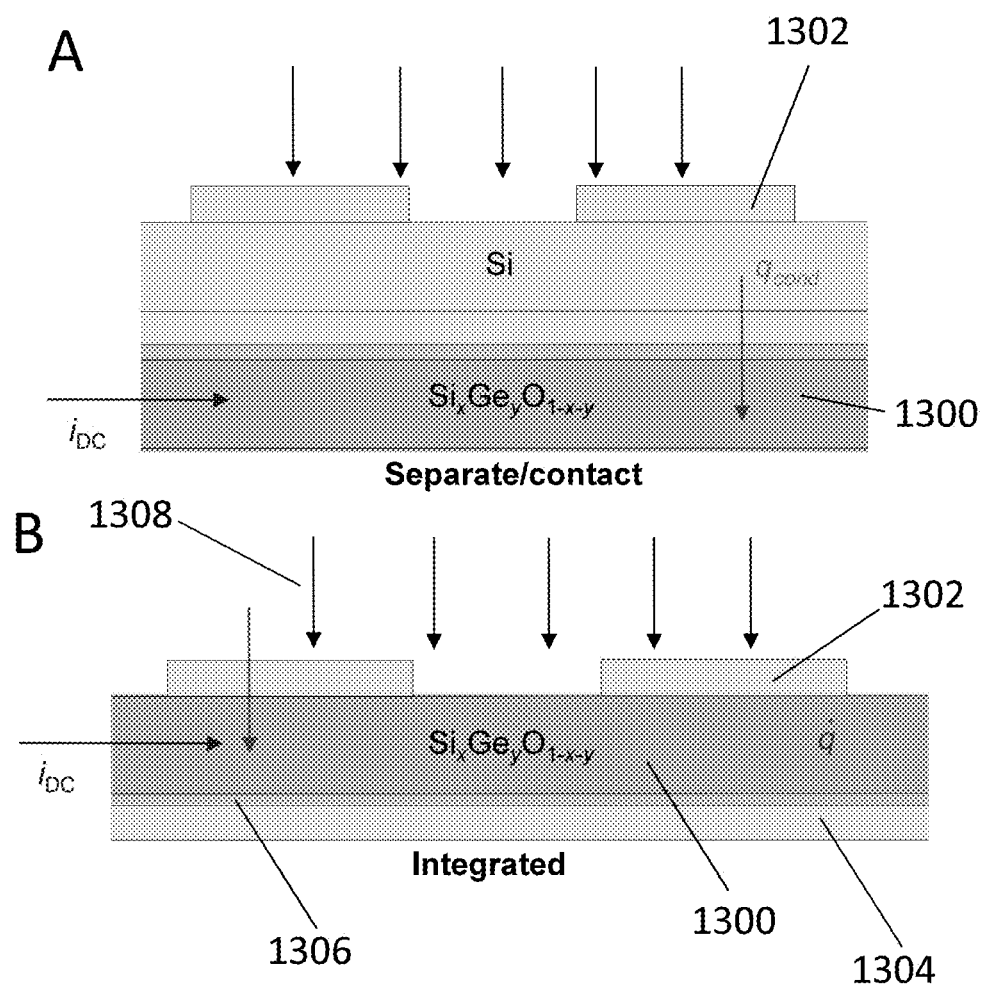
FIG. 13A shows a fabrication with a sensing layer below a metasurface (the sensing layer is separated from a ground plane by a dielectric).
FIG. 13B shows a fabrication with a sensing layer integrated into a metasurface (the sensing layer is separated from a ground plane by a dielectric).

In the design of FIG. 13A, the microbolometer consists of a thin $Si_3N_4$ bridge suspended above a silicon substrate. Two narrow metallic arms of $Si_3N_4$ and Ti support the bridge, and serve as support structures, conductive legs, and thermal isolation legs. Encapsulated in the center of the $Si_3N_4$ bridge is a thin layer of Si—Ge—O IR sensitive material. This layer is insulated by another $Si_3N_4$ thin film. Atop the $Si_3N_4$ layer is an Au/Al ground plane of the metasurface, a low loss Si/Ge thin film for the standoff (200-400 nm thick), and the patterned Au metasurface (see, e.g., the patterned metasurfaces shown in FIGS. 11A and 11B). In this configuration heat is transferred via conduction, and the incident radiation is resolved by measuring the change in resistance of the $Si_xGe_yO_{1-x-y}$ layer. This approach is versatile because the sensing layer can be optimized for its TCR/noise characteristics independent of its infrared absorption.

However, the inventors have determined that a better option is to integrate the sensing layer 1300 directly into the microbolometer as shown in FIG. 13B. In this case, the $Si_xGe_yO_{1-x-y}$ layer needs to be electrically isolated from the ground plane using an insulating layer (e.g., $Si_3N_4$ or $SiO_2$ as shown at 1306 in FIG. 13B). This has the advantage of significantly lowering the microbolometer thermal mass. Conveniently, both $Si_3N_4$ and $SiO_2$ have phonon modes in the 8-14 µm band and lower indices of refraction which increases the resonator size. The metasurface can be designed to couple to these modes, providing additional degrees of design freedom. The goal becomes minimizing the thermal mass on a per area basis of the pixel which can be calculated for a given metasurface unit cell. This helps to determine the noise of the microbolometer. The thermal resistance of the support structure can then be optimized to adjust the time-constant/sensitivity.

Figure 14:
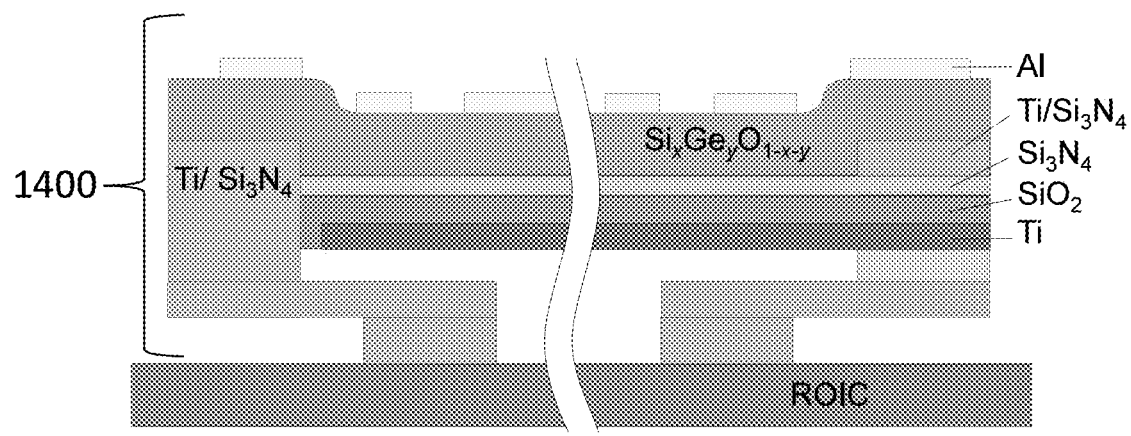
FIG. 14 shows an integrated pixel showing a support structure and isolation of the ground plane.

FIG. 14, for example, shows an integrated pixel 1400 with layers similar to those discussed above in other embodiments, and shows a support structure and isolation of the ground plane, as well as a readout integrated circuit (ROIC).

Figure 15:
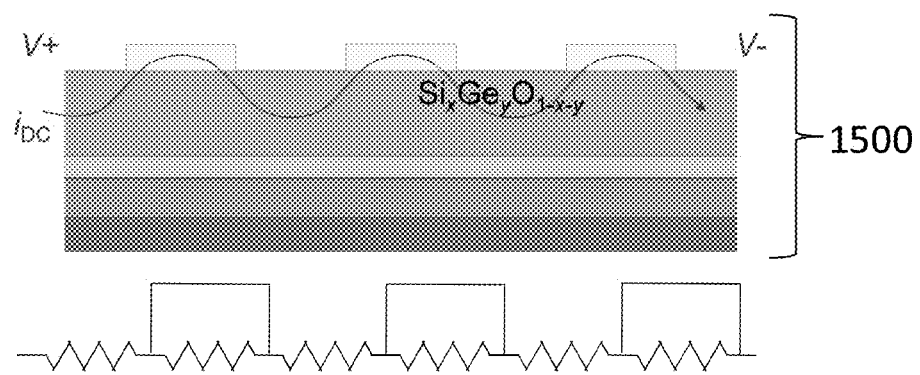
FIG. 15 shows current flow through a $Si_xGe_yO_{1-x-y}$/metasurface layer.

The metasurface geometry also affects the microbolometer electrical resistance. Because the metal patterns of the metasurface are in contact with the $Si_xGe_yO_{1-x-y}$, the total resistance is lowered while the TCR values stay unchanged (i.e., the same). In addition, and with reference to FIG. 15, depending on the metal, there is a difference conduction band edge of the metal and the valence band edge in the semiconductor. As with the thermal mass, the TCR and resistance becomes dependent on the metasurface geometry. Because of the much lower resistance of the metal, it is modeled as a Schottky contact with a short (e.g., exploring whether a Schottky junction forms where the barrier height is dependent on the selection of the Si/Ge ratio, and introduces an additional temperature dependent component for the path dependent resistance of the microbolometer 1500 (see FIG. 15)).

Figure 16A:
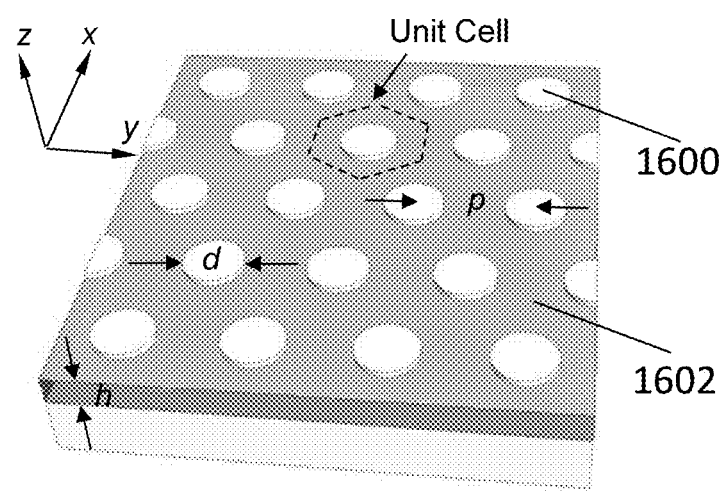
FIG. 16A shows metasurface perfect absorber geometry.
Figure 16B:
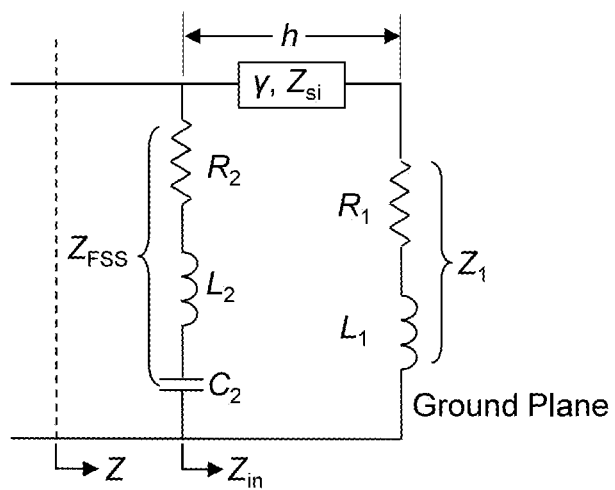
FIG. 16B shows an equivalent circuit model of FIG. 16A.

With respect to electromagnetic design, the geometry of a simple metasurface consisting of a hexagonal close packed array of disks separated from a ground plane by a semiconductor (Si—Ge—O) is shown in FIGS. 16A and 16B. This geometry is defined by three parameters: the diameter d of the disks 1600; the periodicity p; and the thickness h of the semiconductor 1602. The response of the metasurface can be captured using the equivalent circuit shown in FIG. 16B. The RLC elements in the equivalent circuit in FIG. 16B can be determined from rigorous full-wave modeling.

Figures 17A, 17B:
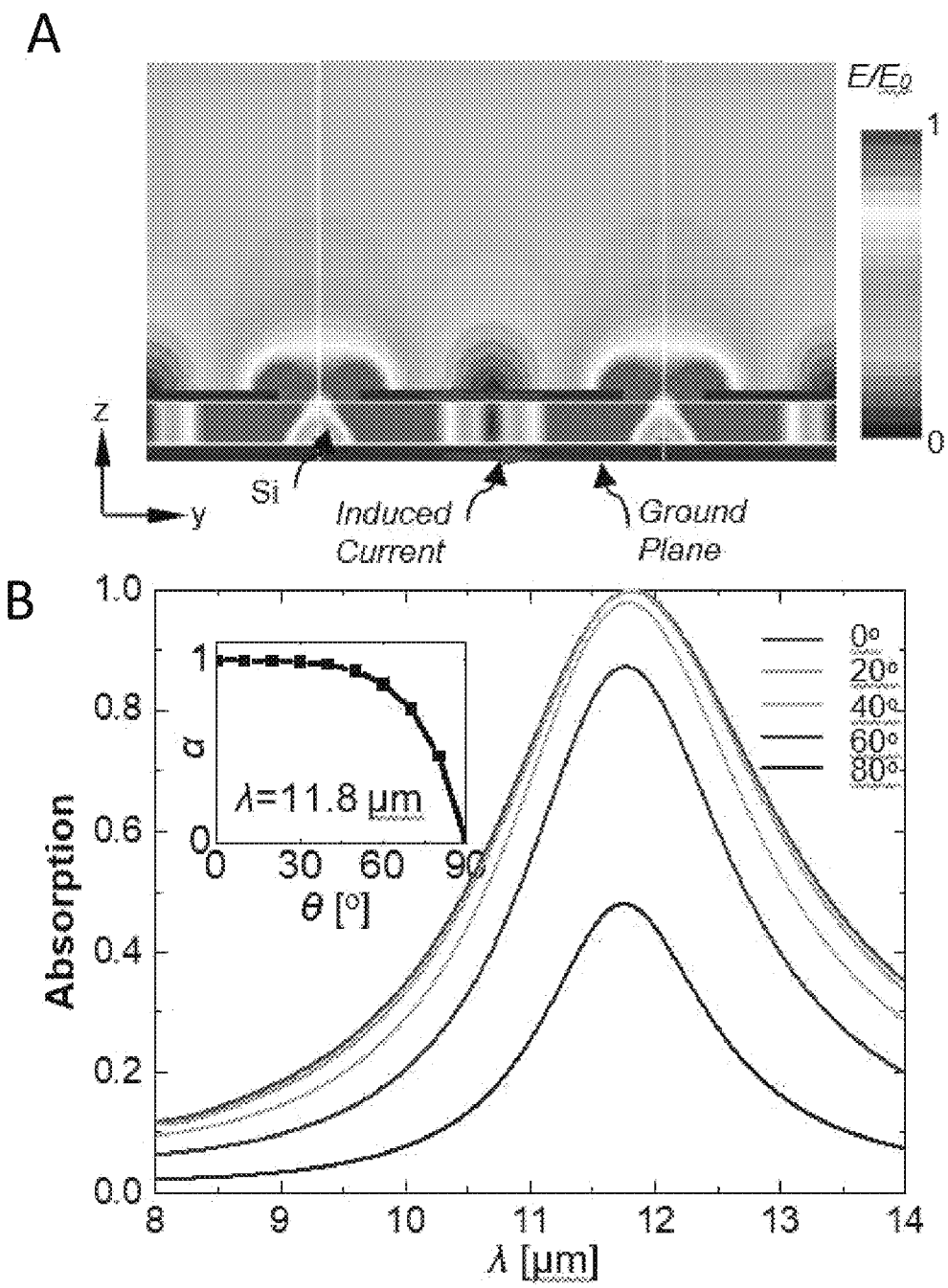
FIG. 17A shows electric-field concentration surrounding the metasurface of FIG. 16A.
FIG. 17B shows absorption as a function of wavelength and AOI with respect to FIG. 17A.
Figures 18A, 18B:
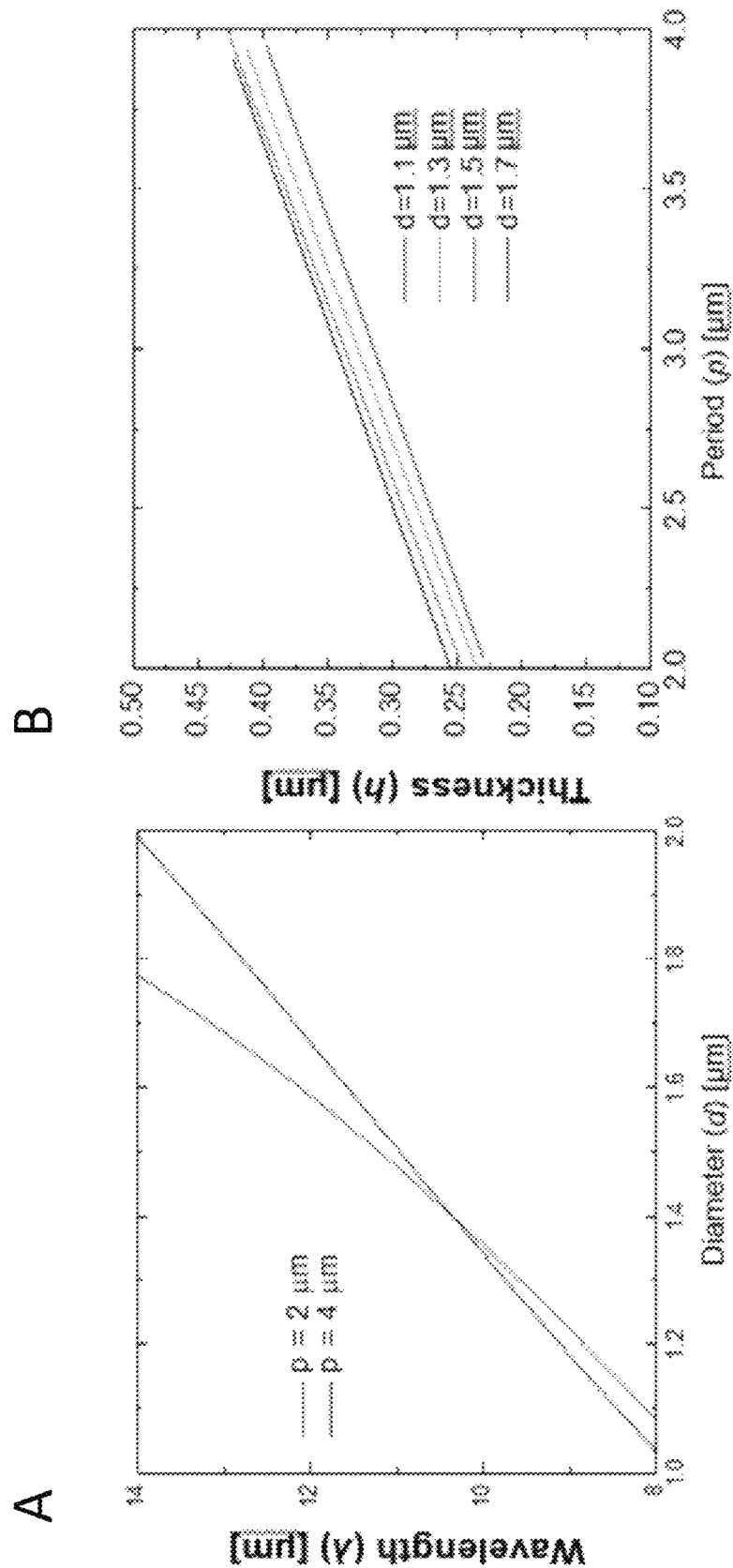
FIG. 18A shows resonance wavelength value by variation of diameter (d) for different period (h) value with respect to FIG. 16A.
FIG. 18B shows resonance wavelength value by variation of gap size (p-d) for different diameter (d) value with respect to FIG. 16A.

FIGS. 17A and 17B show the EM response of this metasurface. It was optimized to have unity absorptance (zero reflectance at λ=12 μm). After fitting the equivalent circuit precisely to HFSS (<1% error across the 8-14 μm band) it is possible to rapidly synthesize this geometry for unity absorptance at any wavelength. For this geometry, the resonant wavelength scales with the diameter of the disks, while the optimal semiconductor thickness scales with the periodicity and is nearly independent of the disk diameter. These relationships are plotted in FIGS. 18A and 18B. It is worth noting that a single dielectric thickness can be used to span resonances across the LWIR window, only changing the disk diameter and periodicity. This significantly simplifies fabrication by allowing multiple metasurface designs to share a single dielectric stack.

Figure 18C:
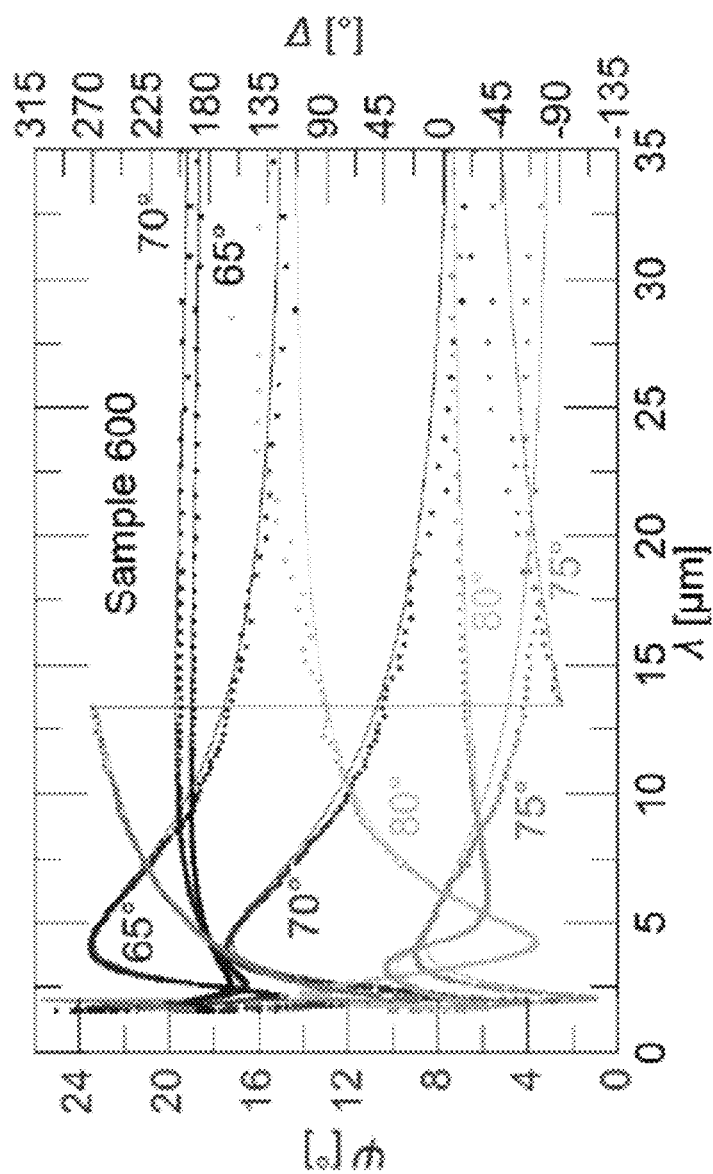
FIG. 18C shows an example of fitted and measured ellipsometric coefficients for incident angles of 65°, 70°, 75° and 80° for a film with composition $Si_{0.032}Ge_{0.908}O_{0.060}$.

This approach can be applied to more complicated geometries including a compound insulator/semiconductor substrate. In addition to the relationships presented in FIGS. 18A and 18B, the dielectric constant of the substrate significantly affects the design. Generally, the higher the index of refraction, the thicker the semiconductor height must be to impedance match to free-space. The feature sizes also increase. For example, with respect to index of refraction, FIG. 18C shows an example of fitted and measured ellipsometric coefficients for incident angles of 65°, 70°, 75° and 80° for a film with composition $Si_{0.032}Ge_{0.908}O_{0.060}$. In order for the microbolometer to function without shorting-out through the ground plane, a dielectric must electrically isolate the semiconductor. This is advantageous for the metasurface performance because realistic material choices such as silica or nitride have lower dielectric constants (increasing feature size which simplifies manufacturing and decreasing the overall thickness which lowers the time constant of the pixel). Total absorber thicknesses of less than 150 nm can be achieved with careful design. Because of this dependency, the metasurface must be co-optimized with the material selection. Adjusting the stoichiometry and anneal state of the semiconductor changes the index of refraction and optical absorption. These material constraints also affect the noise performance of the device.

Figures 19A, 19B:
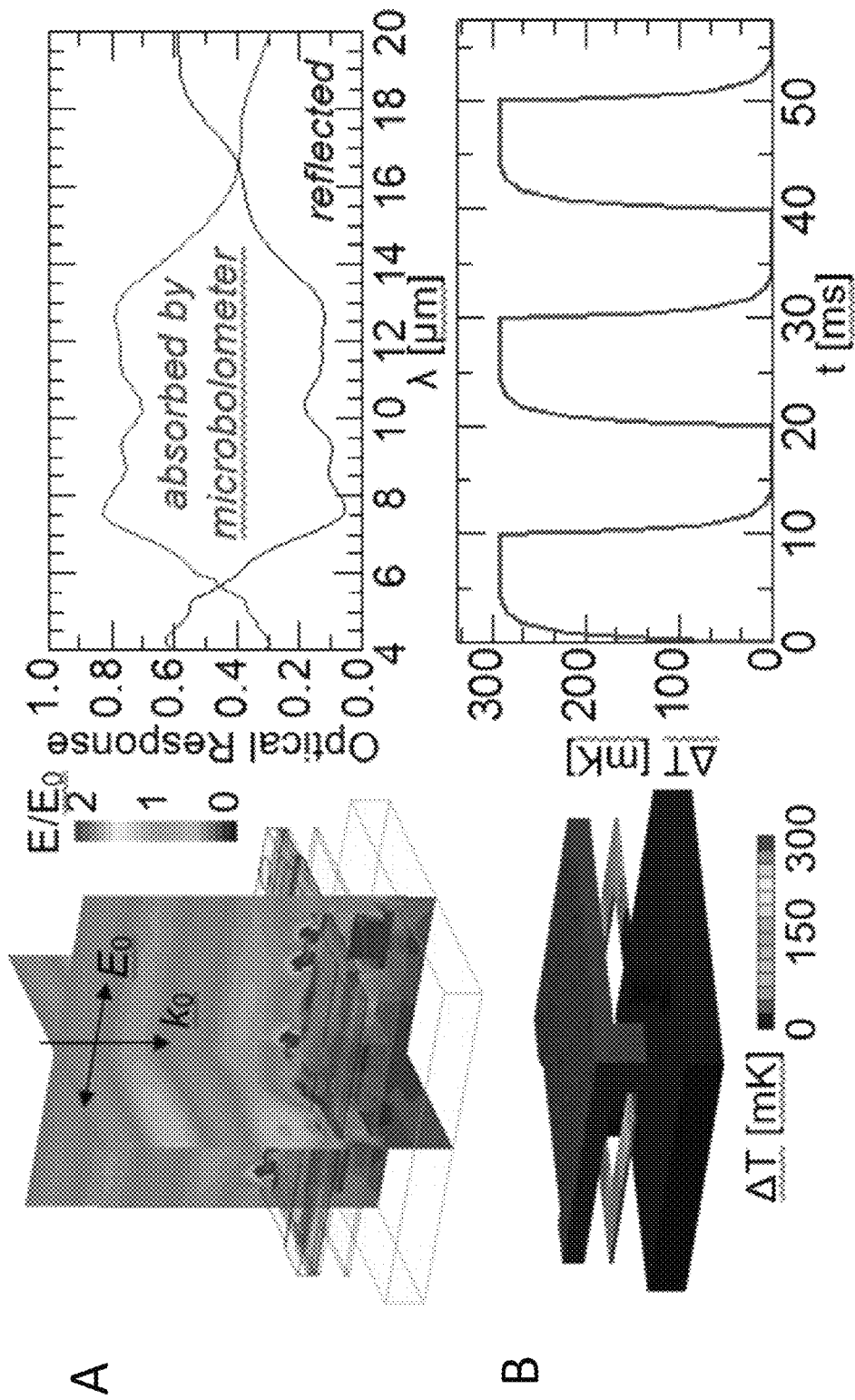
FIG. 19A shows coupled EM/thermal analysis of entire 16×16 m$^2$ pixel (full-wave 3D EM model).
FIG. 19B shows coupled EM/thermal analysis of entire 16×16 μm$^2$ pixel (thermal model under 100 Hz, chopped $\lambda$=11 μm, 1000 W/m$^2$ illumination).

With respect to coupled electromagnetic/thermal modeling, full EM modeling of the entire microbolometer becomes increasingly important as the pixel size falls to the same order as the wavelength of radiation. In this regime, resonances other than the metasurface affect its performance including the effects of the feed structure and coupling between adjacent pixels. The EM solution generated by HFSS can then be used to calculate the specific energy dissipation throughout the structure. This serves as a heat-source for transient thermal models in ANSYS. The coupled model can then be used to predict the performance of the microbolometer, such as sensitivity and thermal time constant. FIGS. 19A and 19B show the full-wave coupled HFSS/ANSYS results for a 16×16 μm² microbolometer. The simulation predicts the temperature rise in the microbolometers as a function of time when it is illuminated with 100 Hz chopped 11 μm radiation. These simulations predict that even for smaller pixels the results approach the infinite solution shown in FIGS. 19A and 19B.

With reference back to FIG. 3, the inventors studied 300 nm thick $Si_xGe_yO_{1-x-y}$ thin films deposited on oxidized substrates. The film thickness was reduced to between 50 to 60 nm to minimize the thermal mass and accommodate pixel sizes down to 16×16 μm² although smaller sizes are contemplated. The metasurface was patterned using standard contact photolithography, on top of the $Si_xGe_yO_{1-x-y}$ with multiple disc diameter and periodicity. The $Si_xGe_yO_{1-x-y}$ films are grown by RF magnetron sputtering onto $Si_3N_4$ thin films by co-depositing Si and Ge thin films simultaneously from two deposition targets in an oxygen/argon environment. The depositions were performed on an Si substrate, and Si substrate coated with $Si_3N_4$ thin films (e.g., 100-200 nm) at room temperature. The chamber pressure was maintained at low pressure, e.g., 4 mTorr. The elemental concentrations of Si and Ge was varied by adjusting RF power applied to the silicon and germanium targets and by varying the oxygen flow rate in the deposition chamber. This allows the stoichiometry of the films to be continuously adjusted.

The inventors determined (1) the effect of oxygen on the TCR, resistivity, refractive index refractive index as a function of wavelength (8-14 μm), and voltage noise of $Si_xGe_yO_{1-x-y}$ films as a function of Si concentration, for an oxygen concentration below 10% with and without the metasurface. (2) the effect of Si on TCR, resistivity, refractive index, and voltage noise of $Si_xGe_yO_{1-x-y}$ as a function of oxygen concentration, for various Si concentration up to 25% with and without the metasurface. These measurements allow determining film composition(s) with high temperature TCR, a low corresponding resistivity below 1.0 kΩ-cm which is acceptable for the readout electronics, and acceptable low voltage noise level; and (3) the effect of the metasurface disc diameter and periodicity on resistivity, TCR, refractive index, and voltage noise. The presence of the metal metasurface elements significantly affects the tradeoff between resistivity and TCR allowing to obtain a film with high TCR and lower resistivity values than that of films without the metasurface. The goal is to attain the optimized compositions that have higher TCR (above 4%/K), lower corresponding resistivity (<1 kΩ-cm for conventional ROIC compatibility) and lower voltage noise than extensively studied GeSi compositions, It is noted that without a metasurface, as TCR increases, the resistivity increases too, making the film too resistive. The addition of a metasurface on the $Si_xGe_yO_{1-x-y}$ films allows obtaining high TCR at lower resistivity values.

The deposited $Si_xGe_yO_{1-x-y}$ film was studied with and without metasurface using XRD, Raman spectroscopy, and (FTIR), in order to better understand the electrical and optical properties and behavior of the film. The XRD measurements identify the crystalline structures of $Si_xGe_yO_{1-x-y}$ thin films as a function of Si contents at fixed oxygen concentration. The purpose of this experiment was to check amorphousness of the films and to demonstrate the effect of broadening/narrowing of the spectra (FWHM on TCR and resistivity). The Raman scattering spectra was also measured as a function of Si content at fixed oxygen concentration in order to better understand the bonding between Si—Ge and Ge—Ge, and its effects on TCR and resistivity that can be affected by varying the composition of constituent silicon, germanium and oxygen. The FTIR spectra measurements determine the peaks corresponding to constituent elements (Ge—O, and Si—O), and determine the increase and decrease in their peak location as a function of silicon at fixed oxygen. The results can be used to explain the TCR and resistivity behavior as the Si concentration increased in the film.

Figures 20A, 20B, 20C:
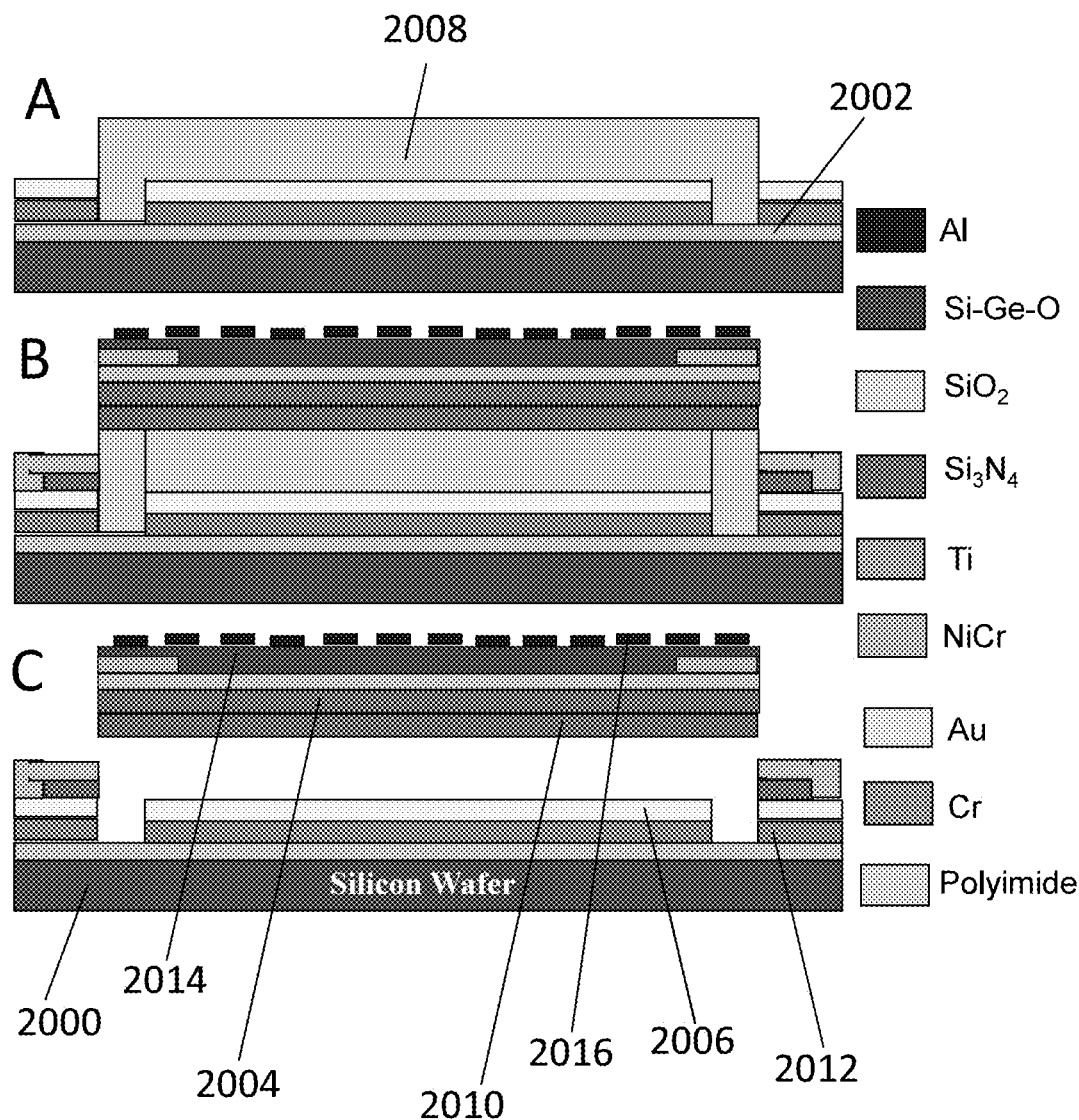
FIG. 20A shows an uncooled microbolometer fabrication process.
FIG. 20B shows further steps in the uncooled microbolometer fabrication process of FIG. 20A.
FIG. 20C shows further steps of the uncooled microbolometer fabrication process of FIG. 20B.
Figures 21A, 21B, 21C, 21D:
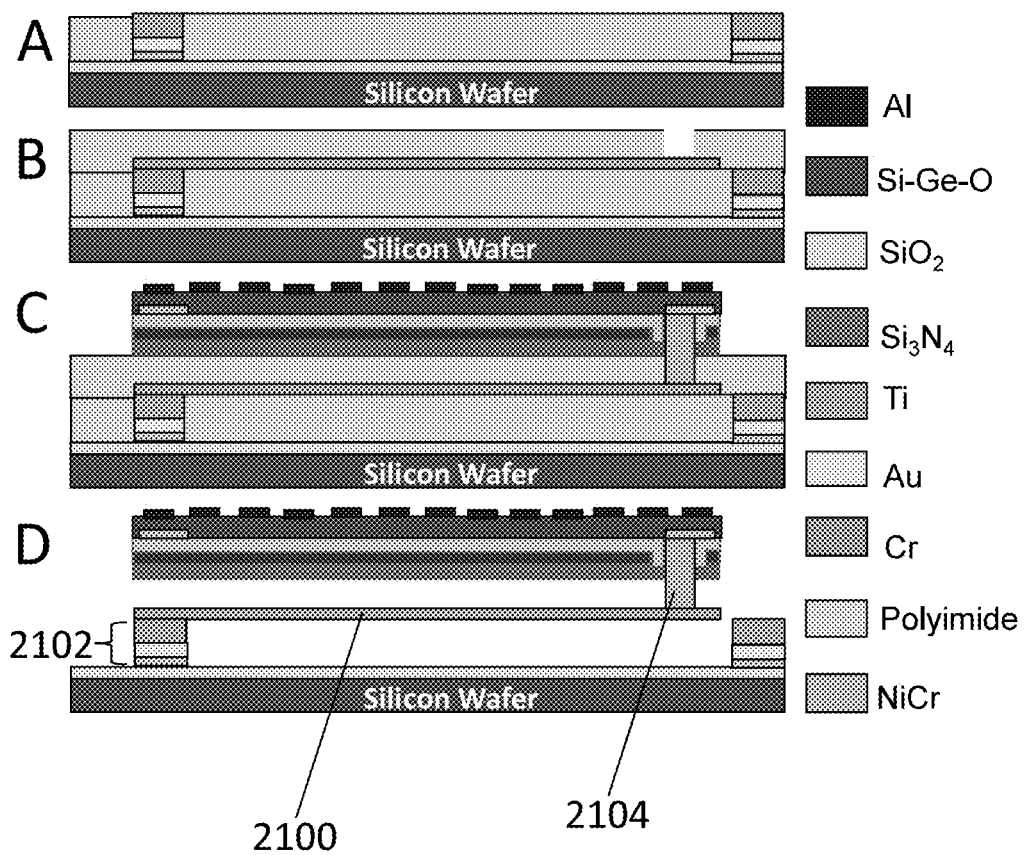
FIG. 21A shows another embodiment of an uncooled microbolometer fabrication process.
FIG. 21B shows further steps of the uncooled microbolometer fabrication process of FIG. 21A.
FIG. 21C shows further steps of the uncooled microbolometer fabrication process of FIG. 21B.
FIG. 21D shows further steps of the uncooled microbolometer fabrication process of FIG. 21C.

FIGS. 20A to 20C represent another fabrication example. The microbolometer was fabricated using the following sequence of surface micromachining processes steps (note that in FIGS. 20A to 20C, only one anchor is shown for each microbolometer): (1) The wafer 2000 is thermally oxidized to grow a thick SiO$_2$ layer 2002 for insulation; (2) Thin layers of titanium (Ti, 2004) and gold (Au, 2006) are sputter deposited and patterned to form the trace line and bonding pads; (3) The polyimide sacrificial layer 2008 is spin coated and patterned to create a mold at locations corresponding to the metal based microbolometer anchors (see FIG. 20A); (4) Ti is then sputter deposited and patterned using a lift-off technique to create the microbolometer anchors; (5) A layer (2010) of Si$_3$N$_4$ is deposited/patterned to serve as a support bridge followed by sputtering of a thin Al layer forming the groundplane. (6) A layer of Si$_3$N$_4$ is sputter-deposited and patterned for insulation; (7) A layer (2012) of nickel-chromium (NiCr) is deposited and patterned to form the electrical contact to Si—Ge—O; (8) The Si—Ge—O thermometer layer 2014 is sputter deposited and patterned; (9) A layer (2016) of Al is deposited and patterned to form the metasurface (see FIG. 20B); and (10) The polyimide sacrificial layers 2008 are removed by oxygen plasma ashing (see FIG. 20C).

FIGS. 21A to 21D show a preferred fabrication of a microbolometer according to the present invention, with supporting arms 2100 under the pixel using the following steps (note that only one anchor is shown for each microbolometer): (1) The wafer is thermally oxidized to grow a thick SiO$_2$ layer for insulation; (2) Thin layers of titanium (Ti) and gold (Au) are sputter deposited and patterned to form the trace line and bonding pads; (3) The first polyimide sacrificial layer is spin coated and patterned to create a mold at locations corresponding to the metal based microbolometer anchors; (4) Ti is then sputter deposited and patterned using a lift-off technique to create the microbolometer anchors; (5) Ti is deposited again and patterned to create the support arms 2100 (see FIGS. 21A and 21B); (6) A second polyimide is patterned to form a mold in order to create the second set of anchors 2102 for the microbolometer on the edge of the support arms (see FIG. 21B); (7) A layer of Si$_3$N$_4$ is sputter-deposited and patterned for mechanical support, followed by sputtering of a thin Ti layer forming the groundplane; (8) A layer of Si$_3$N$_4$ is sputter-deposited and patterned for insulation; (9) A layer 2104 of NiCr is deposited and patterned to form the electrical contact to Si—Ge—O; (10) The Si—Ge—O thermometer layer is sputter deposited and patterned; (11) A layer of Al is deposited and patterned to form the metasurface (see FIG. 21C); and (12) The polyimide sacrificial layers are removed by oxygen plasma ashing (see FIG. 21D). As FIGS. 21A to 21D involve similar fabrication techniques as described above with respect to FIGS. 20A to 20C, such explanation of the layers and/or elements has not been repeated, and such layers and elements have not been labelled in FIGS. 21A to 21D.

With respect to the possibility that using multi-levels and layers to build the device may result in reduction of the mechanical stability of the device; the stress and its gradient may cause the pixel to bend and touch the substrate, the inventors optimized the stress in Si—Ge—O layer by varying the deposition condition, and annealing conditions. The inventors tuned the Si$_3$N$_4$ support layer, Al ground plane thin layer, and the Ti support arms to compensate the stress in the Si—Ge—O.

Figure 22:
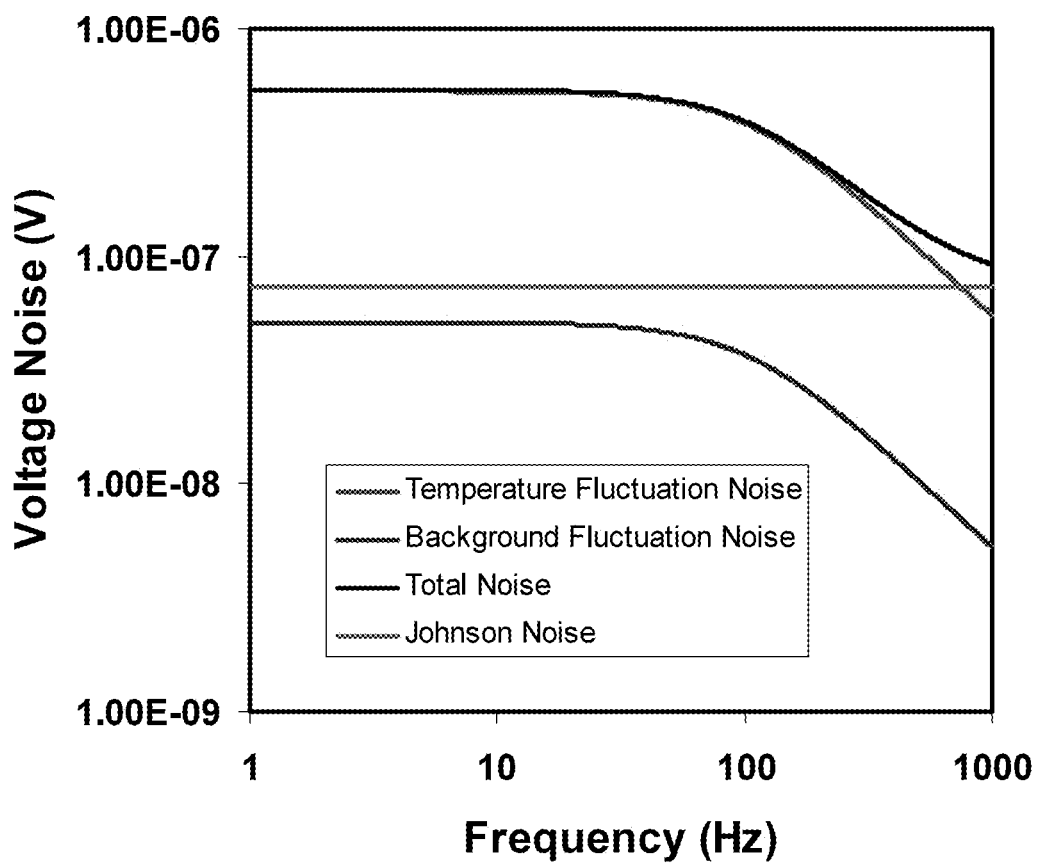
FIG. 22 shows an example of contributing voltage noise, calculated as a function of frequency.

With reference to FIG. 22, the microbolometer performance was calculated using the following assumptions: the microbolometer has a resistance value equal to 330 KS and TCR equal to 4%/K, and it is DC biased with a bias current up to 5 µA which corresponds to a voltage bias of 1V across the microbolometer. The microbolometer exhibits low noise voltage and operates near background limited noise voltage. The Johnson voltage noise, the temperature fluctuation voltage noise, the background fluctuation noise, and the total voltage noise are calculated as a function of frequency and plotted in FIG. 22. The 1/f noise is not accounted for in the calculation of the total noise; it is implemented in the model. The responsivity, detectivity, noise equivalent temperature difference (NETD) and thermal time constant are calculated for the 8-14 µm IR transparency windows with a value over $10^5$ V/W, detectivities above $10^9$ cm Hz$^{1/2}$/W, 10 mK and less than 2 ms, respectively. The responsivity is maximized by enhancing the absorption and by achieving low thermal mass and low thermal conductance.

Figures 23A, 23B:
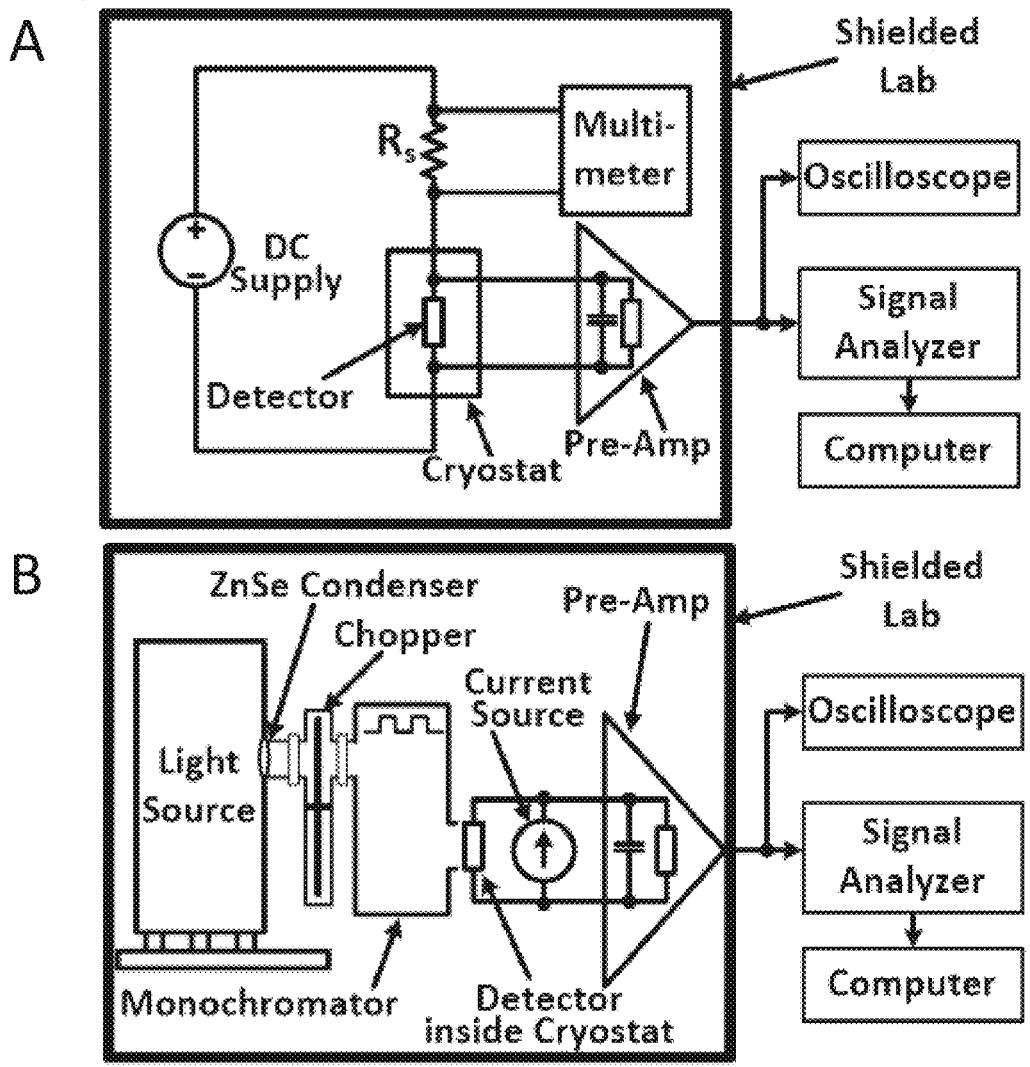
FIG. 23A shows an optical setup for testing responsivity (chopping frequency).
FIG. 23B shows an optical setup for testing responsivity (wavelength).

In concert with testing the electrical performance of the device, the radiometric performance of the metasurface and cavity were measured with FTIR for model validation. Prior to assessing the fabricated devices, a simple electrical circuit was designed and built to supply the necessary current/voltage necessary for the operation of the microbolometer. Several measurements were performed: optical responsivity and detectivity versus chopping frequency; spectral response versus wavelength up to 20 jam; the resistance and TCR versus temperature (R-T); current-voltage characteristics (I-V); thermal conductance; reflectivity; absorptivity, resistivity and refractive index as a function of wavelength for all thin films used to fabricate the microbolometer. The optical response of the devices was measured by using the setup shown in FIGS. 23A and 23B.

The measurement was performed in vacuum inside the cryostat. The chopped light illuminated the sample surface through a ZnSe window, transmitting from approximately 0.6 to 20 µm. The output voltage was fed into a dynamic signal analyzer through a preamplifier (PAR5113). A DC bias supplied by a low-noise, battery-powered current source was applied to the microbolometer. The spectrum signal analyzer simultaneously measured the signal amplitude and noise-per-unit bandwidth for each chopper frequency. The spectral response in vacuum as a function of IR wavelength over the range 0.6-20 µm with a monochromator and a blackbody source was measured. The light was chopped with a constant chopping frequency. The response was calibrated with a pyroelectric detector with a known responsivity and area. Over large areas, FTIR can be used to characterize the reflectance/absorptance of the device and this served as an important step for validating the numerical models. In addition, ellipsometry (e.g., using J. A. Woollam software, and IR-VASE equipment) was used to characterize the films deposited in order to produce a predictive device modeling.

The following measurements were performed on the Si—Ge—O IR sensitive thin film without the metasurface: (1) TCR and the corresponding resistivity; (2) the complex index of refraction (n) versus wavelength for all thin films used in the microbolometer; (3) X-Ray diffraction at fixed oxygen while varying Si concentration in order to identify the crystalline structures of Si$_x$Ge$_y$O$_{1-x-y}$ thin films. The purpose of this experiment was to check films amorphousness and to demonstrate the effect of broadening/narrowing of the spectra (full width half maximum (FWHM)) on TCR and resistivity; (4) Raman Spectroscopy measurement at fixed oxygen concentration while varying silicon concentration. This study provided a better understanding of bonding between Si—Ge and Ge—Ge, and its effects on TCR and resistivity that can be affected by varying the composition of constituent silicon, germanium and oxygen; and (5) FTIR at fixed oxygen concentration while varying silicon concentration. The results can be used to explain the TCR and resistivity behavior as a function of Si concentration as it increases in the film.

Another major issue requiring consideration is electrical noise. The performance of the microbolometers can be improved substantially and reach the temperature fluctuation noise performance if noise is eliminated or reduced. The mechanisms and sources of noise in the fabricated devices were studied and reduced significantly. Models were generated for all possible sources of noise, and possible ways to reduce the noise were explored theoretically and experimentally. Noise optimization was aided by annealing the fabricated devices at a temperature between 200 to 300° C. for a duration up to 8 hours in vacuum and in a forming gas environment using rapid thermal annealing system. The reduction of noise is crucial to the next generation of uncooled thermal cameras since it allowed the detector to reach the background limited noise performance and further improve the NETD. This included the noise generated by the sensitive element (Johnson noise, random telegraph switching (RTS) and 1/f flicker noise), temperature fluctuation noise, and background voltage noise. Johnson noise, $\Delta V_J$, is due to the thermal agitation of charge carriers. It is inherent in the detecting element and cannot be avoided. RTS is caused by unknown imperfections in material structure and contacts, and is therefore most often observed in very small devices, or very high resistivity materials such as the one studied in this work. 1/f-noise is observed at low frequencies, usually due to the fluctuation in both carrier concentration and carrier mobilities, arising from carrier trapping and detrapping mechanisms and surface state scattering. It also depends on the deposition techniques, material, dimensions and electrical contacts. The electrical noise increases at lower frequencies due to the increasing contribution of 1/f-noise and at high frequency becomes equal to Johnson noise. The intersection between Johnson noise and 1/f-noise, known as the 1/f-noise-corner-frequency, is an important figure of merit. When normalized with respect to power, it can be used to compare different IR materials and detectors. The power-normalized-1/f-noise-corner-frequency is used to quantitatively compare microbolometers such as the Si—Ge—O devices, Y—Ba—Cu—O devices, $VO_x$ devices and amorphous silicon devices. The 1/f-noise-corner-frequency, $f_c$ can be found by equating Hooge's formula to the Johnson noise, as shown below by formulas (1) and (2).

$$\frac{\Delta V_n^2}{\Delta f} = \frac{\alpha_H I_b^2 R^2}{f_c N} = 4k_B TR \quad (1)$$

$$\frac{f_c}{I_b^2 R} = \frac{\alpha_H}{4k_B TN} = \frac{1}{4k_B T}\left(\frac{\Delta V_n}{I_b R}\right)^2 \frac{f}{\Delta f} \quad (2)$$

Hooge's coefficient, $\alpha_H$, gives magnitude of 1/f noise, N is the number of fluctuators in the sample and is volume dependent. Therefore, ($\alpha_H/N$) is related to the volume normalized inherent noise. The temperature fluctuation noise, $\Delta V_{TF}$, arises from the fluctuations in the heat exchange between the isolated sensor and its heat sink. The noise component with the lowest attainable level is referred to as the background voltage noise, $\Delta V_{BG}$. It results from the radiative exchange between the detector and the surroundings. The total noise voltage is given by the sum of squares of the contributions due to Johnson noise, 1/f noise, temperature fluctuation noise, and background noise.

The mechanisms and sources of noise were studied and analyzed, and reduced significantly. Models were generated for all possible sources of noise, and possible ways to reduce the noise were explored theoretically and experimentally including Johnson, 1/f flicker, temperature fluctuation, and background voltage noises. Noise optimization was aided by annealing the fabricated devices in vacuum and in a forming gas environment using rapid thermal annealing system.

Through such experimentation, the inventors performed the following: (1) integrating $Si_xGe_yO_{1-x-y}$ with metasurfaces and studying how the material properties are affected by the metasurfaces in order to understand the structure/stoichiometry relationships to electromagnetic/thermal/electrical properties along with manufacturing cost; (2) investigating $Si_xGe_yO_{1-x-y}$, with and without metasurface, to correlate the infrared optical constants, resistivity, TCR, voltage noise, density and specific heat with the stoichiometery of the material; (3) fabricating and characterizing an innovative uncooled IR microbolometer integrated with metasurface with, for example, a pixel area of 25×25 µm² and 16×16 µm² pixel and a fill factor over 90% by placing support structure beneath the pixel; and (4) identifying sources of noise and optimizing the metasurface integrated microbolometer to further reduce noise in the fabricated devices.

The results herein indicate advancements over conventional techniques by having a unified metasurface integrated microbolometer replace the Fabry-Perot cavity/umbrella superstructure in traditional microbolometers. The metasurfaces permit an engineered spectral/polarization selectivity while enhancing the electrical performance and minimizing the thermal mass of the microbolometer. This allows improved thermal design because the support structure does not disrupt the resonant cavity. The presence of the metal metasurface elements significantly affects the tradeoff between resistivity and TCR allowing to obtain a film with higher TCR and lower resistivity values than that of films without the metasurface. This corresponds to lowering the noise and improving the sensitivity. Numerical noise models were generated.

The inventors fabricated a device using standard microfabrication processes, and scaled toward a 16×16 µm² pixel size suspended above a substrate by thin metallic/dielectric arms. Using a metasurface improved Si—Ge—O characteristics including IR absorptance, resistivity, TCR, and voltage noise. In addition, the deposition condition, and post deposition annealing were investigated. The mechanisms and sources of noise were investigated for attenuation purposes. The generated noise models are applicable to other IR materials.

As shown herein, metasurfaces can be used to control the way a structure interacts with radiation. The inventors have investigated the integration of metasurfaces into a $Si_xGe_yO_{1-x-y}$ microbolometer. This research has resulted in a dramatic change in device design. Traditionally, microbolometers rely on a quarter wave cavity to impedance match the absorbing layer to free-space. Notably, in the novel microbolometer disclosed herein, there is no ¼ wave cavity, allowing the support arms to be placed under the microbolometer. The selection for the absorption material is based on the electrical performance. Specifically, the TCR and the resistivity, which along with thermal considerations determine the sensitivity and the noise of the microbolometer. Metasurfaces, a class of perfect absorber, can be engineered to provide an impedance match to free-space for radiation with specific attributes. Metasurface perfect absorbers generally consist of a metallic antenna elements separated from a metallic ground plane by a dielectric layer. The geometry of the antenna elements determines the absorptance conditions. For example, linear dipoles can be designed to respond only to radiation parallel to the dipole and the resonant wavelength scales with the size of the element. The inventors have incorporated this architecture in the microbolometer such that the sensing TCR layer is incorporated into the dielectric layer. In order for the resistance of this layer to be measured, it must be electrically isolated from the ground plane. This can be accomplished by adding a thin layer of silicon oxide or silicon nitride. The absorptance happens entirely in the microbolometer and no quarter wave cavity is required. This frees the area underneath the microbolometer for the support legs which allows the thermal response of the microbolometer to be optimized. In addition, the contact between the metal elements and the semiconductor sensing layer has the potential to decrease the resistivity of the sensing element while keeping the TCR unchanged.

As shown herein, the design of the metasurface affects the electromagnetic, thermal and low-frequency electrical response/noise floor. The selection of the sensing TCR material similarly affects the metasurface design and the performance of the microbolometer. In order to engineer this system, a model of the metasurface/sensing layer as an integrated material needs to be developed. The model predicts the electromagnetic/thermal/electrical performance as a function of the metasurface design and material selection. This integrated material model informed the design of the microbolometer, with the goal being to add inherent spectral/polarization/AOI sensitivity to the microbolometer while maximizing the performance with respect to responsivity. A general material model was created for the integrated metasurface/microbolometer. This model was applied to engineer the response of the microbolometer with respect to the primary testbed (hyperspectral selectivity). In addition, secondary testbeds based on polarization and AOI selectivity were explored. Designs were optimized with respect to microelectromechanical machines (MEMS) fabrication constraints using traditional lithography. Although the use of e-beam lithography to map smaller feature sizes can be warranted, the objective was to maintain the low fabrication costs associated with feature sizes greater than 1 m. The model was validated experimentally to establish a framework for the design of future devices.

While simple FSS metasurfaces can be fabricated with the same lithographic technology used to define other features of the microbolometer, more advanced lithographic techniques (including E-beam lithography) can produce feature sizes less than 200 nm. The same modeling techniques for designing microwave metasurfaces can be used once the correct material properties are used (from ellipsometery).

As discussed above, incorporating metasurfaces into microbolometers to achieve selectivity also introduces the potential for significantly better performance. One constraint is to maintaining the traditional low cost of uncooled microbolometers compared to cooled devices (with filter wheels for hyperspectral imaging). Nevertheless, the potential applications of this technology are wide-ranging. One such application is surveying a battlefield to inspect for the use of chemical weapons or explosives before exposing warfighters. Similar applications include better situational awareness during day and night, poor weather, and other obscurants as well as defeating deep camouflage. The structure/property relationships for metasurface integrated amorphous silicon-germanium-oxide ($Si_xGe_yO_{1-x-y}$) uncooled microbolometers. Specifically, electromagnetic, thermal, and noise properties of the system were determined as functions of the geometry and material selection. This created a framework for metasurface integrated microbolometer design with the goal of producing disruptively lower voltage noise power spectral density, high detectivity, while achieving spectral/polarization selectivity of the metasurface.

The novel metasurface integrated microbolometers herein can provide a low-cost hyperspectral capability with a broad range of applications in areas such as surveying a battlefield to inspect for the use of chemical weapons/threats or explosives before exposing warfighters. Similar applications include improved situational awareness, threat detection and camouflaged target recognition in the face of natural and manmade obscurants. Potential platforms include helmet-mounted sights, unmanned aerial vehicles and other aerial vehicles, robots, driver's aids for military vehicles, and night-vision applications (e.g., night time operations, base security, and IED detection). These advancement increase personnel safety on the battlefield by providing high resolution images in total darkness or under dirty battlefield conditions.

IR cameras with the novel microbolometer technology disclosed herein will improve troop safety by enabling them to see deep in the battlefield improving their surveillance, threat detection and target recognition capabilities. Therefore, warfighters will be able to effectively and safely perform their missions with superiority regardless of lighting or weather conditions.

For example, a camera based on the novel technology disclosed herein has potentially transformative applications in many areas ranging from health to national security, and will play a major role in the military superiority in combating terrorism and new emerging threats, supporting the war on terror, and security. There are also obvious law enforcement and commercial applications for this technology. Specific potential applications include improved surveillance imaging, threat detection, target recognition, improved medical diagnostics and surgical interventions, and increased automotive safety. For example, the infrared camera will increase personnel safety on the battlefield by providing the soldiers with high resolution images in total darkness, in severe weather conditions, or in dirty battlefield condition. The use of the IR camera with the developed technology will enable soldiers to improve their surveillance, threat detection and target recognition of the enemy. Therefore, the troops will effectively and safely perform their missions with superiority. In another application, firefighters will be able to image, for example, a 3000K signal typical in many fires and explosions which are seen as a very bright area on conventional detector, and to see through smoke to find persons trapped inside.

The advances herein enable high resolution imaging. This technology has the potential to revolutionize infrared cameras. IR cameras enabled with the novel detector technology herein will be affordable (low cost), lightweight, easy to use, energy efficient, and portable, making it applicable to a wide range of functions.

In view of the foregoing, it will be seen that the several advantages of the invention are achieved and attained. While this invention has been described in terms of several embodiments, there are alterations, permutations and equivalents which fall in the scope of this invention. The embodiments were chosen and described in order to best explain the principles of the disclosure and their practical application to thereby enable others skilled in the art to best utilize the various embodiments and with various modifications as are suited to the particular use contemplated. As various modifications could be made in the constructions and methods herein described and illustrated without departing from the scope of the invention, it is intended that all matter contained in the foregoing description or shown in the accompanying drawings shall be interpreted as illustrative rather than limiting. Thus, the breadth and scope of the present invention should not be limited by any of the above-described exemplary embodiments, but should be defined only in accordance with the following claims appended hereto and their equivalents.

It should also be understood that when introducing elements of the present invention in the claims or in the above description of exemplary embodiments of the invention, the terms "comprising," "including," and "having" are intended to be open-ended and mean that there may be additional elements other than the listed elements. Additionally, the term "portion" should be construed as meaning some or all of the item or element that it qualifies. Moreover, use of identifiers such as first, second, and third should not be construed in a manner imposing any relative position or time sequence between limitations. Still further, the order in which the steps of any method claim that follows are presented should not be construed in a manner limiting the order in which such steps must be performed, unless such an order is inherent or explicit.

What is claimed is:

1. A metasurface integrated uncooled microbolometer comprising:
   a substrate;
   a pixel that comprises:
      an integrated metasurface-sensing layer that comprises:
         a temperature-sensing layer that comprises a semiconductor having a Temperature Coefficient of Resistance (TCR) at 20° C. of at least 1%/K;
         a metasurface on a surface of the temperature-sensing layer, wherein the metasurface comprises a layer of patterned metal elements configured for the direct absorption of incident infrared radiation and to convert the absorbed infrared radiation to thermal energy and conduct the thermal energy to the temperature-sensing layer;
      wherein the integrated metasurface-layer has a resistivity at 20° C. that is less than that of an otherwise identical temperature-sensing layer at 20° C. without the metasurface thereon;
      a ground layer; and
      an insulator layer configured to electrically isolate the temperature-sensing layer from the ground layer; and
   a support configured to electrically connect the temperature-sensing layer of the pixel to the substrate and to space the pixel from the substrate by a distance to thermally isolate the pixel from the substrate; and
   wherein the metasurface integrated uncooled microbolometer has a 1/f noise coefficient ($K_f$) that is lower than an otherwise identical microbolometer without the metasurface.

2. The metasurface integrated uncooled microbolometer according to claim 1, wherein the semiconductor of the temperature-sensing layer comprises silicon germanium oxide of the type $Si_xGe_yO_{1-x-y}$, wherein x is in a range from about 0.02 to about 0.85, and y is in a range from about 0.05 to about 0.75.

3. The metasurface integrated uncooled microbolometer according to claim 1, wherein the semiconductor of the temperature-sensing layer comprises amorphous silicon.

4. The metasurface integrated uncooled microbolometer according to claim 1, wherein the semiconductor of the temperature-sensing layer comprises vanadium oxide.

5. The metasurface integrated uncooled microbolometer according to claim 1, wherein the layer of patterned metal elements of the metasurface comprises a hexagonal close packed (HCP) array of metal disks of at least one diameter and of a least one periodicity.

6. The metasurface integrated uncooled microbolometer according to claim 5, wherein:
   each metal disk of the HCP array has a diameter selected from a multiplicity of diameters and the metal disks of multiple diameters are tessellated over the array with a single periodicity;
   the metal of the disks is aluminum, titanium, or a combination thereof; and
   the temperature-sensing layer has a thickness dependent upon said single periodicity;
   in order to achieve broadband absorptance of the incident infrared radiation.

7. The metasurface integrated uncooled microbolometer according to claim 6, wherein the broadband absorptance of the incident infrared radiation is characterized by more than 90% absorption of incident infrared radiation of wavelengths in a range of 8-14 μm.

8. The metasurface integrated uncooled microbolometer according to claim 5, wherein:
   the metal disks of the HCP array have a single diameter and a single periodicity;
   the metal of the disks is gold; and
   the temperature-sensing layer has a thickness dependent upon said single periodicity;
   in order to achieve a narrowband absorptance of the incident infrared radiation.

9. The metasurface integrated uncooled microbolometer according to claim 8, wherein the narrowband absorptance of the incident radiation is characterized by unity absorptance of the incident infrared radiation of a particular wavelength.

10. The metasurface integrated uncooled microbolometer according to claim 1, wherein the layer of patterned metal elements of the metasurface comprises an array of discrete linear elements that provide a polarized response.

11. The metasurface integrated uncooled microbolometer according to claim 1, wherein the support is underneath the sensing portion pixel.

12. The metasurface integrated uncooled microbolometer according to claim 1 comprises comprising a plurality of the pixels and corresponding supports configured in a focal plane array.

13. A method of fabricating a metasurface integrated uncooled microbolometer, the method comprising:
   providing a substrate; and
   forming a pixel, the forming of the pixel comprising:
      forming an integrated metasurface-sensing layer, the forming of the integrated metasurface-sensing layer comprising:
         forming a temperature-sensing layer that comprises a semiconductor having a Temperature Coefficient of Resistance (TCR) at 20° C. of at least 1%/K;
         forming a metasurface on a surface of the temperature-sensing layer, wherein the metasurface comprises a layer of patterned metal elements configured for the direct absorption of incident infrared radiation and to convert the absorbed infrared radiation to thermal energy and conduct the thermal energy to the temperature-sensing layer;

wherein the integrated metasurface-layer has a resistivity at 20° C. that is less than that of an otherwise identical temperature-sensing layer at 20° C. without the metasurface thereon;

forming a ground layer; and forming an insulator layer configured to electrically isolate the temperature-sensing layer from the ground layer; and forming a support configured to electrically connect the temperature-sensing layer of the pixel to the substrate and to space the pixel from the substrate by a distance to thermally isolate the pixel from the substrate; and wherein the metasurface integrated uncooled microbolometer has a 1/f noise coefficient ($K_f$) that is lower than an otherwise identical microbolometer without the metasurface.

14. The method according to claim 13, wherein the semiconductor of the temperature-sensing layer comprises silicon germanium oxide of the type $Si_xGe_yO_{1-x-y}$, wherein x is in a range from about 0.02 to about 0.85, and y is in a range from about 0.05 to about 0.75.

15. The method according to claim 13, wherein the semiconductor of the temperature-sensing layer comprises amorphous silicon.

16. The method according to claim 13, wherein the semiconductor of the temperature-sensing layer comprises vanadium oxide.

17. The method according to claim 13, wherein the layer of patterned metal elements of the metasurface comprises a hexagonal close packed (HCP) array of metal disks of at least one diameter and of a least one periodicity.

18. The method according to claim 17, wherein:

each metal disk of the HCP array has a diameter selected from a multiplicity of diameters and the metal disks of multiple diameters are tessellated over the array with a single periodicity;

the metal of the disks is aluminum, titanium, or a combination thereof; and the temperature-sensing layer has a thickness dependent upon said single periodicity;

in order to achieve broadband absorptance of the incident infrared radiation.

19. The method according to claim 18, wherein the broadband absorptance of the incident infrared radiation is characterized by more than 90% absorption of incident infrared radiation of wavelengths in a range of 8-14 µm.

20. The method according to claim 17, wherein:

the metal disks of the HCP array have a single diameter and a single periodicity;

the metal of the disks is gold; and the temperature-sensing layer has a thickness dependent upon said single periodicity;

in order to achieve a narrowband absorptance of the incident infrared radiation.

21. The method according to claim 20, wherein the narrowband absorptance of the incident radiation is characterized by unity absorptance of the incident infrared radiation of a particular wavelength.

22. The method according to claim 13, wherein the layer of patterned metal elements of the metasurface comprises an array of discrete linear elements that provide a polarized response.

23. The method according to claim 13, wherein the support is underneath the pixel.

24. The method according to claim 13, further comprising forming a plurality of the pixels and corresponding supports on the substrate configured in a focal plane array.

* * * * *